(12) United States Patent
Leedy

(10) Patent No.: US 9,804,221 B2
(45) Date of Patent: *Oct. 31, 2017

(54) CONFIGURABLE VERTICAL INTEGRATION

(71) Applicant: Glenn J Leedy, Carmel, CA (US)

(72) Inventor: Glenn J Leedy, Carmel, CA (US)

(*) Notice: Subject to any disclaimer, the term of this patent is extended or adjusted under 35 U.S.C. 154(b) by 26 days.

This patent is subject to a terminal disclaimer.

(21) Appl. No.: 14/468,685

(22) Filed: Aug. 26, 2014

(65) Prior Publication Data

US 2014/0361806 A1    Dec. 11, 2014

Related U.S. Application Data

(63) Continuation of application No. 13/800,803, filed on Mar. 13, 2013, now Pat. No. 8,933,715.

(51) Int. Cl.
| | |
|---|---|
| G01R 31/28 | (2006.01) |
| G01R 31/3185 | (2006.01) |
| G11C 29/18 | (2006.01) |
| H01L 21/66 | (2006.01) |
| H01L 25/065 | (2006.01) |

(52) U.S. Cl.
CPC ..... *G01R 31/2851* (2013.01); *G01R 31/2894* (2013.01); *G01R 31/2898* (2013.01); *G01R 31/318513* (2013.01); *G11C 29/18* (2013.01); *H01L 22/14* (2013.01); *H01L 22/20* (2013.01); *H01L 22/22* (2013.01); *H01L 25/0657* (2013.01); *H01L 2924/0002* (2013.01)

(58) Field of Classification Search
CPC ............ G01R 31/2894; G01R 31/2834; G01R 31/31924; G01R 31/2851; G01R 1/0408; G01R 31/40

USPC .................................................... 324/750.01
See application file for complete search history.

(56) References Cited

U.S. PATENT DOCUMENTS

| | | |
|---|---|---|
| 5,235,672 A | 8/1993 | Carson |
| 5,502,333 A | 3/1996 | Bertin et al. |
| 5,781,413 A | 7/1998 | Howell et al. |
| 6,790,702 B2 | 9/2004 | Farrar |
| 7,159,047 B2 | 1/2007 | Klecka et al. |
| 7,282,951 B2 | 10/2007 | Huppenthal et al. |
| 7,293,002 B2 | 11/2007 | Starzyk |
| 7,402,897 B2 * | 7/2008 | Leedy ................ B81B 7/02 257/678 |
| 7,692,448 B2 | 4/2010 | Solomon |
| 7,863,733 B2 | 1/2011 | Flautner et al. |
| 8,042,082 B2 | 10/2011 | Solomon |
| 8,046,727 B2 | 10/2011 | Solomon |
| 8,136,071 B2 | 3/2012 | Solomon |
| 8,299,592 B2 | 10/2012 | Suh et al. |

(Continued)

*Primary Examiner* — Jermele M Hollington
*Assistant Examiner* — Christopher McAndrew
(74) *Attorney, Agent, or Firm* — Useful Arts IP

(57) ABSTRACT

The Configurable Vertical Integration [CVI] invention pertains to methods and apparatus for the enhancement of yields of 3D or stacked integrated circuits and herein referred to as a CVI Integrated Circuit [CVI IC]. The CVI methods require no testing of circuit layer components prior to their fabrication as part of a 3D integrated circuit. The CVI invention uses active circuitry to configure the CVI IC as a means to isolate or prevent the use of defective circuitry. CVI circuit configuration method can be predominately described as a large grain method.

19 Claims, 30 Drawing Sheets

(56) References Cited

U.S. PATENT DOCUMENTS

| | | | |
|---|---|---|---|
| 8,358,147 B2 * | 1/2013 | Pagani | G01R 31/3172 324/762.02 |
| 8,362,796 B2 * | 1/2013 | Pagani | G01R 31/3172 324/762.02 |
| 8,386,690 B2 | 2/2013 | Li et al. | |
| 8,400,781 B2 | 3/2013 | Gillingham | |
| 8,407,660 B2 | 3/2013 | Solomon | |
| 8,445,918 B2 | 5/2013 | Bartley et al. | |
| 8,472,230 B2 | 6/2013 | Solomon | |
| 8,542,030 B2 * | 9/2013 | Cher | G01R 31/2817 324/762.01 |
| 8,604,593 B2 | 12/2013 | Schuetz | |
| 2005/0251358 A1 | 11/2005 | Van Dyke | |
| 2007/0007989 A1 * | 1/2007 | Long | G01R 31/2853 324/750.01 |
| 2008/0237591 A1 * | 10/2008 | Leedy | B81B 7/02 257/48 |
| 2008/0284611 A1 * | 11/2008 | Leedy | B81B 7/02 340/815.4 |
| 2009/0194768 A1 * | 8/2009 | Leedy | B81B 7/02 257/48 |
| 2009/0224784 A1 * | 9/2009 | Pagani | G01R 31/3172 324/762.02 |
| 2010/0332177 A1 * | 12/2010 | Wu | G01B 31/318558 702/117 |
| 2011/0131391 A1 | 6/2011 | Barowski et al. | |
| 2012/0112776 A1 | 5/2012 | Cher et al. | |
| 2012/0138927 A1 * | 6/2012 | Kang | G01B 31/318513 257/48 |
| 2012/0153450 A1 * | 6/2012 | Kim | H01L 23/481 257/686 |
| 2013/0002272 A1 * | 1/2013 | Badaroglu | G01B 31/318513 324/750.01 |
| 2013/0024737 A1 * | 1/2013 | Marinissen | G01R 31/318508 714/727 |
| 2013/0049796 A1 * | 2/2013 | Pang | G01R 31/31855 326/16 |
| 2013/0168674 A1 | 7/2013 | Franzen et al. | |

* cited by examiner

FIG. 26

Illustrative Example of Data Flow Controller Table

| Command & Context | Operand$_1$ | Operand$_2$ | Result$_1$ |
|---|---|---|---|
| ⋮ | ⋮ | ⋮ | ⋮ |
|  |  |  |  |

FIG. 27a

DFCT Processing Parameters

| Task ID | DFCT Address | DFCT Table Length | Context |
|---|---|---|---|

FIG. 27b

DFCT Table of Plurality of Parallel Processing Tasks

| Task ID$_1$ | DFCT Address$_1$ | DFCT Table Length$_1$ | Context$_1$ |
|---|---|---|---|
| Task ID$_2$ | DFCT Address$_2$ | DFCT Table Length$_2$ | Context$_2$ |
| ⋮ | ⋮ | ⋮ | ⋮ |
|  |  |  |  |

DFCT Description

| Command & Context | Operand$_1$ | Operand$_2$ | Result$_1$ |
|---|---|---|---|

Extended DFCT Description

| Command & Context | Operand$_1$ | Operand$_2$ | Result$_1$ |
|---|---|---|---|
| Context | Operand$_3$ | Operand$_4$ | Result$_2$ |
| | | | |

Examples of DFCT Branch Descriptors

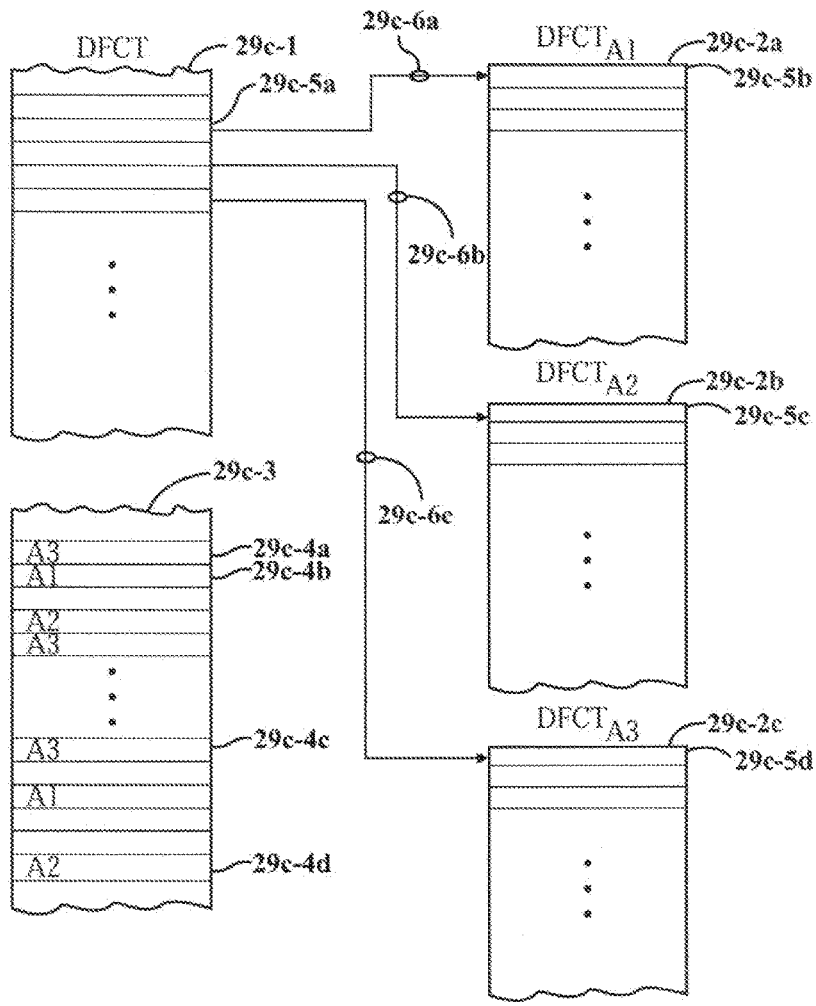
FIG. 29b DFCT Descriptions Representing $([A_1 X A_2] + C + V_1/V_2)^{1/2}$
FIG. 29c Selective DFCT Sub-Task Operand Purge

FIG. 30a

Functional Unit Input Queue

| Content State | CAM Task & Sub Output IP | Exception Fault Address | Operand |
|---|---|---|---|
| ⋮ | ⋮ ⋮ | ⋮ | |
| | | | |

FIG. 30b

Functional Unit Output Queue

| State | CAM Task & Sub Task IP | Result Operand | Result Address | DFC Address |
|---|---|---|---|---|
| ⋮ | ⋮ | ⋮ | ⋮ | ⋮ |
| | | | | |

Cache Data with Purging Task & Sub Task ID's

| CAM Associate Address | CAM Task ID & Sub Task ID | Data |
|---|---|---|
| ⋮ | ⋮ | ⋮ |
|  |  |  |
|  |  |  |

FIG. 31

CONFIGURABLE VERTICAL INTEGRATION

Three Dimensional integrated circuits [3D ICs] are becoming a very important technology for the fundamental advancement in manufacturing of lower cost higher performance physically smaller integrated circuits. There are potentially a number of methods for the fabrication of 3D integrated circuits that result in the stacking of single or 2D integrated circuit layers and optionally in combination with other electronic devices such as MEMS or passive circuit layers. These methods for the stacking of individual circuit layers or dice at present will typically require the use a circuit layer that has already been tested or qualified in some manner prior to being thinned and then cut from the semiconductor wafer upon which it was formed. Such circuit die, or as herein will subsequently be referred to as a circuit layer, may at times be referred to as KGD [Known Good Die]. The KGD characterization placed on a circuit layer is an indication of circuit layer yield and when KGD circuit layers are stacked to form a 3D IC, the potential yield of the resulting 3D IC is significantly enhanced.

Configurable Vertical Integration [CVI] 3D integrated circuits and herein referred to as a CVI Integrated Circuit [CVI IC] are fabricated by stacking individual circuit layers [dice] or circuit wafers, wherein a circuit wafer typically comprises a two dimensional array of rows and columns of individual circuit die. Circuit wafers can be stacked, and from this wafer stack, 3D stacked ICs are then cut or diced from the wafer stack in much the same manner as Two Dimensional [2D] ICs are presently diced from a single circuit wafer.

A CVI IC can be described as a hardware system encapsulating a hardware system. CVI ICs are designed to operate in such a manner that a majority of the circuit portions of the circuit layers of a CVI IC can be disabled at any time during its initial manufacturing test qualification or yield determination, and or, more importantly, during its life cycle. [For the purposes of the discussion herein, circuit portion is defined to mean circuitry on a CVI circuit layer or integrated circuit die that can be electrically disabled or isolated from the remaining circuitry of the circuit layer.] The yield of the CVI IC is verified by external or internal testing methods and means by enabling the circuit portions on each CVI circuit layer by one of several potential progressive step by step test and circuit validity evaluation methods with the recording of the CVI IC defective circuit portions such that the defective circuit portions are not enabled during subsequent CVI IC use. After the incremental testing of the circuit portions, a full functional test of the CVI IC can then be performed. The circuit portions are preferably designed to be smaller in area to raise their individual yield probabilities and preferably have one or more equivalent counter parts such that should one or more circuit portions be determined to be defective the CVI IC will still yield at some acceptable level of acceptable operational specification as a useful integrated circuit with economic utility. The CVI invention provides methods and means for enabling the implementation of Fault Tolerant and High Availability 3D IC embodiments.

The yield enhancement capability of the CVI invention provides methods and means to achieve economically acceptable yields of 3D ICs that have higher circuit densities than that can be achieved from a single 2D IC. CVI ICs do not have a limitation on the number of circuit layers they may comprise. The CVI invention allows for the yield of arbitrarily large CVI ICs with the number of circuit layers exceeding 10, 30, 50 or more.

BACKGROUND OF THE INVENTION

1. Field of Invention

The present invention relates to the methods and means for yield enhancement of stacked or three dimension integrated circuits.

2. State of the Art

Two Dimensional [2D] Integrated Circuits [ICs] are in general designed without the capability for Yield Enhancement as an active circuit means incorporated into the design or operation of 2D integrated circuitry. The primary means for achieving Yield Enhancement or economically acceptable yields of 2D circuits is semiconductor process technology. There are well know exceptions, however, such as DRAM or FLASH memory circuits and FPGA [Field Programmable Gate Arrays] circuits, and in these circuits in addition to the use of process technology, Yield Enhancement is implemented through first performing functional testing the 2D IC and then by manual or external intervention means disabling defective portions of the 2D IC. The defective circuit portions are always replaced with a spare or redundant circuit portion identical to the defective portion, and such defective circuit portions are eliminated from use with the 2D IC, wherein the loss of use of the defective portions does not change the operational capacity of the 2D IC which is a preset specification value.

The present primary means that enables the yield of present 2D ICs is the manufacturing processes used in the fabrication of the 2D IC. Semiconductor manufacturing process technology attempts to maximize the yield or number of defect free 2D ICs on a semiconductor wafer. The wafer is the basic unit of measure for semiconductor IC manufacturing process yield, semiconductor process yield is calculated by dividing the number of accepted and or defect free 2D ICs by the total number of 2D ICs on the wafer.

The Yield Enhancement circuitry used in today's 2D ICs is in general referred to as reconfiguration circuitry. This reconfiguration circuitry when it exists is used only during the testing of the IC as part of the manufacturing process, and may consist of fuse or anti-fuse circuitry that permanently changes the interconnect structure of the IC such that it is able to function in a defect free manner consistent with its design specification. Reconfiguration of these ICs may also be achieved by use of a laser to cut interconnections for the purpose of isolating a defective circuit portion. In all cases, however, the reconfiguration of these ICs is accomplished by first performing functional testing of the IC as a whole, wherein all circuit portions of the IC with the exception of any spare circuit portions are executed or brought into operation and only through said full functional testing are defects found. It is important to note for the purposes of this discussion, that current IC testing means do not test 2D ICs by specific testing of a circuit portions of an IC which is or can be isolated from other portions of the IC during testing. The CVI circuit configuration method for yield enhancement is predominately a large grain circuitry configuration herein examples of large grain circuitry are a bus channel or sub-channel with several thousands of transistors or a circuit portion or ALU circuitry of tens of thousands of transistors or more. Present 2D reconfiguration methods use a fine grain circuit element with examples such as a redundant memory column and spare FPGA gates, wherein this reconfiguration circuitry have typically sizes of 1,000 transistors or less.

Test of a 2D IC is done by functional test of the circuit as a whole. The testing of a 2D IC is performed by external test equipment and this testing determines the presence of the then existing circuit defects and whether or not these defects can be corrected by the use of small grain reconfiguration of the circuit under test or the substitution of the defective circuitry with the available spare circuitry. Once the reconfiguration process is implemented, the 2D IC is again tested. This method of test and reconfiguration of the 2D IC is a static process and only done in conjunction with external test equipment and only done as part of the manufacturing process of the IC and typically is not and or cannot be repeated once the IC is installed for its intended application in an electronic assembly.

Methods of fabrication of 3D ICs and apparatus for said methods are disclosed in U.S. Pat. Nos. 5,354,695, 5,915, 167 and 7,402,897 of the present inventor and are herein incorporated by reference.

SUMMARY OF THE INVENTION

The CVI [Configurable Vertical Integration] invention enables Yield Enhancement of 3D ICs. This is accomplished by the combined use of unique circuit design and circuit control methods and means. The CVI IC [CVI Integrated Circuit] is an integrated stacked IC which incorporates circuitry preferably per circuit layer that either during IC manufacturing validity testing or validity testing during the subsequent operational or useful life of the CVI IC, allows certain circuit portions or all circuit portions of the CVI IC to be internally and electronically enabled or disabled from operation as needed. The circuitry of a CVI IC is broadly divided into several types of Circuit Elements [CEs] or circuit portions: Configuration Circuit Elements [CCEs]; Bus Circuit Elements [BCEs]; and Process Circuit Elements [PCEs]. The Configuration Control Elements [CCEs] and Circuit Elements [BCEs & PCEs] herein may also be broadly referred to as circuit portions, are conventional semiconductor Integrated Circuits [IC] and made by conventional semiconductor fabrication techniques. The logic circuitry of CVI CEs may be implemented as either fixed logic circuits or FPGA logic circuitry. CE logic implementation in FPGA circuitry provides the potential for higher CE yields. This is the case because the use of defective gates in a FPGA often can be avoided by changing the FPGA configuration programming to use an unutilized or unassigned defect free gate.

The Configuration Control Elements or CCEs of a CVI IC are used to form at least one network of CCEs that control the enabling and disabling of all or a majority of the other Circuit Elements [CEs] of the CVI IC. A CCE disables a CE by gating control of clock or power interconnections to a CE or through the use of by-pass circuitry and any circuit design technique that renders the CE non-operational and or electrically isolate from all of the circuitry of the circuit layer it is part of and all of the other circuit layers of the CVI IC. There may be one or plurality of CCE networks in a single CVI IC. These CCE networks may operate separately from each other with each controlling distinct sets CEs, or they may overlap control of certain CEs. CCE networks may or may not have external interconnections to receive control signals for its operation or to receive specific testing data. CCE networks may communicate externally of the CVI IC through use of specific Input/Output external contact wiring pads, via an optional CCE wireless facility or some other physical means such as through access via a microprocessor and its external bus I/O circuitry.

The CCE is the basic Circuit Element of the CVI yield enhancement method. At least one CCE is present on a typical CVI IC circuit layer, but it is not required that a CCE be present on every circuit layer of a CVI IC. The CCEs of a CVI IC are used to form a CCE network that spans all or some portion of the CVI IC circuit layers. A CCE network is established or formed during the initial test of a CVI IC and optionally every time the CVI IC is powered up or optionally during the useful life of the CVI IC when a circuit failure has occurred and the CE configuration of the CVI IC requires revision. A CCE is typically designed to enable the operation or execution of the BCE and PCE CEs of the circuit layer on which the CCE is present and the next in order CCE of the CCE network of which it is a member and which may be on the same circuit layer or another circuit layer of the CVI IC. There are certain circuit functions common to all CCEs of a CVI IC, such as self verification circuitry, next in order CCE enablement and communication circuitry, and BCE and PCE enablement circuitry. The CCE network may require other circuit resources such as the use of a microprocessor or flash memory. These CCE circuit support resources may be internal or external to the CVI IC, or these circuit resources may be incorporated into a few or all of the CCEs of a CCE network or exist as separate CEs of the CVI IC.

The manufacturing qualification testing or initial testing of a CVI IC, begins with establishing the first fully functional or defect free CCE of the CCE network. This is accomplished by selection and enabling the operation of only said first CCE through the I/O pads of the CVI IC or by wireless access. Functional or operational qualification tests are performed on said first CCE to determine if it is sufficiently defect free and can be used in the CCE network; it does not have to be defect free, but sufficient to perform all circuit functions that may be required of it. If this first CCE is determined to be defective, a subsequent first CCE is selected and the qualification test process repeated. If there are no remaining CCEs available to be the first CCE, the CVI IC is rejected or failed.

The first CCE is physically interconnected to one or more next in order CCEs, these CCEs are typically on a different circuit layer of the CVI IC. This next in order CCE is then enabled by the first CCE and is qualified for required functions or operation by tests performed through or from the first CCE. If it is determined that this next in order CCE can be used in the CCE network and there are no subsequent CCEs to be considered for the CCE network, then the CCE network is completed. If this next in order CCE failed its tests or was determined to be defective, a subsequent next in order CCE is selected and the testing process repeated. If there is not a subsequent next in order CCE for the first CCE then a subsequent first CCE is selected and the testing process repeated. If there is not a subsequent first CCE, the CVI IC is failed.

If the current next in order CCE is not the last CCE of the CCE network, then a subsequent next in order CCE is selected that is connected to the current next in order CCE. This newly selected next in order CCE is enabled and the test process of said CCE is repeated in a manner similar to that used with the current next in order CCE. The testing process for CCEs continues with the selection of next in order CCEs until the CCE network is complete or it is determined that it cannot be completed and the CVI IC is failed. Once the CCE network is completed, the CCE network is used as a control means to test and enable the use of the BCEs and PCEs of the CVI IC. Next in order CCE testing may be performed by a previously enable CCE depending on the design of the various CCEs used in the CVI IC; this is to say for example, that the first CCE may facilitate the testing of all succeeding CCEs, or each subsequent CCE may facilitate testing of the CCE that follows it.

There are preferably redundant CCEs per CVI circuit layer. This significantly raises the probability that a CCE network will yield from the available CCEs of the CVI IC. Further, the primary CCE network may have one or more CCE sub-networks. CCE sub-networks may result from a structural design decision relating to a specific subset of CVI circuit layers, such as a subset of circuit layers that are FPGA circuits or memory circuits wherein such a subset of circuit layers may be designed to function with respect to each other in a dependent manner and this may require a subset of CCEs.

A CVI IC has several potential operating modes. They range from a test mode for initial manufacturing qualification to a circuit execution mode wherein the CVI CCE network circuitry operates as a supporting subsystem providing operational services to the CVI IC during its normal operation.

CVI IC and CVI IC CCE network operating modes:
1. Manufacturing test circuit validation. This is an operating mode of the CVI IC wherein the CCE circuitry is used as an integral part of the final IC manufacturing validity testing procedure. The process first determines whether a CCE network for the CVI IC can be formed and qualified, a subsequent test of the BCE and PCE CEs on an individual basis or in small groups wherein a configuration database of the functional validity and preferably the performance characterization of the BCE and PCE CEs is developed, and finally, a full functional test of the CVI IC configured accordingly to said configuration database is performed. The full functional testing methods of the complete CVI IC is an alternative, this is the more traditional test method, wherein all of the BCE, & PCE CEs are initially enabled, and defective BCE & PCE CEs once determined to be defective from test results are disabled by the CCE network. Testing of the BCE and PCE CEs will preferably start with a BCE that is externally connected to I/O pads of the CVI IC or to a PCE that performs wireless I/O. The configuration database may contain multiple CVI IC configurations and wherein a given configuration may have one or more sub-configurations that are static or can be dynamically initiated. The full functional test may result in further CE defect detection, and therefore, changes to the configuration database and the repeat of the full functional test procedure. Successfully completed testing will result in a permanent [single or selectable], reconfigurable [single or selectable], or dynamically loaded CVI circuit configuration[s].
2. CVI IC configuration select circuit start. This is an operating mode of the CVI IC wherein the CCE network initiates the operation or execution of the IC by selecting a configuration for the BCE and PCE CEs from the CVI IC configuration database, and then transferring circuit operation to one or more of the CEs. The CCE network may make the selection of the CE configuration dependent upon taking into account various internal or external initial condition variables. Once the CVI IC is in CE operation, the field or user programming of CEs can in turn command the CCE network to effect CE configuration changes [dynamic or real-time] or to cause the selection the initiation of a CE configuration subset from the CVI configuration database. CE operation can make requests of the CCE network [process or task execution runtime CCE network services] to perform configuration of BCE and PCE resources to optimize the performance of dataflow or processor unit sequencing flow specific to an executing process [software program] or group of processes or specific to an instruction of a ISP [Instruction Set Processor] or FPGA directed data or information flow.
3. Non-CVI IC circuit start. This is an operating mode of the CVI IC wherein execution of the CVI IC starts with a single permanently proscribed CE configuration or from a selected CE configuration. The CCE network circuitry is used if to enable the selection of a circuit configuration. The CE configuration selection may be effected through the use of I/O signal pads or a wireless connection. When the CCE network has been by-passed, field or user programming of CEs cannot command the CCE network to effect CE configuration changes or to cause the selection of a CE configuration subset from the CVI configuration database.
4. CVI IC dynamic CCE network circuit start. This is an operating mode of the CVI IC wherein execution of the CVI IC begins with CCE network formation or rebuild, and optionally, full or partial CE validity testing, and or CE configuration amendment such as the dedication of BCE configuration and or operation. There can be a wide range of additional tasks the CCE network can be designed and directed to perform at the commands of internal or external circuitry. This CVI mode is used during the useful life of the CVI IC.

The CCE network is used as a means to perform qualification testing of all BCEs and PCEs or CCE controlled CEs of the CVI IC. The CCE network allows the incremental or one at a time testing of BCE and PCE CEs. In this manner, each BCE and PCE can be tested individually, and should a BCE or PCE be defective, it can be isolated or disabled from use. It is a preferred embodiment that there is sufficient additional equivalent BCE or PCE CEs to offset the loss of CCE controlled CEs. A defective CE may reduce the operational capacity of the CVI IC, but not to the extent that it cannot provide an acceptable level operational capacity. If there exists CEs in the CVI IC that are not controlled or enabled by a CCE network, then such CEs would be tested as part of the full functional test of the CVI IC in one or more of the CVI IC configurations.

FIG. 1 shows a circuit layer of a CVI IC comprising CCE, BCE and PCE circuitry wherein all of the BCE and PCE CEs are directly enabled or disabled by a CCE, however, not all CEs of a CVI IC are required to be controlled by the CCE network of the CVI IC. An additional function that the CCE network can optionally perform is the creation of a permanent or temporary CVI circuit configuration table comprising at a minimum the defective CEs of the CVI IC. The circuit configuration table may also comprise CE layer location, CE performance characteristics and optimum bus paths between various PCEs. FIG. 1 and its discussion also suggest the large grain circuit structure approach predominately used as the CVI configuration method.

Potential internal CCE and CCE network functions:
1. Self test verification of CCE network and CVI IC.
2. Enable and disable control of next in order CCEs during CCE network generation.
3. Selection and verification of next in order CCE in CCE network.
4. Dynamic CCE network configuration of BCE and PCE circuits and other PCE execution runtime originated commands.

5. Monitoring of BCE and PCE activity and exception or interrupt signaling.
6. BCE and PCE operation parameter setting.
7. BSE or BSE path allocation to a task or sub-task per unit of time or release event.
8. Message broadcasting to a specific BSE or PSE group or all such CEs.
9. BCE and PCE device address reference assignment.

The CCE network in addition to CVI IC verification test and initialization configuration functions, can also process commands originated during PCE process or task processing [execution]. These PCE originated runtime commands provide a means to dynamically make changes to the BCE and PCE resources of a CVI IC during its standard or normal operation. The CCE network may then be responsible for parallel processing data or operation sequencing conflict resolution per process or task, this might be accomplished through address monitoring or execution flow monitoring initialed by the CCE network. These CCE network executed commands may cause various permanent or temporary configuration changes of BCE transmission paths and the operational specifics of PCEs that are generic or specific to an executing process or task, or specific to an instruction of an ISP [Instruction Set Processor]; setting of process context dependent event signaling such as address read/write events; PCE fault detection through configuring parallel PCE comparison operations; PCE fault detection and correction through configuring PCE result verification through PCE voting; PCE execution initiation; or, FPGA logic control signaling. The circuitry of the CCEs of a CCE network can be enhanced as needed to provide additional CVI IC operational services such as to provide supervisory control capability for the CVI IC wherein the CCE network could terminate a processor or suspend it, process exception condition signaling, perform CE resource allocation, or collect real-time CE resource utilization loading.

The CVI invention allows for the implementation of ICs with circuit device densities that are not presently possible. This is to say, single die stacking does not allow for the complete testing of the stack IC layers pre-assembly due to the high vertical interconnection density of more than several thousand or tens of thousands with interconnect pitch of less than 1 microns, well beyond the test equipment test signal lines now available by 10 to 100 times, and 50× smaller than current tester probe contacts means. Therefore, once assembled, undetected defects or faults will lower die yield to near zero for die stacks greater than 10 circuit layers. The CCE network provides a novel means to dynamically allocate and configure BCE and PCE resources in a manner that is uniquely specific to the data or information algorithmic processing requirements versus current fixed microprocessor architectures for example. The CCE network's dynamic or real time BCE and PCE configuration capability provides novel circuit performance advantages when process execution is performed by FPGA circuitry rather than ISP [Instruction Set Processor, as found in today's microprocessors] circuitry. The incorporation of FPGA circuitry as one or more PCEs in combination with process [algorithmic] specific BCE and PCE [data path and arithmetic operation] is novel to the CVI ICs.

The Bus Circuit Elements or BCEs are information communication switching means and may be formed as a single transmission switch circuit structure or a collection of transmission switch circuit sub-structures that can be individually enabled. A BCE is an information communication path, composed of transmission circuitry and interconnections or wires which form physical interconnections between next neighbor BCEs or immediately adjacently connected BCEs. The number of BCE communication path interconnections is its communication path width or data path width. A BCE may include fault tolerant circuitry allowing it to configure the use of its specific communication path interconnections in such manners to detect circuitry failures and or by-pass failures with error correction circuitry operating in parallel. A BCE may be designed as a collection of individually enabled communication path circuit sub-structures increasing the potential yield of an individual BCE should one or more of these communication path sub-structures of the BCE be defective.

The Process Circuit Elements or PCEs are logic or memory circuits that are used to perform the intended data processing or control functions of the CVI IC in conjunction with the BCE CEs. PCEs may be microprocessors, arithmetic processors, ISP, data flow processors, FPGA circuits, register files, processor thread memory files, or ASIC circuits for example.

BRIEF DESCRIPTION OF THE DRAWINGS

The present invention may be further understood from the following description in conjunction with the appended drawings. In the drawing:

FIG. 26 is the layout of Data Flow Controller Table.

FIG. 27a is the layout of a Data Flow Controller Table processing parameters.

FIG. 27b is the layout of a table of Data Flow Controller Table processing parameters.

FIG. 29b is a example implementation of a Data Flow Controller Table.

FIG. 29c is an example of Data Flow Controller Table processing with selective operand purge capability by subtask.

FIG. 30a is the layout of a function unit input queue.

FIG. 30b is the layout of a function unit output queue.

FIG. 31 is the layout a Data Flow Controller cache.

ADDITIONAL ASPECTS AND OBJECTIVES OF THE CVI INVENTION

Figure 1:
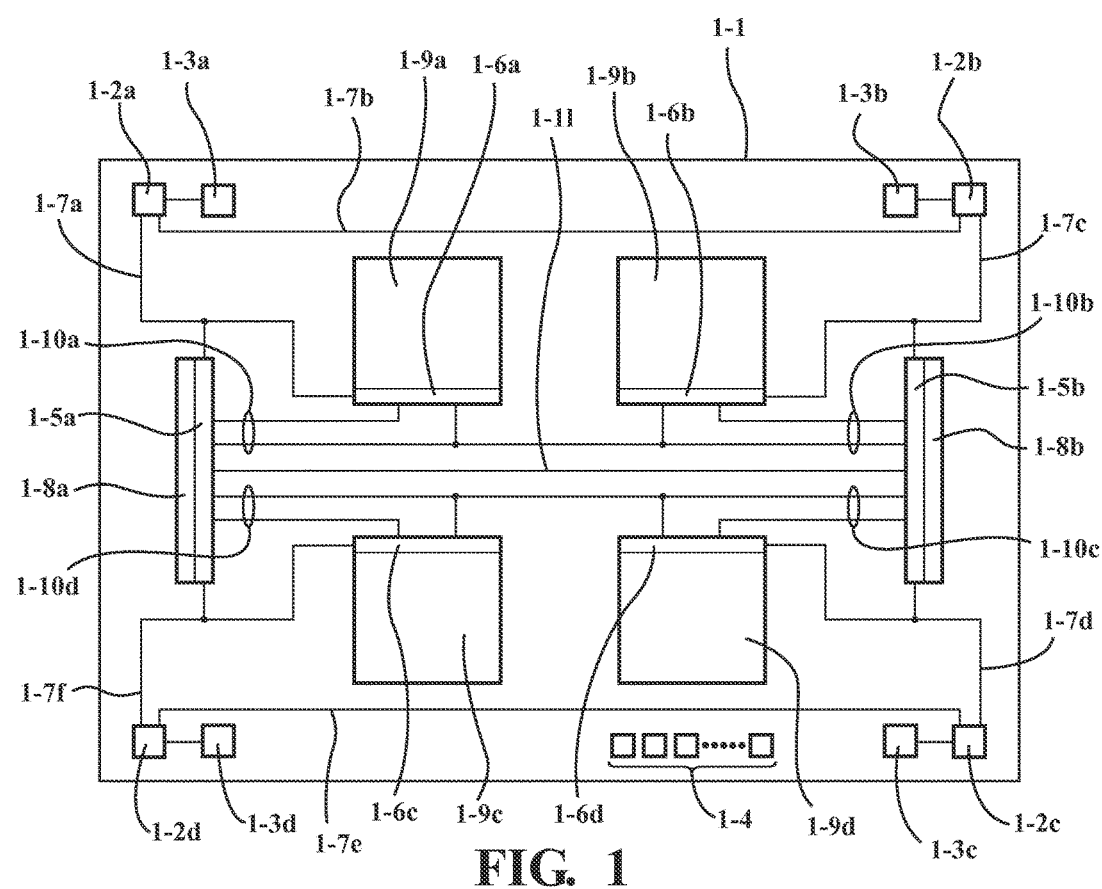
FIG. 1 is a top view of a CVI circuit layer.

It is an aspect and objective of the CVI invention to provide a means to make the yield of a stacked integrated circuit to a greater extent independent of the number of circuit layers stacked therein.

It is a further aspect and objective of the CVI invention that a CCE network controls the enabling and disabling of all or a plurality of the CEs in a CVI IC.

It is a further aspect and objective of the CVI invention that a CCE enable or disable other CCEs in its network.

It is a further aspect and objective of the CVI invention that the CCEs may dynamically form a network in order to enable the initial production testing of the CVI IC.

It is a further aspect and objective of the CVI invention that the CCEs may dynamically form a network in order to enable the reconfiguration of a CCE network should a CCE of said network fail or develop an operation defect during its useful life preventing its normal operation.

It is a further aspect and objective of the CVI invention that CCEs may form a network through a wireless means.

It is a further aspect and objective of the CVI invention that CCE networks of a CVI IC may communicate with each other through a wireless means.

It is a further aspect and objective of the CVI invention that CCE networks of a CVI IC may communicate with each other through the I/O external contact pads of the CVI IC.

It is a further aspect and objective of the CVI invention that the CCE network may be fault tolerant, reconfigurable and transparently recoverable when a fault occurs.

It is a further aspect and objective of the CVI invention that CCE networks of a CVI IC may be enabled and controlled by an external test means.

It is a further aspect and objective of the CVI invention that CCE networks of a CVI IC may be enabled and controlled by an internal test means.

It is a further aspect and objective of the CVI invention that CCE networks of a CVI IC may be enabled and controlled by an external hardware or software facility of the CVI IC.

It is a further aspect and objective of the CVI invention that the CCE network may enable the CVI IC to be tested by directed or dynamic selection of subsets BCE and PCE circuit portions or CEs.

It is a further aspect and objective of the CVI invention that the CCE network may perform fine grain testing or individualized testing for circuit defects of BCE and PCE CVI circuit portions or CEs.

It is a further aspect and objective of the CVI invention that the CCE network may perform fine grain testing or individualized testing for circuit performance of BCE and PCE CVI circuit portions CEs.

It is a further aspect and objective of the CVI invention to enable the fabrication with economically acceptable yields of 3D circuits with greater than 10 circuit layers and greater than 30 circuit layers.

It is a further aspect and objective of the CVI invention that the circuit layers of the CVI IC do not require test qualification prior to their use in producing a stacked CVI IC.

It is a further aspect and objective of the CVI invention that the Configuration Control Element [CCE] circuits may be fault tolerant wherein if a CCE of a CCE network should fail the CCE network can be recreated avoiding the defective CCE.

It is a further aspect and objective of the CVI invention that the CCE network may optionally be controlled by an internal CE controller logic or microprocessor.

It is a further aspect and objective of the CVI invention that the CCE network may enable or disable all of the CEs of the CVI IC.

It is a further aspect and objective of the CVI invention that the CCE network may enable or disable a plurality of the CEs of the CVI IC.

It is a further aspect and objective of the CVI invention that a CVI IC may be configured by a CCE network as a means to prevent the use of one or more defective CEs and as a means to raise the operating yield [effective net yield] of the CVI IC.

It is a further aspect and objective of the CVI invention that the CVI IC may comprise CEs that are spares and to be used when a similar CE fails and requires replacement.

It is a further aspect and objective of the CVI invention that the CVI IC may comprise a plurality of CEs of an identical type all potentially in use by the CVI IC, wherein should one of said CEs fail, it will not be replaced by a spare CE, but its loss will result in the reduced capacity of the CVI IC.

It is a further aspect and objective of the CVI invention that a cross-bar bus switch be implemented by a plurality of vertical structured buses or BCEs.

It is a further aspect and objective of the CVI invention to use a vertical common interconnection or waveguide interconnecting various circuit layers of a CVI IC for the purpose of providing a plurality of simultaneous transmissions made at different frequencies.

It is a further aspect and objective of the CVI invention to use high bandwidth bus communication techniques to connect a plurality of circuit layers having a plurality of microprocessor functions such as ISP, arithmetic function units, register file or processor threads.

It is a further aspect and objective of the CVI invention to use high bandwidth bus communication techniques to connect a plurality of circuit layers having a plurality of FPGA, arithmetic function units, register file or processor threads circuitry.

It is a further aspect and objective of the CVI invention to provide a Data Path Controller that will use data path descriptors to utilize various BCE, PCE function units, and that this Data Path Controller operate at the initiation of ISP circuitry or FPGA circuitry.

It is a further aspect and objective of the CVI invention for a function unit to perform a series of operations wherein an indexed addressing fetch of operands for said operations is performed by the input queue circuit to the function unit and output circuit performs a similar indexed addressing store.

It is a further aspect and objective of the CVI invention to provide [enable] process or algorithmic specific data path and arithmetic circuit resource configurations in combined use with FPGA process directed or execution control circuitry.

It is a further aspect and objective of the CVI invention to provide CCE network CVI IC operational process specific support services for dynamic or real time BCE and PCE configuration.

It is a further aspect and objective of the CVI invention to provide FPGA circuitry that may execute FPGA programming that is larger than the physical FPGA circuitry of a CVI IC.

It is a further aspect and objective of the CVI invention to enable loading of a FPGA circuit or a page of a FPGA circuit in a real time manner or in less than 8 memory clock cycles.

It is a further aspect and objective of the CVI invention to stack FPGA logic circuitry and configuration memory circuitry as separate circuit layers.

It is a further aspect and objective of the CVI invention that local memory control logic comprise comparison logic to perform searches of the local memory, therein reducing memory bus transmission loading and the time to search memory.

It is a further aspect and objective of the CVI invention to maximize the use of BCE & PCE resources and reduce net system performance upon a CE failure versus replacing defective CEs from spare or unutilized CE inventory.

It is a further aspect and objective of the CVI invention that an ordered sequencing of the stacking of the CVI circuit layers be a limited requirement.

DETAILED DESCRIPTION OF THE CVI INVENTION AND PREFERRED EMBODIMENTS

A primary objective is the CVI invention is to provide methods and means to enhance the yield of 3D or stacked integrated circuits. There are a plurality of preferred embodiments of the CVI invention, a number of which are described herein and intended not to be herein limiting of the implementations of the CVI invention. A CVI IC is composed of a plurality of circuit layers. Each CVI circuit layer is composed of a set of Circuit Elements [CEs]. The CEs are broadly referred to as Configuration Control Elements [CCEs], Bus Control Elements [BCEs] and Process Circuit Elements [PCEs]. It is not a requirement that the selection set of CEs of a CVI circuit layer comprise all CE types. References to vertical interconnections will generally mean interconnections that pass completely through one or more circuit layers.

FIG. 1 through FIG. 5 show various potential implementations for a yield enhancement of a CCE network structure. The CCE network is used to implement the configuration of the Circuit Elements of the CVI IC.

FIG. 1 shows an example of a CVI circuit layer 1-1. It has four CCEs 1-2a, 1-2b, 1-2c, 1-2d which are connected to wireless transceivers 1-3a, 1-3b, 1-3c, 1-3d, the wireless transceivers are optional if I/O pads 1-4 are used for control and input output access of at least the first CCE of the CCE network. Interconnects 1-7a, 1-7b, 1-7c, 1-7d connect CCEs and enable/disable CE circuitry 1-5a, 1-5b, 1-6a, 1-6b, 1-6c, 1-6d. It is a preferred embodiment that only one fully functional CCE is need per CVI circuit layer unless more than one CCE network is established. BCEs 1-8a, 1-8b are data path control switching circuits for transfer of information between the PCEs 1-9a, 1-9b, 1-9c, 1-9d of the circuit layer 1-1 and to other BCEs on other circuit layers of the CVI IC. PCEs 1-9a, 1-9b, 1-9c, 1-9d are connected to the BCEs by bus signal lines or interconnect wires 1-10a, 1-10b, 1-10c, 1-10d. BCEs 1-9a, 1-9b can transfer information between each other over intervening bus interconnections 1-11 on the circuit layer 1-1 and or vertically through the CVI circuit layer to BCEs on a lower circuit layer and or to BCEs on a higher circuit layer of the CVI IC. The PCEs 1-9a, 1-9b, 1-9c, 1-9d may be logic or memory circuitry. If one or more of the PCEs 1-9a . . . 1-9d are memory circuitry, such memory circuits may comprise in its logic control circuitry comparison and address indexing logic for performing a local search of the memory PCE. This results in lower BCE utilization loading, and if the same search request is performed on a plurality of such memory PCEs at the same time, results in a parallel processing performance enhancement.

There are other CVI IC designs that may utilize the CCE circuitry. An alternative CCE circuit and network structure would be to integrate the CCE circuitry with the BSE circuitry. There may also be other circuitry that CCE circuitry could be integrated such as some or all of the PCE circuitry. The CCE network could remain a CVI IC feature but the procedure for setting up the CCE network and initial procedure for external or off-chip access may likely change. FIG. 1 would change with respect to the CCEs 1-2a . . . 1-2d and the wireless transceivers 1-3a . . . 1-3d. These circuits would be integrated into what is shown in FIG. 1 as the CCE circuitry 1-5a 1-5b associated with the BSE circuitry 1-8a 1-8b. This type of change would likely be reflected throughout the other figures herein. The CCE structure as shown in FIG. 1 and other figures throughout this specification is preferred for its anticipated higher CVI IC yield versus a design wherein the CCE circuitry is integrated into other circuit structures.

Figure 2A:
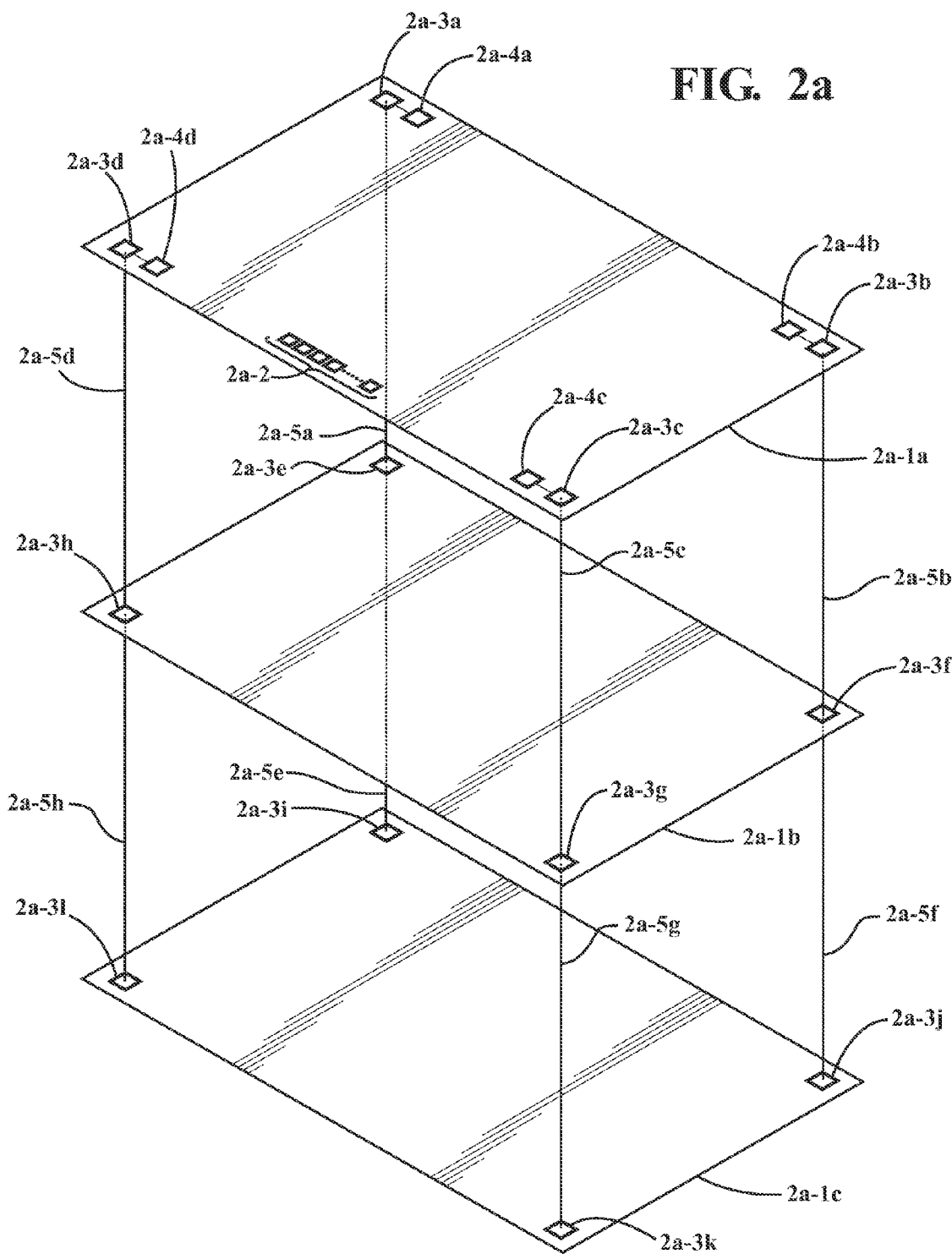
FIG. 2a is a pictorial view of a vertically redundant CCE network structure as three layers of a CVI IC with the vertical CCE interconnections intentionally elongated for viewing emphasis.

FIG. 2a shows three CVI circuit layers 2a-1a, 2a-1b, 2a-1c in an exploded fashion to help emphasize the vertical through circuit layer interconnections 2a-5a . . . 2a-5h between the CCEs [2a-3a, 2b-3e, 2a-3i], [2a-3b, 2b-3f, 2a-3j], [2a-3c, 2b-3g, 2a-3k], [2a-3d, 2b-3h, 2a-3l] respectively of said CVI circuit layers. There are no BCE and PCE CEs shown. There are four potential CCE networks represented. Four CCE networks can be formed as shown [2a-3a, 2b-3e, 2a-3i], [2a-3b, 2b-3f, 2a-3j], [2a-3c, 2b-3g, 2a-3k], [2a-3d, 2b-3h, 2a-3l]; there also could have been a lesser number of potential CCE networks for this CVI IC. There is likely a very high probability that at least one of the four CCE networks will prove to be a defect free CCE network, the yield of a CCE network will depend to a larger degree on the size of the individual CCE. This is a preferred embodiment of the CVI invention since a minimum number of potential CCE interconnection structures for forming a CCE network may prove sufficient for CVI ICs with less than 6 to 8 layers, if not, a circuit layout design with an increased number of CCEs per layer will be necessary.

Figure 2B:
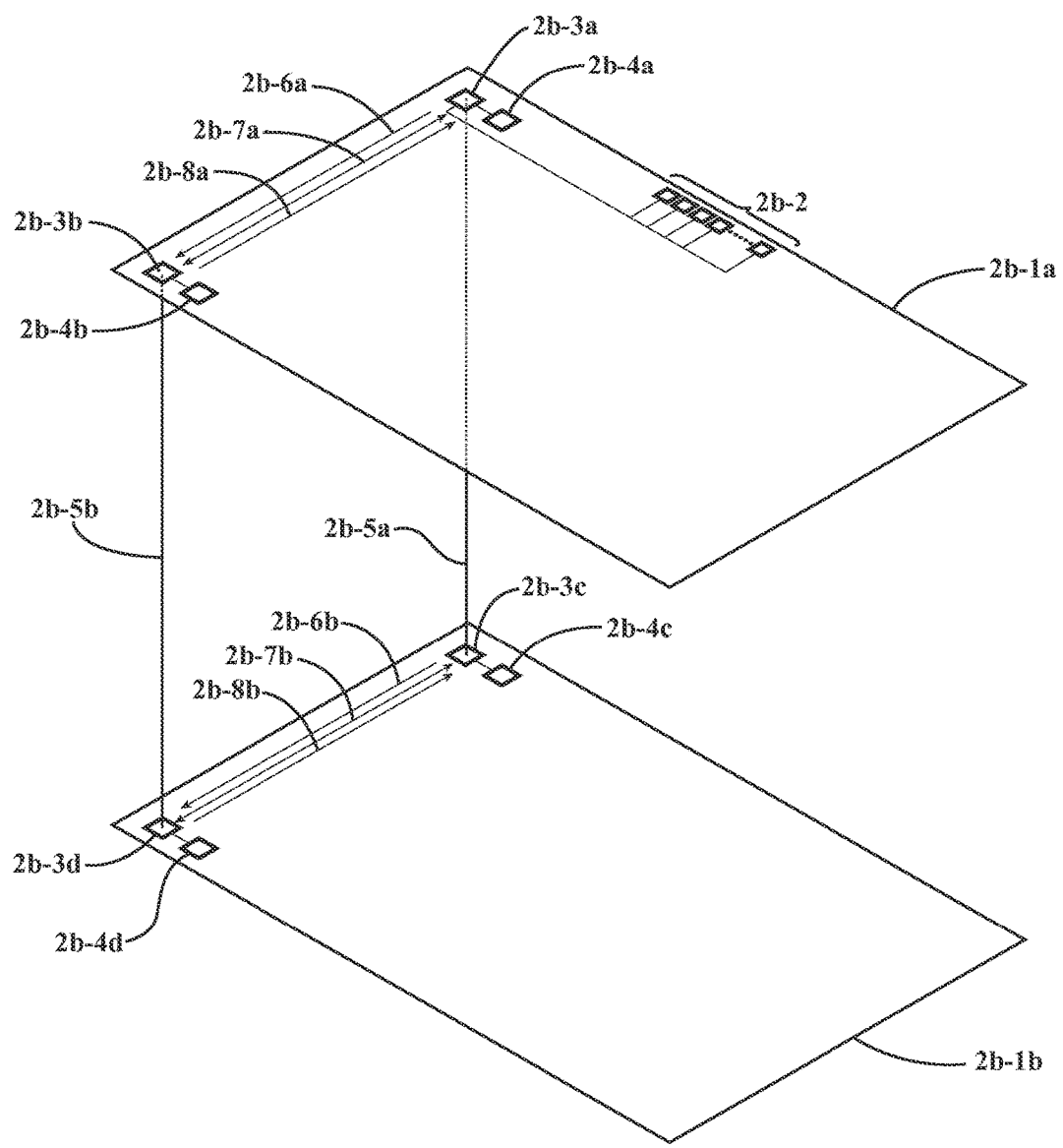
FIG. 2b is a pictorial view of a minimal redundant CCE network structure as two layers of a CVI IC with the vertical CCE interconnections intentionally elongated for viewing emphasis.

FIG. 2b shows two CVI circuit layers 2b-1a, 2b-1b in an exploded fashion to help emphasize the vertical through circuit layer interconnections 2b-5a, 2b-5b between the CCEs 2b-3a, 2b-3c, 2b-3b, 2b-3d respectively of said CVI circuit layers. There are no BCE and PCE CEs shown. There are several potential CCE networks. These CCE networks begin with either first CCE 2b-3a and CCE 2b-3c via direct interconnections 2b-5a or first CCE 2-3b and CCE 2b-3d via direct interconnections 2b-5b. If CCE 2b-3a is defective alternate CCE networks consist of first CCE 2b-3b and CCE 2b-3d via direct interconnections 2b-5b or first CCE 2b-3b and CCE 2b-3c via interconnections 2b-8a & 2b-5a. Interconnections 2b-6a between CCEs on the upper circuit layer 2b-1a and interconnections 2b-6b on the lower circuit layer 2b-1b are optional. Either of the first CCEs on circuit layer 2b-1a are operationally accessed through I/O contact pads 2b-2 of the upper circuit layer 2b-1a or through wireless circuitry 2b-4a & 2b-4b. The CCE network is established by validating a first CCE and then a second CCE. Once a CCE network is established the BCEs and PCEs [not shown] of the circuit layers 2b-1a, 2b-1b are tested and validated for functional operation. The BCEs and PCEs of the circuit layers 2b-1a, 2b-1b are operationally validated preferably in a step-by-step fashion of one BCE or PCE at a time beginning with the BCE[s] of the circuit layer of the first CCE. FIG. 2b teaches alternate CCE network interconnection structures through interconnections 2b-6a, 2b-6b, 2b-7a, 2b-7b, 2b-8a & 2b-8b should either a CCE or interconnection of selected CCE network be defective.

Figure 2C:
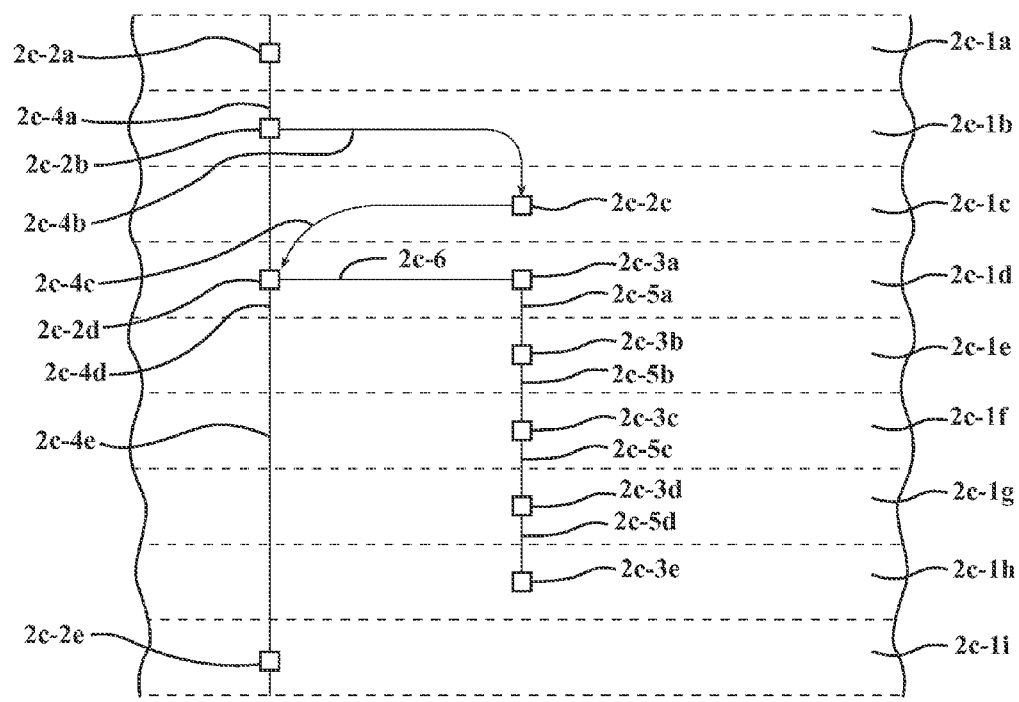
FIG. 2c is a schematic cross-sectional view of a CVI IC showing a CCE sub-network.

FIG. 2c shows a schematic cross-sectional view of a CVI IC with nine [9] circuit layers 2c-1a . . . 2c-1i and a CCE sub-network 2c-3a . . . 2c-3e connected at CCE 2c-2d by interconnection 2c-6 of a first CCE network 2c-2a . . . 2c-2e with vertical through circuit layer interconnections 2c-4a . . . 2c-4e. A CCE sub-network may be used to assist in a selected configuration change to a subset of the CVI IC CEs. The displacement of CCE 2c-2c indicates that the CCE directly inline with 2c-2b and 2c-2d was defective and an alternate CCE was used to replace it. CCE 2c-2c is interconnected by by-pass interconnections 2c-4b and 2c-4c. By-pass interconnections are interconnections that connect two CCEs that adjoin an intervening CCE.

Figure 3:
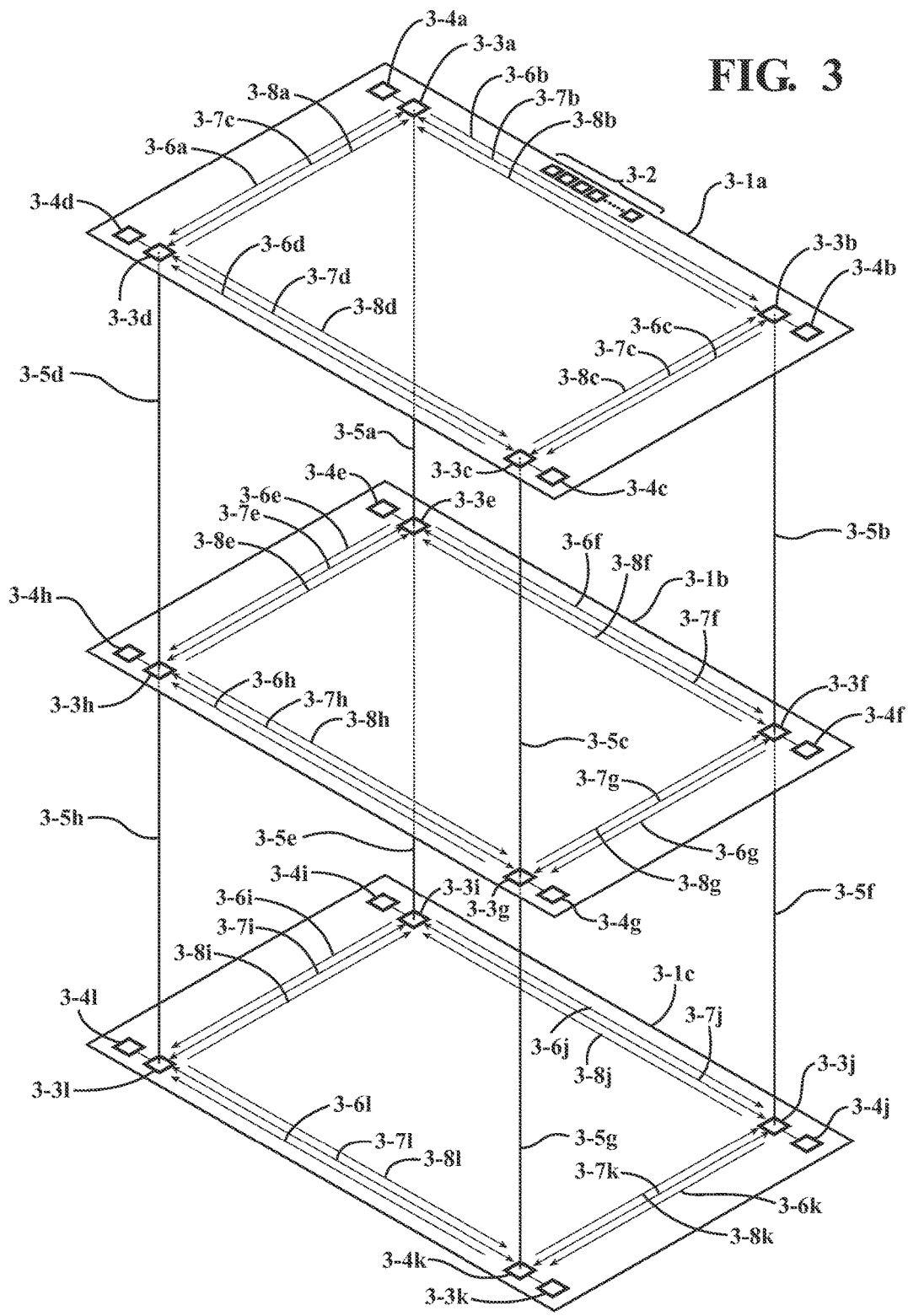
FIG. 3 is a pictorial view of a CCE network structure as three layers of a CVI IC with the vertical CCE interconnections intentionally elongated for viewing emphasis.

FIG. 3 shows three circuit layers 3-1a, 3-1b, 3-1c of an CVI IC in a exploded fashion to help emphasize the vertical through circuit layer interconnections 3-5a, 3-5b, 3-5c, 3-5d, 3-5e, 3-5f, 3-5g, 3-5h between four sets of CCEs [3-3a, 3-3e, 3-3i], [3-3b, 3-3f, 3-3j], [3-3c, 3-3g, 3-3k], [3-3d, 3-3h, 3-3l]. There are same circuit layer connections between CCEs 3-7a . . . 3-7l, and by-pass connections 3-6a . . . 3-6l and 3-8a . . . 3-8l. There are no BCE and PCE CEs shown. The CCE network for the CVI IC is most likely to be formed from these said four sets of CCEs with the first CCE being associated with the top circuit layer 3-1a, although this is not a limitation of the CVI invention and any CCE on any layer could be used. Optional wireless input output means [3-4a . . . 3-4l] for each CCE could be used as an alternative to or in conjunction with the circuit layer I/O pads 3-2. BCE and PCE CEs of the CVI IC are not shown. One design embodiment for this CVI IC could have each CCE on a circuit layer interconnected to the enable circuitry for each BCE and PCE on the same circuit layer. The CCE network is formed by selection and qualification of a first CCE through I/O pad and or wireless means with subsequent CCEs for each circuit layer selected and qualified from the preceding CCE. In the event that a CCE network for this CVI IC was composed of CCEs 3-3b, 3-3e, 3-3i, and CCE 3-3a was the first selected CCE for the CCE network, that would suggest that the CCE 3-3a was determined to be defective and that after selection of CCE 3-3b as the first CCE for the CCE network, CCE 3-3f was determined to be defective. CCE 3-3b is connected to CCE 3-3e with lines 3-5b & 3-7f allowing CCE 3-3b to enable CCE 3-3e. Vertical interconnections 3-5e would be used by CCE 3-3e to enable CCE 3-3i. It is a preferred embodiment of the CVI invention that CCE by-pass interconnections be available for use to avoid or by-pass a defective CCE when possible and connect to a CCE typically on an alternate circuit layer; by-pass interconnections are interconnections that connect two CCEs that adjoin an intervening CCE either on separate layers or the same layer; for example, by-pass interconnections 3-6a connects CCE 3-3a to either 3-3h or 3-3c, the single headed arrows point to the CCE that is by-passed. The inclusion in a CVI IC implementation of by-pass interconnections are not required, but may present a cost saving if used depending on the CCE circuit yields. Interconnections 3-6a . . . 3-6l and 3-8a . . . 3-8l are CCE by-pass interconnections The 3-6 & 3-8 interconnection sets, if present, can be used as alternate interconnections versus use of the 3-5 & 3-7 interconnections to form a CCE network, for example the CCE network 3-3b, 3-3g, 3-3l could use interconnection 3-6c and to connect to CCE 3-3g and interconnect 3-6h to reach 3-3l assuming that CCEs 3-3c and 3-3h were both defective. The inclusion of the 3-6 and or 3-8 interconnection sets in the design of a CVI IC is a trade off versus the use of additional redundant CCEs and or achieving the higher desired yields for the specific CVI IC.

The CVI IC in FIG. 3 can be used for all CVI IC operational modes. It is an example of one of many potential CCE designs intended to provide an enhanced CCE network yield probability.

Figure 4:
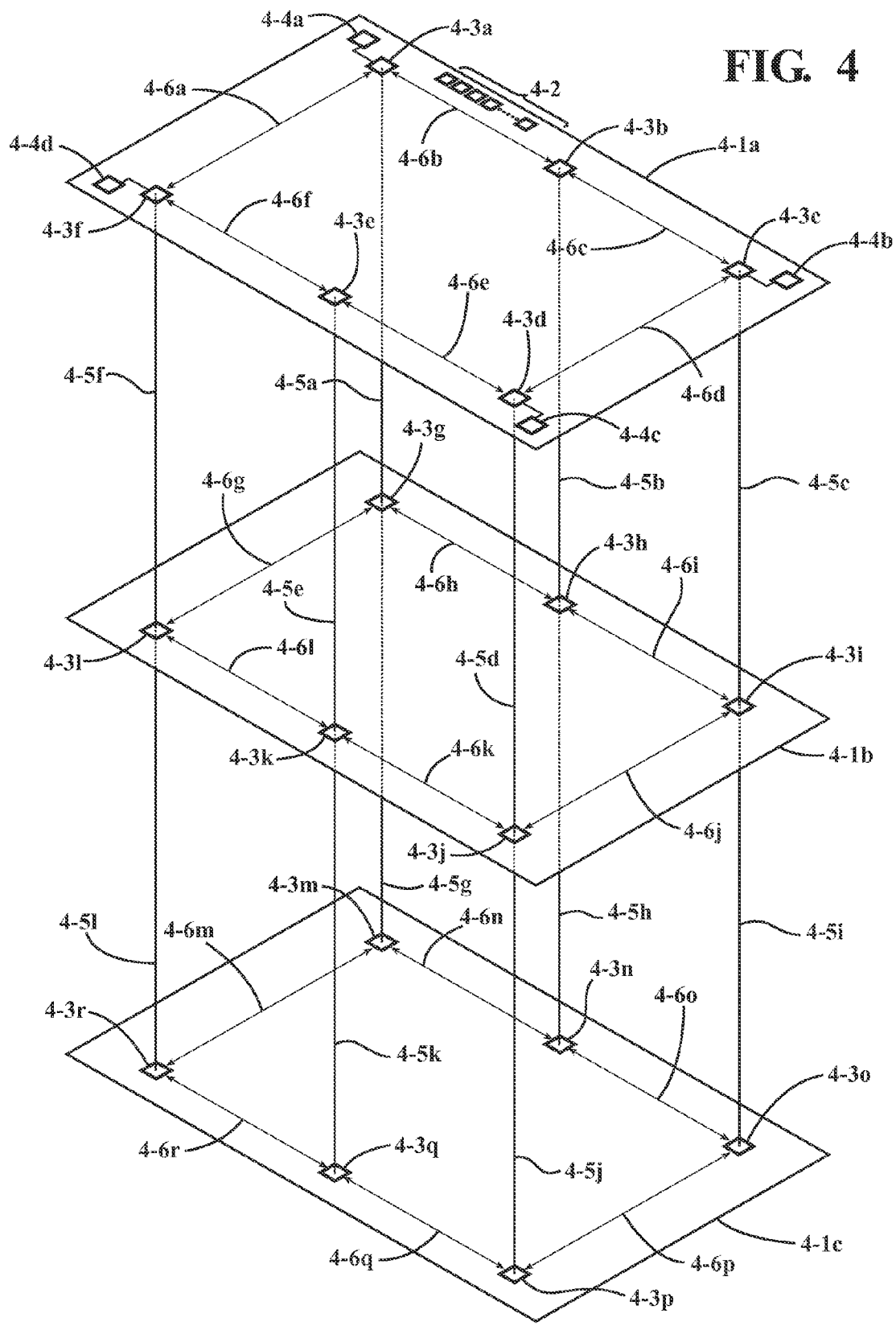
FIG. 4 is a pictorial view of a CCE network structure of a CVI IC with the vertical CCE interconnections intentionally elongated for viewing emphasis.

FIG. 4 shows three circuit layers 4-1*a*, 4-1*b*, 4-1*c* of a CVI IC in an exploded fashion to help emphasize the vertical through circuit layer interconnections 4-5*a* . . . 4-5*l*. CCEs 4-3*a* . . . 4-3*r* are connected by interconnections 4-6*a* . . . 4-6*r*. There are no BCE and PCE CEs shown. Optional wireless input output means [4-4*a* . . . 4-4*d*] could be used as an alternative to or in conjunction with the circuit layer I/O pads 4-2. Interconnections 4-6*a* . . . 4-6*r* only connect CCEs in the same circuit layer and do not connect CCEs on alternate circuit layers, therefore, if there is a CCE failure in one of the six potential vertically connected CCE networks [4-3*a*, 4-3*g*, 4-3*m*], [4-3*b*, 4-3*h*, 4-3*n*], [4-3*c*, 4-3*i*, 4-3*o*], [4-3*d*, 4-3*j*, 4-3*p*], [4-3*e*, 4-3*k*, 4-3*q*], [4-3*f*, 4-3*l*, 4-3*r*] an alternate CCE will have to be used in the same circuit layer as the defective CCE, but also because the only interconnections are CCE to CCE interconnections and there are no by-pass interconnections, an addition CCE in the layer preceding the defective CCE will be needed as a means to provide a connective path to the alternate CCE. As an example if only CCE 4-3*g* were defective in the potential CCE network of 4-3*a*, 4-3*g*, 4-3*m*, then a potential alternative CCE network would be 4-3*a*, 4-3*b*, 4-3*h*, 4-3*n*, wherein 4-3*b* would serve as a connective means between CCEs 4-3*a* and 4-3*h*, or 4-3*a*, 4-3*f*, 4-3*l* & 4-3*r* with 4-3*f* serving as a connective means between CCE 4-3*a* and 4-3*l*.

The CVI IC in FIG. 4 can be used for all CVI IC operational modes. It is an example of one of many potential CCE designs intended to provide an enhanced CCE network yield probability.

Figure 5:
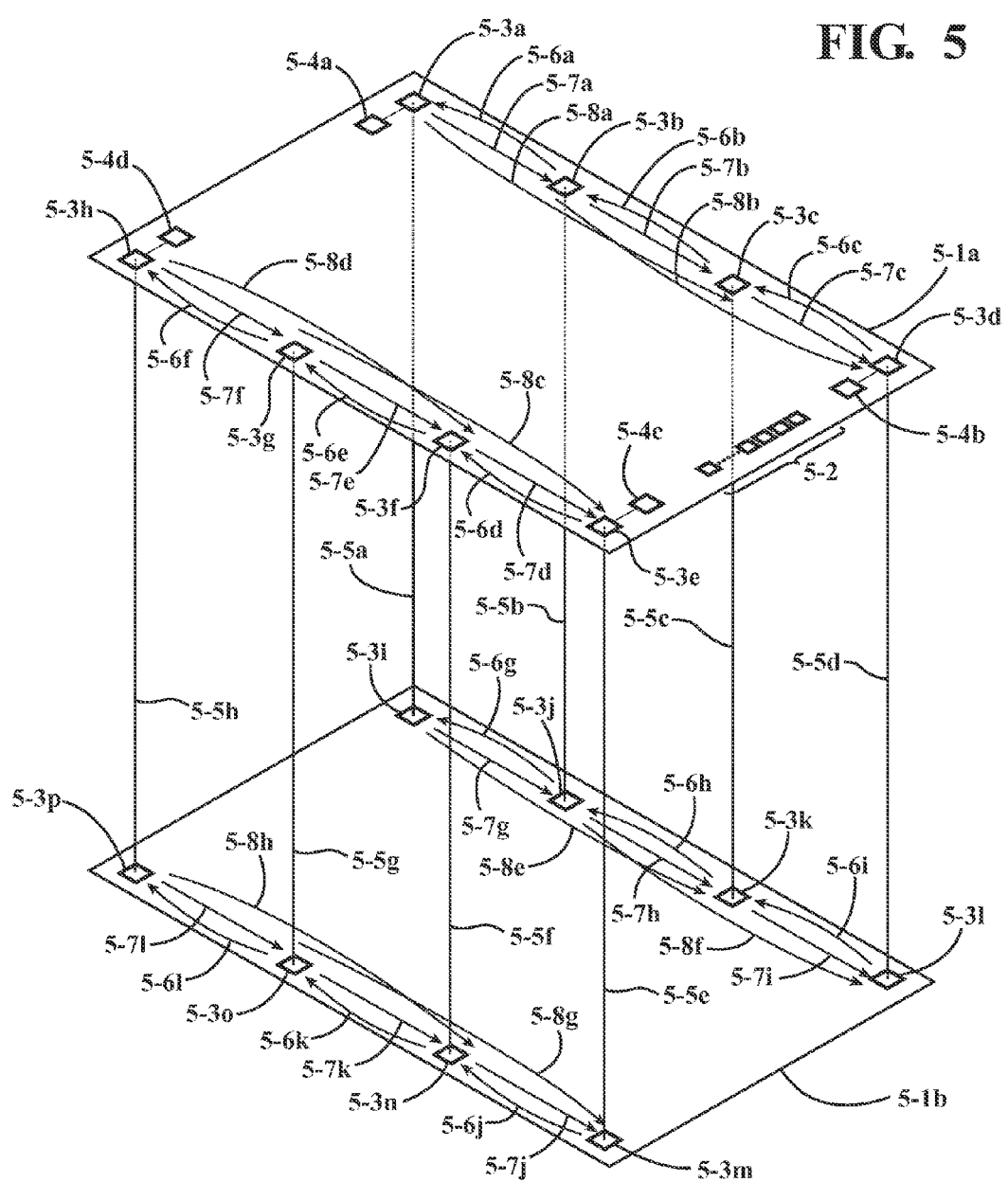
FIG. 5 is a pictorial view of a CCE network structure of a CVI IC with the vertical CCE interconnections intentionally elongated for viewing emphasis.

FIG. 5 shows three circuit layers 5-1*a*, 5-1*b*, 5-1*c* of a CVI IC in an exploded fashion to help emphasize the vertical through circuit layer interconnections 5-5*a* . . . 5-5*h*. CCEs 5-3*a* . . . 5-3*p* are further connected by by-pass interconnections 5-6*a* . . . 5-6*l*, 5-7*a* . . . 5-7*l* & 5-8*a* . . . 5-8*h*. There are no BCE and PCE CEs shown. Optional wireless input output means [5-4*a* . . . 5-4*d*] could be used as an alternative to or in conjunction with the circuit layer I/O pads 5-2. The interconnections for the CCEs are so designed that any CCE network would be on one side of the CVI IC or the other. This is the case due the limited use of by-pass interconnections as shown in FIG. 5; there are no interconnections for CCEs in the same circuit layer. This design of CCEs would limit the interconnections of the CCE network of the CVI IC to one of the two separated sides of the CVI IC or two CCE networks could be created for configuring CEs, one for each side of the CVI IC. If two CCE networks were created, these CCE networks could be controlled through the I/O pads 5-2, wireless means 5-4*a* . . . 5-4*d* or though use of a CE of control logic such as a microprocessor that provides interconnections to both CCE networks.

The CVI IC in FIG. 5 can be used for all CVI IC operational modes. It is an example of one of many potential CCE designs intended to provide an enhanced CCE network yield probability.

Figure 6:
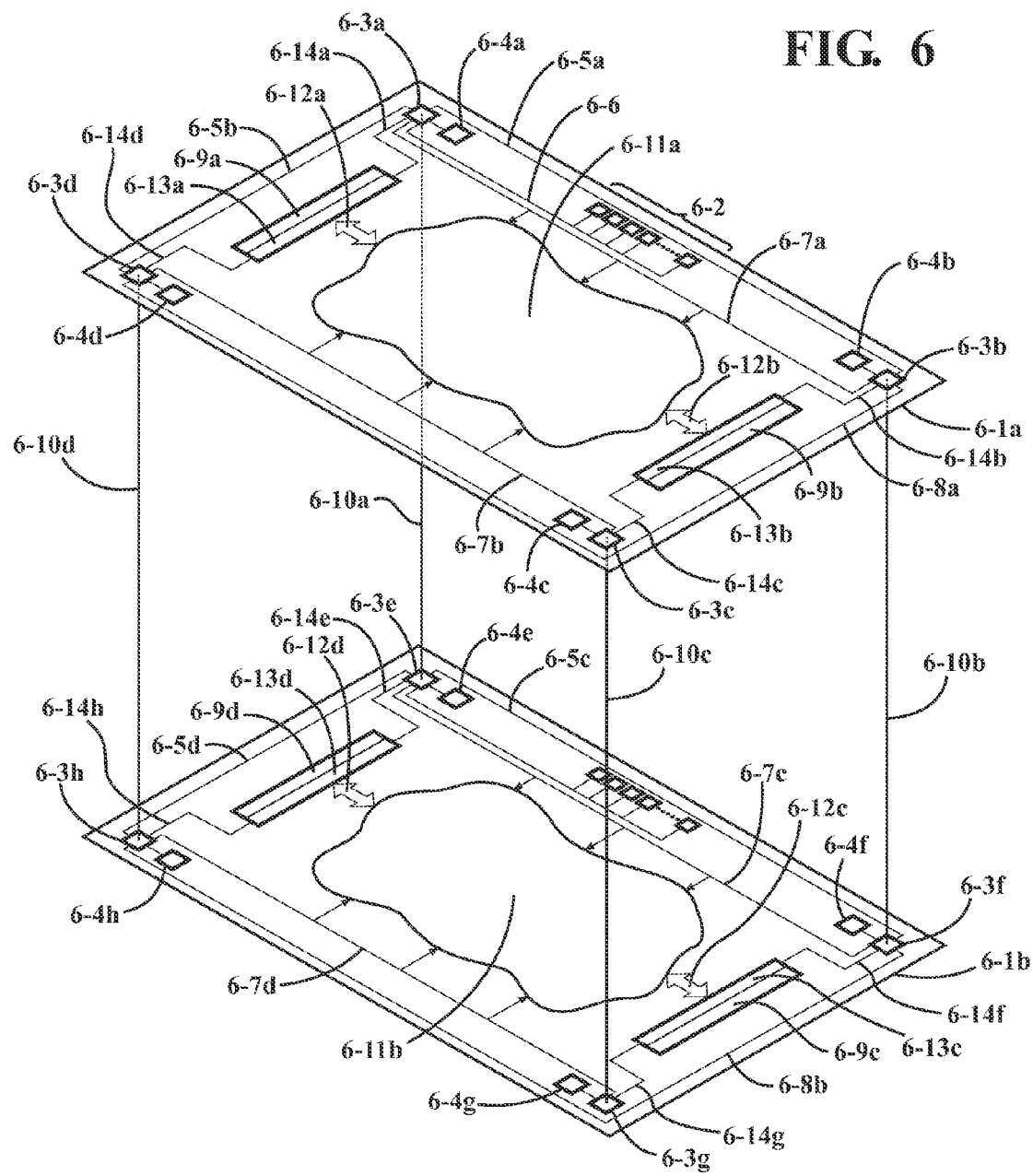
FIG. 6 is a pictorial view of a two layer CVI IC with the vertical CCE interconnections intentionally elongated for viewing emphasis.

FIG. 6 shows two circuit layers 6-1*a*, 6-1*b* of a CVI IC in an exploded fashion to help emphasize the vertical through circuit layer interconnections 6-10*a* . . . 6-10*d*. CCEs 6-3*a* . . . 6-3*h* are connected by interconnections 6-5*a* . . . 6-5*d*, 6-8*a*, 6-8*b*; these CCE interconnections are coplanar interconnections used for CCE network formation. Optional wireless input output means [6-4*a* . . . 6-4*h*] could be used as an alternative to or in conjunction with the circuit layer I/O pads 6-2. BCEs 6-9*a* . . . 6-9*d* are enabled by CCE control circuitry 6-13*a* . . . 6-13*d* and connect to CEs 6-11*a*, 6-11*b* via busing lines 6-12*a* . . . 6-12*d*. The CEs 6-11*a*, 6-11*b* are enabled for operation via interconnections 6-7*a* , , , –6-7*d* and CCE control circuitry associated with the CEs 6-11*a*, 6-11*b* and not shown.

The CVI IC in FIG. 6 can be used for all CVI IC operational modes. It is an example of one of many potential CVI designs intended to provide an enhanced CVI IC yield probability.

Figure 7:
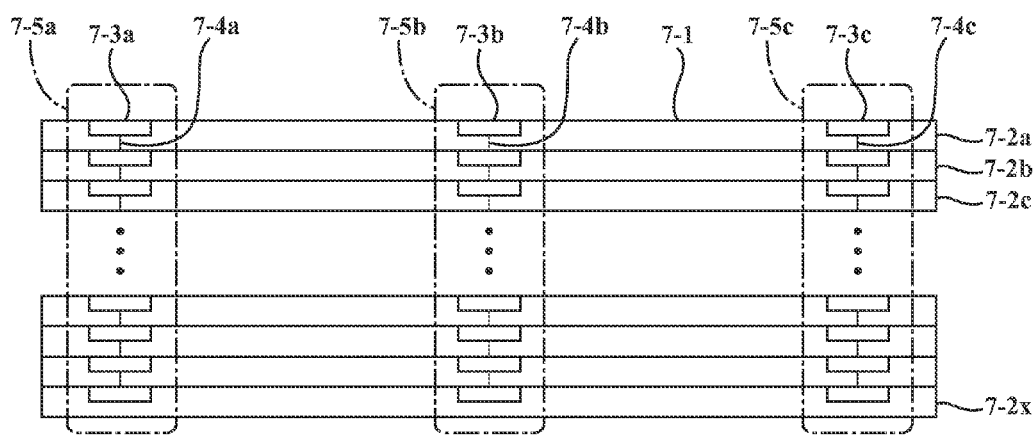
FIG. 7 is a cross-sectional view of a CVI IC showing vertical busing structures.
Figure 15:
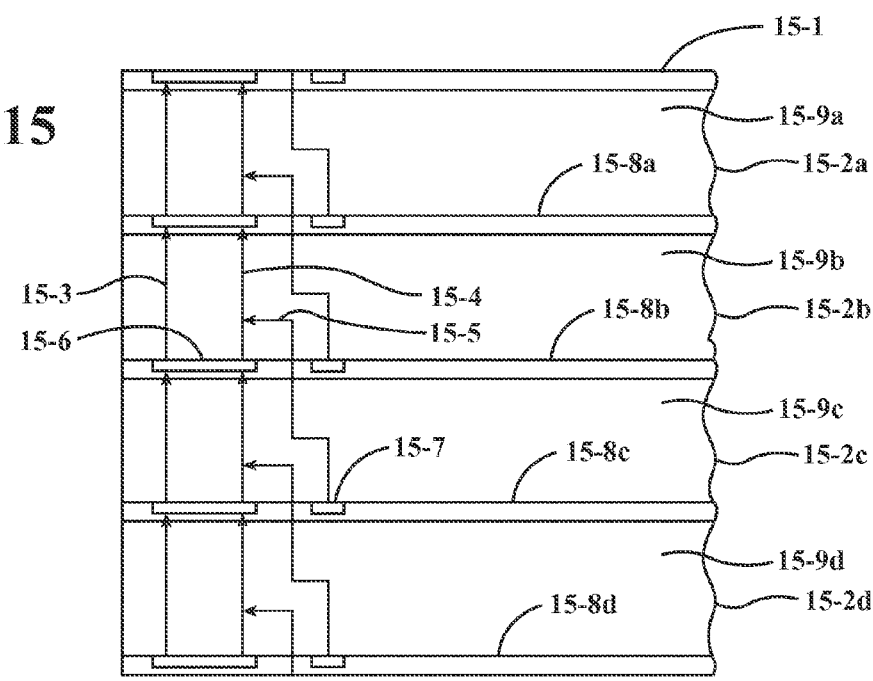
FIG. 15 is a cross-sectional view of a vertical transmission line BCE bus structure through multiple CVI circuit layers.
Figure 15A:
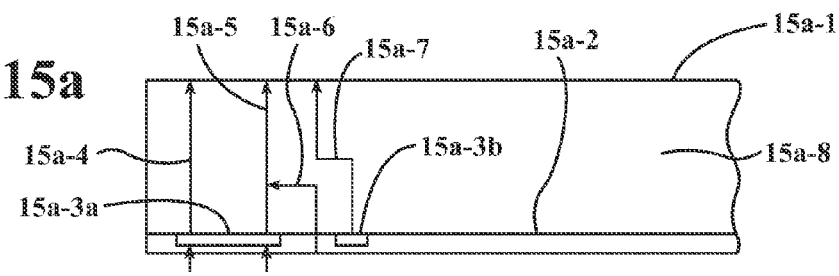
FIG. 15a is a cross-sectional view of a vertical transmission line BCE bus structure through one CVI circuit layers.
Figure 16:
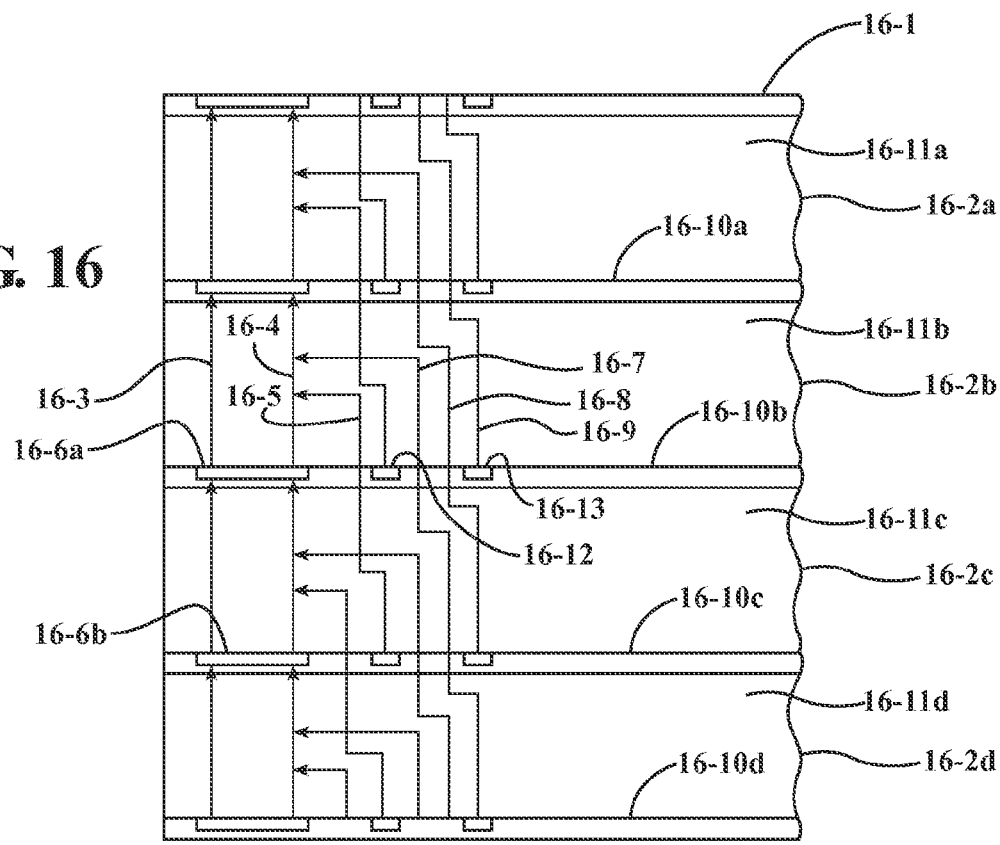
FIG. 16 is a cross-sectional view of a vertical transmission line BCE bus structure through multiple CVI circuit layers.
Figure 16A:
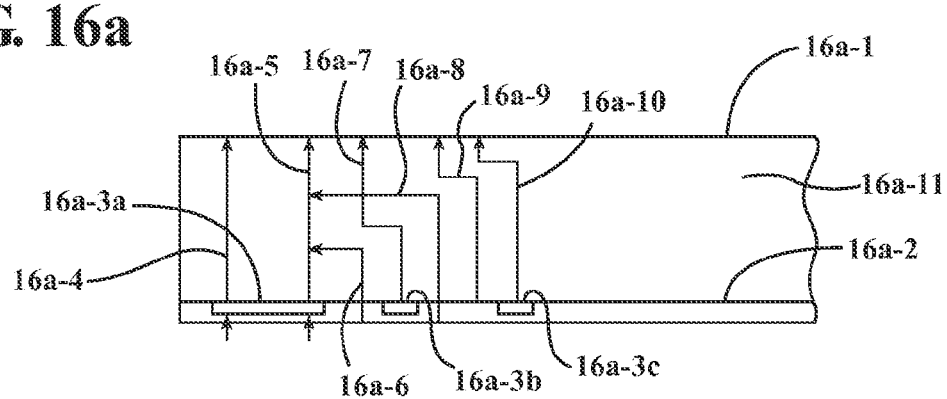
FIG. 16a is a cross-sectional view of a vertical transmission line BCE bus structure through one CVI circuit layers.

FIG. 7 shows a plurality of circuit layers 7-1*a*, 7-1*x* of a CVI IC 7-1 in cross-section showing BCEs vertically structured and through circuit layer interconnected 7-5*a* . . . 7-5*c*. BCEs 7-3*a* . . . 7-*c* are connected respectively to an adjoining BCEs by vertical through circuit layer busing interconnections 7-4*a* . . . 7-4*c*. The BCEs may be configurable or non-configurable, and are preferably enabled for use by a CCE network. There are three vertical bus assemblies that connect to all layers of the CVI IC 7-5*a*, 7-5*b*, 7-5*c*. Each circuit layer will likely have one or more CEs such as shown in FIGS. 1, 8 & 19-24. The use of three vertical bus assemblies is intended to provide CVI IC yield enhancement and high bus bandwidth. The BCEs used in each bus assembly can comprises a single set of bus line transceivers or be a configurable BCE wherein the yield of the BCE is higher because it does not have a single point of failure that would prevent the use of the BCE. The loss of a single BCE in an assembly may not necessarily prevent the remaining BCEs in the assembly for operating but with by-passing the failed BCE, the by-pass circuitry is shown in FIG. 15 and FIG. 15*a*. The loss of two consecutive BCEs in an assembly may not necessarily prevent the remaining BCEs in the assembly for operating but with by-passing the failed BCEs, the by-pass circuitry is shown in FIG. 16 and FIG. 16*a*.

Figure 8:
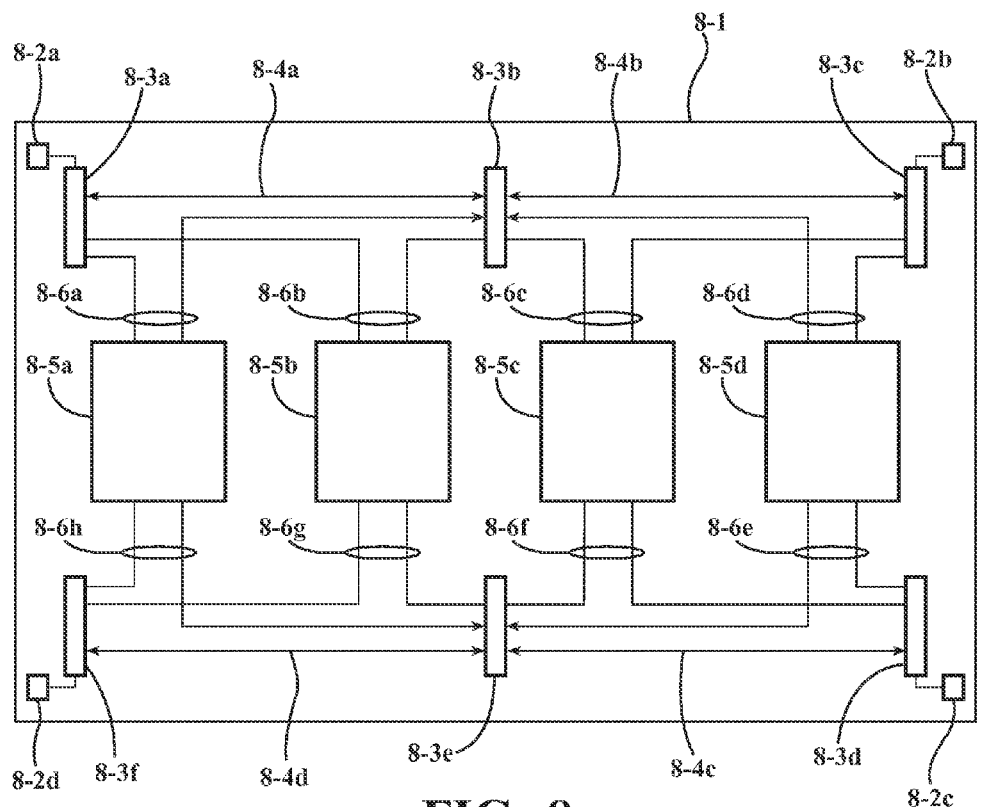
FIG. 8 is a top view of a CVI circuit layer.

FIG. 8 shows the top view of a CVI circuit layer 8-1. There are four CCEs 8-2*a* . . . 8-2*d*; CCE interconnections and CE control circuitry are not shown. There are six BCEs 8-3*a* . . . 8-3*f*. The BCEs are connected by bus interconnections 8-4*a* . . . 8-4*d*. There are four PCEs 8-5*a* . . . 8-5*d*. The BCEs are connected to PCEs by interconnections 8-6*a* . . . 8-6*h*. Each PCE has four bus ports connecting to four different BCEs. This connection density provides for higher yield CVI IC yield and higher bus bandwidth and circuit performance. A defective BCE or PCE could be disabled by the CCE network. The PCEs 8-5*a* . . . 8-5*d* may be logic or memory circuitry.

The BCEs of the circuit layer in FIG. 8 can be used to provide a maximum circuit communication bandwidth should none of them be defective, and as a communication resource that can provide sufficient intra-IC communication should one or even a plurality of BCEs prove to be defective. Each BCE can be disabled via a CCE and isolated from the other circuitry of the circuit layer 8-1, and in a preferable embodiment of a small area or circuit layer foot print, and the yield of each BCE is independent of the adjoining circuitry of the circuit layer. The various BCEs of the circuit layer are also connected in a vertical manner as shown in FIG. 7 with other BCEs. Each BCE and PCE 8-5*a* . . . 8-5*d* are preferably small in area and electrically isolatable via a CCE, and due to this reason will have higher individual yield probability distribution than the yield of the BCEs if taken as integrated dependent whole. In order to yield a CVI IC, any defective BCE or PCE must not be a single point of failure for the complete circuit layer resource the loss of any BCE or PCE preferably most not be indispensible.

Figure 9:
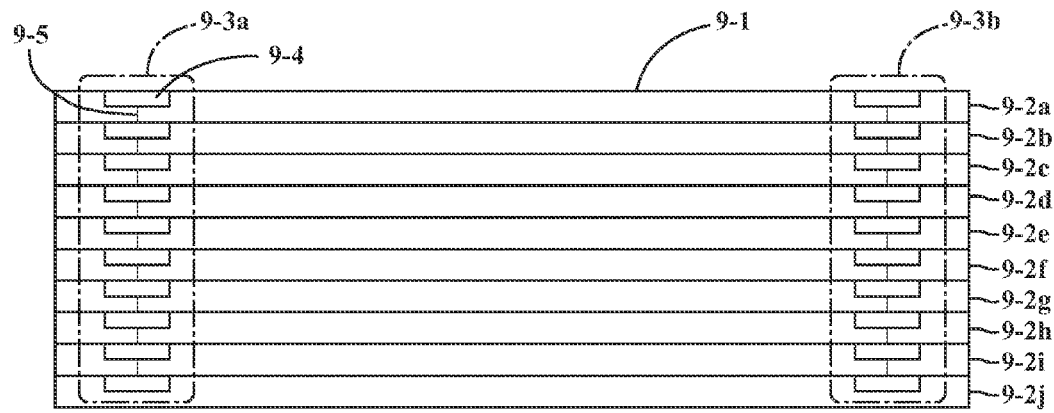
FIG. 9 is a cross-sectional view of a CVI IC showing BCE bus structure.
Figure 10:
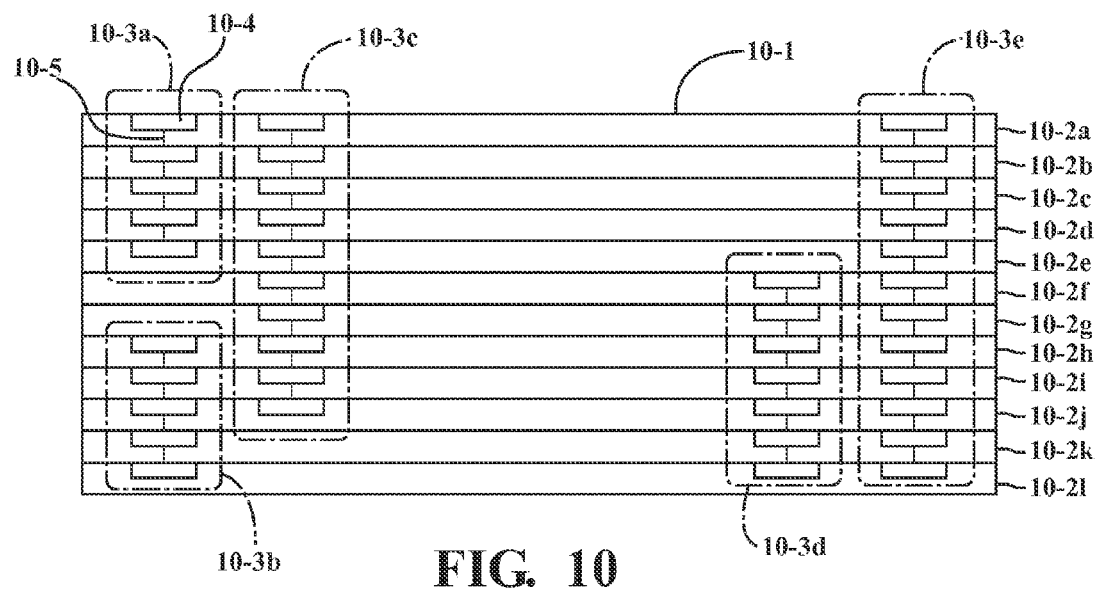
FIG. 10 is a cross-sectional view of a CVI IC showing BCE bus structure.

FIG. 9 and FIG. 10 are respectively cross-sections of CVI ICs 9-1 10-1 showing portions of several vertical bus structures. FIG. 9 shows CVI IC 9-1 comprising circuit layers 9-2*a* . . . 9-2*j* and two vertical BCE bus structures 9-3*a*, 9-3*b* each composed of BCEs connected with vertical interconnections such with BCE 9-4 & interconnections 9-5;

other CCE and PCE CEs are not shown. FIG. 10 shows CVI IC 10-1 comprising circuit layers 10-2a . . . 10-2l and five vertical BCE bus structures 10-3a . . . 10-3e each composed of BCEs connected by vertical interconnections such with BCE 10-4 & interconnections 10-5; other CCE and PCE CEs are not shown. Each bus structure is composed of some number isolatable BCEs and are not limited in placement. The BCE circuit design used may be one of many possible designs, however, the preferable BCE circuit embodiment is one that does not have a design wherein a single circuit defect will prevent the use of the BCE, but rather the BCE design has fault tolerant features or is configurable wherein the defect can be isolated and the BCE can be used with diminished resource capacity such as the loss of some number of interconnections.

Additionally, FIGS. 9 and 10 are intended to show that the BCE bus structures of the CVI invention are numerous and do not require significant circuit layer surface areas to be implemented. This is novel to the CVI invention in that using a plurality of vertical BCE structures, preferably more than two, increases both the communication or information transfer bandwidth performance of the CVI IC but also its potential yield.

FIG. 11 through FIG. 18 show BCE bus circuitry structures from minimal complexity to greater complexity. These BCEs are all vertically interconnected, have horizontal interconnections to other potential BCEs and PCEs per circuit layer, and include various yield enhancement techniques in addition to being enabled or disabled by a CCE.

Figure 11:
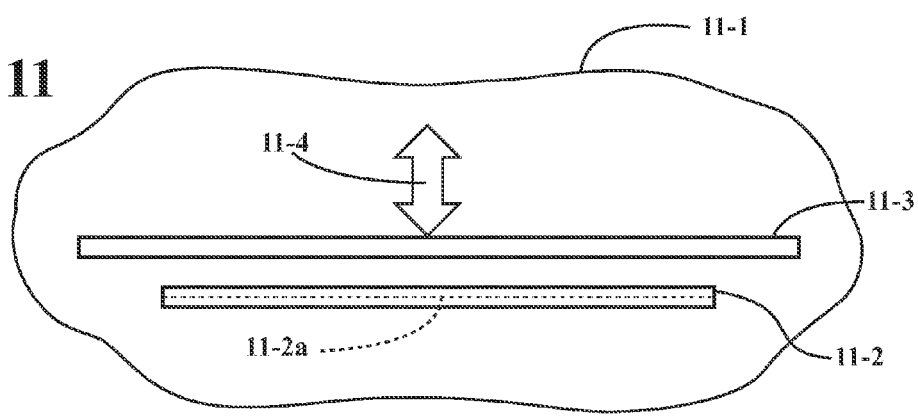
FIG. 11 is a top view of a BCE bus structure.

FIG. 11 shows a BCE 11-1 comprising bus circuitry 11-2 for control of both vertical through circuit layer busing interconnections [vertical bus transmission lines] 11-2a integral to the bus circuitry 11-2 and horizontal busing interconnections 11-4 [horizontal bus transmission lines], and provide such functions as transmission line arbitration or messaging control, buffering and or caching. The bus circuitry 11-2 may provide support for partitioning of the bus transmission lines, and the independent selection for use of said bus transmission line partitions as a means to provide parallel bus operations creating greater bandwidth by enabling parallel transmit of twice as many bus messages. The bus circuitry 11-2 is adjacent and integrated with CCE bus circuitry 11-3. Bus interconnections between 11-2 and 11-3 are not shown. The CCE bus circuitry is connected to a CCE preferably on the same circuit layer and may have a plurality of functions in addition to the function of enabling or disabling the operation of the BCE, such as task and sub-task BCE resource allocation, event broadcasting, BCE transmission performance monitoring. The BCE bus circuitry 11-2 may also provide Error Correction Code processing, bus protocol processing, bus data buffering, message queuing, message routing address lookup and bus use arbitration, but is not limited to these functions.

Figure 12:
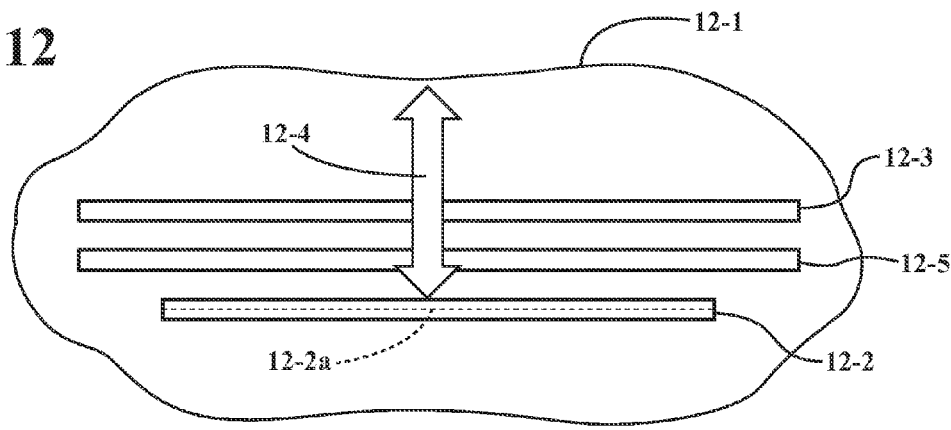
FIG. 12 is a top view of a BCE bus structure with transfer data processor.

FIG. 12 shows a layout view of BCE 12-1 comprising bus circuitry 12-2 for control of both vertical through circuit layer busing interconnections [vertical bus transmission lines] 12-2a integral to the bus circuitry 12-2 and horizontal busing interconnections [horizontal bus transmission lines] 12-4, and provide such functions as transmission line arbitration or message routing management control [wherein BSE logic comprises a table of addresses to enable the routing data [a message] to a destination one or more BSEs beyond the current BSE], buffering and or caching. The bus circuitry 12-2 may provide support for partitioning of the bus transmission lines and separate selection for parallel use of said bus transmission line partitions. The bus circuitry 12-2 is adjacent and integrated with CCE bus circuitry 12-3.

The CCE bus circuitry is connected to a CCE preferably on the same circuit layer and may have a plurality of functions in addition to the function of enabling or disabling the operation of the BCE, such as BSE load monitoring, task and sub-task ID and broadcast command reception, or data path allocation by task and sub-task. The BCE bus circuitry 12-2 may provide Error Correction Code processing, bus protocol processing, bus data buffering and queuing, message queuing, message routing address lookup and bus use arbitration, but is not limited to these functions. The optional BSE bus circuitry 12-5 is adjacent and integrated with CCE bus circuitry 12-3 and may provide such yield enhancement functions as defective byte or word reordering or substitution, bus line data shifting.

The BCE of FIG. 12 can be used to form a plurality of bus networks that operate separately of each other or are connected in a collective conventional manner. The communication architecture of a 3D IC can have a significant impact on the overall performance of the IC. The BCE of the CVI invention can vary greatly in bandwidth or transmission capacity and can operate at least as an arbitrated [dedicated or switched] continuous transmission line [point to point] bus or a message passing bus. The advantages of 3D integration do not require the high I/O drive power electronics necessary to achieve high performance between separated 2D ICs, this allows the CVI BCE to offer much higher circuit switching performance and much greater transmission capacity than current state-of-the-art external or off-chip bus architectures implemented with discrete packaged circuitry and PCB [Printed Circuit Board] interconnection methods.

Figure 13:
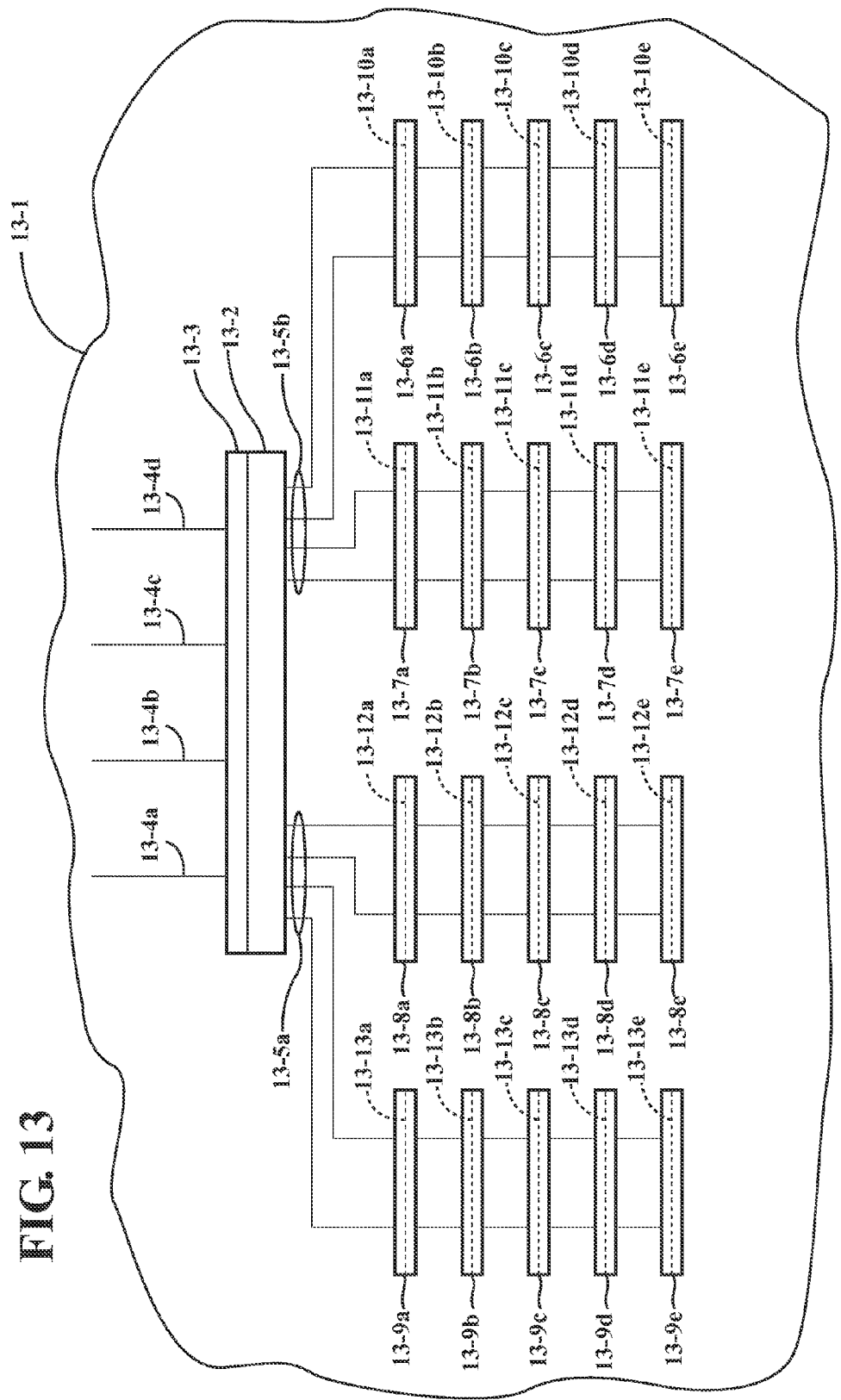
FIG. 13 is a top view of a multi-port BCE bus structure.

FIG. 13 shows a multi-port BCE 13-1 comprising bus control circuitry 13-2, vertical through circuit layer busing interconnections [vertical bus transmission lines passing perpendicular to the page] 13-10a . . . 13-13e comprising four bus banks each dual ported with interconnections 13-5a 13-5b and switch circuitry [bus channels] 13-6a . . . 13-9e, and four ported horizontal busing interconnections 13-4a . . . 13-4d [horizontal bus transmission lines or paths]. CCE bus circuitry 13-3 is connected to a CCE on the same circuit layer and enables or disables the circuitry of the BCE 13-1. The bus controller circuitry 13-2 provides such functions as transmission line arbitration or messaging control error correction codes, transmission line switching, and or caching, but it not limited to such functions. This BCE 13-1 could operate as a single channel up to a 20 channel bus or for example as four separate buses [13-4a/13-9a . . . 13-9e, 13-4b/13-8a . . . 13-8e, 13-4c/13-7a . . . 13-7e, 13-4d/13-96a . . . 13-6e]. The high degree of replicated bus structure 13-6 . . . 13-9 enables the CCE network to disable defective circuit portions without loss of significant BSE throughput.

The BCE 13-1 shown in FIG. 13 indicates a significant redundant or fault tolerant capability, a high bandwidth capacity and a small surface area or foot print as benefits of its implementation; the through circuit layer bus interconnections 13-10a . . . 13-13e are preferably sub-micron pitch and preferably sub-half micron pitch. The bus switch circuitry 13-6a . . . 13-9e preferably can be individually disabled by the bus controller circuitry 13-2 or CCE bus circuitry 13-3, this allows the BCE to continue to operate in a diminished capacity, and also is a fault tolerant capability of the CVI IC. The cost in circuit layer area is small for the addition of a bus channel with 256 or 512 or 1024 vertical transmission lines, and therefore, having a larger number of such BCE bus channels provides both to the fault tolerance and the performance of the BCE.

Figure 14:
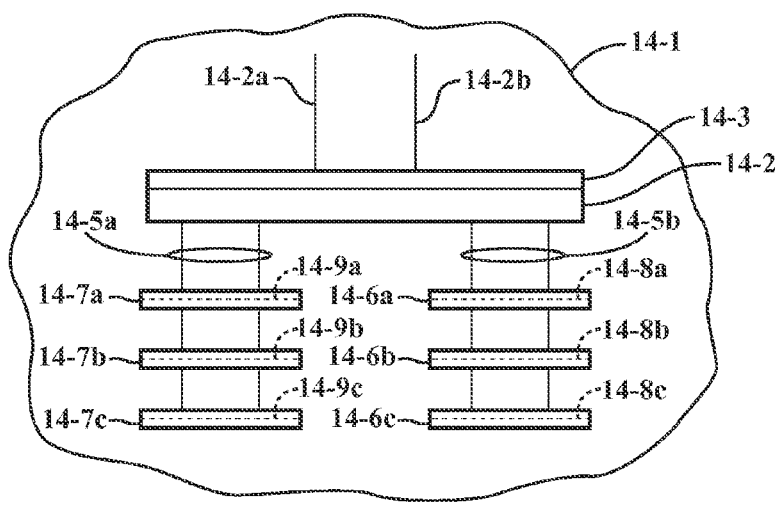
FIG. 14 is a top view of a multi-port BCE bus structure.

FIG. 14 shows a multi-port BCE 14-1 with bus control circuitry 14-2, vertical through circuit layer busing interconnections [vertical bus transmission lines] 14-8a . . . 14-9c comprising two banks each dual ported with interconnections 14-5a 14-5b and switch circuitry [bus channels] 14-6a . . . 14-7c, and two ported horizontal busing interconnections 14-2a 14-2b [horizontal bus transmission lines or paths]. CCE bus circuitry 14-3 is connected to a CCE on the circuit layer and enables or disables the circuitry of the BCE 14-1. The bus controller circuitry 14-2 provides such functions as transmission line arbitration or message routing control, self-test, error correction codes, bus protocol processing, transmission line switching, and or caching, but it is not limited to these functions.

The BCE 14-1 shown in FIG. 14 provides a significant redundant or fault tolerant capability, a high bandwidth capacity and a small surface area or foot print for its implementation; the through circuit layer bus interconnections are preferably sub-micron pitch and preferably sub-half micron pitch. The bus switch circuitry 14-6a . . . 14-7c preferably can be individually disabled by the bus controller circuitry 14-2 or CCE bus circuitry 14-3, this allows the BCE to continue to operate in a diminished capacity, and is one of the fault tolerant capabilities of the CVI IC. The cost in circuit layer area is small for the addition of a bus channel with 256, 512, 1024 or wider vertical transmission lines, and therefore, having a larger number of such BCE bus channels provides both to the fault tolerance and the performance of the BCE. Power to drive BCE signals from one circuit layer to the next circuit layer is only what is required for a drive length of less than 100 microns and preferably less than 10 microns.

If a single BCE of a vertical BCE bus structure like those shown in FIG. 9 and FIG. 10 is defective and has been disabled by the CCE of the circuit layer it is on, this may affect the use of the vertical busing interconnections for the other BCEs to which the defective BCE is connected. FIG. 15 shows vertical busing interconnection structure 15-1 that can be used to by-pass a defective BCE. This adds fault tolerant capability to the affected vertical BCE bus structure. FIG. 15 shows the vertical interconnection routing pattern for a single vertical interconnection for by-passing a disabled defective BCE wherever it may occur in the vertical BCE bus structure. The by-pass interconnection is position independent of the order of stacking placement of the circuit layers 15-2a . . . 15-2d with circuit device layers 15-8a . . . 15-8d. The vertical interconnection 15-3 is a continuous interconnection and should not be affected by a defective BCE if it is disabled. Interconnection 15-4 is a point-to-point bus interconnection and would be affected if the BCE circuitry 15-6 were defective. Should that defect occur, then interconnection 15-5 with drive logic 15-7 would replace interconnection 15-4 and be enabled to route around the disabled BCE 15-6, providing a point-to-point transfer from the BCE below the defective BCE 15-6 to the BCE above the defective BCE.

A single circuit layer with the BCE interconnection pattern for routing past a defective BCE is shown in FIG. 15a. The circuit layer 15a-1 comprises a transistor device layer 15a-2 with BCE circuit devices 15a-3a 15a-3b formed therein. Continuous bus interconnection 15a-4 passes completely through the circuit layer 15a-1. Point-to-point bus interconnection 15a-5 connects the BCE 15a-3a circuit devices to the underside of the BCE circuit devices in the above circuit layer and would be affected should the BCE circuit devices 15a-3a be defective and disabled. BCE bus interconnection 15a-6 provides an interconnection from the BCE in the circuit layer directly below to the 15a-5 interconnection and completing a transmission path by-passing the defective BCE 15a-3a. The interconnection 15a-7 would be used to by-pass a defective BCE that is in the circuit layer immediately above a BCE.

If two immediately adjacent BCEs of a vertical BCE bus structure like those shown in FIG. 9 and FIG. 10 are defective and have been disabled by the CCEs of the respective circuit layers they are on, this may affect the use of the vertical busing interconnections for the other BCEs to which these defective BCEs are connected. FIG. 16 shows vertical busing interconnection structure 16-1 with circuit layers 16-2a . . . 16-2d with circuit device layers 16-10a . . . 16-10d that can be used to by-pass two adjacent defective BCEs, this BCE by-pass enablement also comprises the enablement for by-pass of only one defective BCE as presented in the prior discussion regarding FIG. 15 and FIG. 15a. This adds fault tolerant capability to the affected vertical BCE bus structure 16-1. FIG. 16 shows the vertical interconnection routing pattern for vertical interconnections for by-passing two disabled BCEs where ever they may occur in the vertical BCE bus structure. The by-pass interconnections are position independent of the order of stacking placement of the circuit layers 16-2a . . . 16-2d. The vertical interconnection 16-3 is a continuous interconnection and should not be affected by two consecutive defective BCEs 16-6a 16-6b if both are disabled. Interconnection 16-4 is a point-to-point bus interconnection and would be affected if associated BCE circuitry 16-6a were defective and or disabled. Should such defects occur, then interconnection 16-7 would be enabled to route around the disabled BCEs 16-6a 16-6b providing a point-to-point transfer from the BCE below the defective BCEs 16-6a 16-6b to the BCE above the defective BCEs. This by-pass design is also applicable if only one BCE in the BCE 16-1 structure is defective and is disabled wherein interconnection 16-5 would by-pass defective and disabled BCE 16-6a.

A single circuit layer with the BCE interconnection pattern for routing past two defective BCEs is shown in FIG. 16a. The circuit layer 16a-1 comprises a transmission device layer 16a-2 with BCE circuitry 16a-3a 16a-3b 16a-3c formed therein. Continuous bus interconnection 16a-4 passes completely through the circuit layer 16a-1. Point-to-point bus interconnection 16a-5 connects the BCE circuit devices to the underside of the BCE circuit devices in the above circuit layer and would be affected should the BCE circuit devices 16a-3a be defective and disabled. BCE bus interconnection 16a-6 provides an interconnection from the BCE in the circuit layer directly below to the 16a-5 interconnection and completing a transmission path by-passing the defective BCE circuitry 16a-3a if only this BCE were defective. The interconnection 16a-8 would be used to by-pass two consecutive defective BCEs, the defective BCE circuitry 16a-3a and a defective BCE immediately below BCE circuitry 16a-3a. The interconnection 16a-8 provides an interconnection between the BCE two layers lower and the BCE immediately above BCE circuitry 16a-3a in the event of two consecutive defective BCEs, would be the valid underlying BCE interconnection instead of 16a-6. The interconnection 16a-9 provides an interconnection between the BCE one layer lower and the BCE two layers immediately above. The interconnection 16a-10 connects the BCE device circuitry 16a-3c to BCE three layers above by-passing the two immediate layers above the circuit layer 16a-1.

The number of circuit layers shown in the various figures presented herein does not suggestion any limitations on the number of circuit layers of a CVI IC, wherein such CVI stacked integrated circuits can comprise any number of circuit layers such as 10, 30, 50 or more circuit layers.

CVI BCE and Novel CVI Bus Structure Embodiments

A CVI vertical BCE bus structure consists primarily of CVI Bus Circuit Elements [BCEs] interconnected vertically to each other by a continuous plurality of busing interconnections [transmission paths] or vertically by a non-continuous point-to-point plurality of busing interconnections, the vertical connection path is composed of vertical wire segments that interconnect each BCE as shown in FIG. 15 and FIG. 16. A BCE may have horizontal interconnections to BCEs of other BCE bus structures and PCEs [Processing Circuit Elements]. A CVI bus structures can operate as a continuous or point-to-point information transfer means for implementing a plurality of data and or message transfer protocols. The BCE bus structures can be multi-channel and multi-ported with channel information or data-widths that can vary up to several thousand bits wide per transfer. The BCE device circuitry can also operate at very high switching speeds consistent with the potential transistor performance with which that BCE is implemented because said transistors drive transmission wire loads that are nominally less than 100 microns and preferably less than 10 microns versus 2D circuit requirements to drive transmission wire loads that are 10s of CM long and off-chip. The coupling of wide bus channel data widths and high BCE device circuit performance allows CVI IC information transfer rates to exceed $10^{12}$ bytes/s [terabytes/s].

The CVI IC invention allows for the novel implements other high performance bus structures. Cross-bar buses and common conductor buses are two examples.

Figure 17:
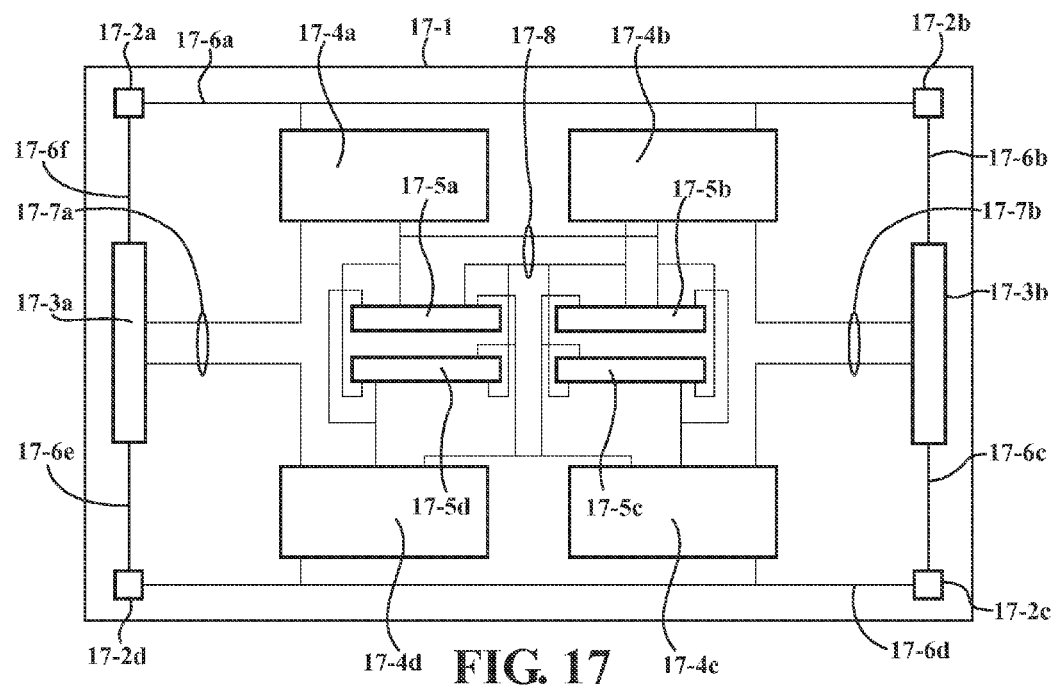
FIG. 17 is a top view of a CVI circuit layer with cross-bar BCE.
Figure 18:
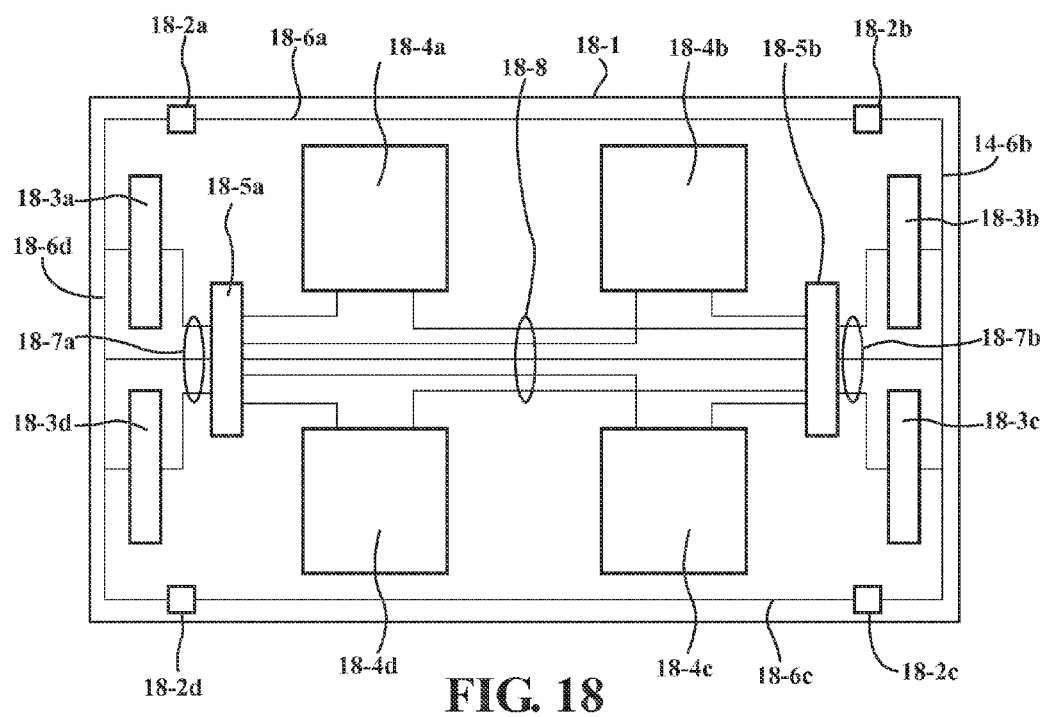
FIG. 18 is a top view of a CVI circuit layer with cross-bar BCE.

Bus cross-bars implemented as an assembly of a plurality of ICs and interconnected by a PCB [Printed Circuit Board] are in common use today. Such cross-bar buses at the system level of integration provide a means to an immediate and non-blocking connection among a plurality of processing units for example. Bus cross-bars implemented in this manner are planar and restricted in the number of interconnections making up the various row and column buses of the cross-bar; this means the cross-bar is limited in area to one PCB. Cross-bars can be implemented without this limitation as 3D structures in CVI IC in a plurality of possible implementations. FIG. 17 and FIG. 18 show potential equivalent cross-bar bus structures enabled by the CVI invention.

FIG. 17 shows a circuit layer 17-1 of a CVI IC. The circuit layer 17-1 comprises CCEs 17-2a . . . 17-2d BCEs 17-3a 17-3b, PCEs 17-4a . . . 17-4d, cross-bar BCEs 17-5a . . . 17-5d, CCE interconnections to CEs 17-6a . . . 17-6f, BCE bus interconnections 17-7a 17-7b, and cross-bar BCE interconnections 17-8. The cross-bar BCE interconnections show multiple BCE ports and PCE ports with each PCE connected to each other PCE of the circuit layer 17-1 through the cross-bar PCEs in a redundant or multiple path 17-8 manner. The PCEs of each additional CVI circuit layer are vertically interconnected to the PCEs 17-4a . . . 17-4d by the cross-bar BCEs and by providing a sufficient number of bus channels to the cross-bar BCEs a non-blocking transfer path for each PCE can be attempted with the addition of ever larger numbers of PCEs. This cross-bar BCE capacity structure for large numbers of PCEs may not be implementable with conventional PCB means and typically is fixed in the number of processing elements it can accommodate. The CVI cross-bar BCE does not have to be designed for a specific number of PCEs, but a maximum wherein the maximum is reached by the addition of PCEs through the addition of CVI circuit layers. The CVI BCE cross-bar is enabled by means of the high density sub-micron pitch vertical through circuit layer interconnections and integrated BCE control logic for bus channel allocation or CCE directed bus channel allocation and configuration. The cross-bar BCE also offers the unique advantage of local pooling of PCE information transfers at the CVI circuit layer. The variable cross-bar capacity is novel to the CVI invention, and only economically possible with the CVI high yield enhancement methods and means. Preferably all of the BCEs and PCEs of this circuit layer can be individually disabled by a CCE network if so desired without affecting the continued operation of the circuit layer. The PCEs 17-4a . . . 17-4d may be logic or memory circuitry.

The cross-bar BCEs are preferably BCE circuitry designed and used to provide a plurality of switched bus channels to a plurality of PCEs for a plurality of CVI circuit layers, preferably wherein there are an adequate number bus channels such that an information transfer between any two PCEs can occur simultaneously without a delay, also referred to as a non-blocking transfer. This non-blocking cross-bar like performance of the cross-bar BCEs 17-5a . . . 17-5d can be adjusted for greater transfer capacity by adding bus channels to each of the BCEs, this has the effect of providing more non-blocking information transfer bandwidth, and also provides for higher CVI IC yields by making the loss of one or more bus channels from one of the cross-bar BCEs less likely to lower the cross-bar BCEs minimum acceptable circuit performance [economic utility]. The distances between all PCEs and their communication network of BCEs can be measured in microns.

FIG. 18 shows another CVI BCE cross-bar structure. FIG. 18 shows a different placement of the busing structures. This placement is intended to show the design flexibility of the CVI cross-bar BCE in relationship [contrast] to all other current cross-bar bus structures.

FIG. 18 shows a circuit layer 18-1 of a CVI IC. The circuit layer 18-1 comprises CCEs 18-2a . . . 17-2d, BCEs 18-3a . . . 18-3d, PCEs 18-4a . . . 18-4d, cross-bar BCEs 18-5a 18-5b, CCE interconnections to CEs 18-6a . . . 18-6d, BCE bus interconnections 18-7a 18-7b, and cross-bar BCE interconnections 18-8. The cross-bar BCE interconnections show multiple BCE ports and PCE ports with each PCE connected to each other PCE of the circuit layer 18-1 through the cross-bar PCEs in a redundant or multiple path 18-8 manner. The PCEs of each additional CVI circuit layer are vertically interconnected to the PCEs 18-4a . . . 18-4d through the cross-bar BCEs 18-5a 18-5b and by providing a sufficient number of bus channels to the cross-bar BCEs such that a non-blocking transfer path for each PCE can be had with the addition of ever larger numbers of PCEs. Preferably, all of the BCEs and PCEs on this circuit layer 18-1 can be individually disabled by a CCE network, if so desired, without affecting the continued operation of the circuit layer. The PCEs 18-4a . . . 18-4d may be logic or memory circuitry.

The novel CVI cross-bar bus structures of FIG. 17 and FIG. 18 provide unique performance, bandwidth capacity and power dissipation advantages over current cross-bar circuitry. The CVI cross-bar bus structures can provide a greater density point-to-point or non-blocking interconnection data paths for processing and memory circuitry [PCEs] than is possible with the current state-of-the-art methods. This claim derives its support from the integration of the cross-bar bus elements with PCEs per circuit layer, the vertical interconnection density efficiency of the BCE allowing high numbers of bus channels, the ability to yield high densities of PCEs achieved by CVI 3D integration methods, and the very short transmission path lengths of the BCE cross-bars reduces the power requirement levels of the BCE cross-bar to that of high speed logic.

Figure 19:
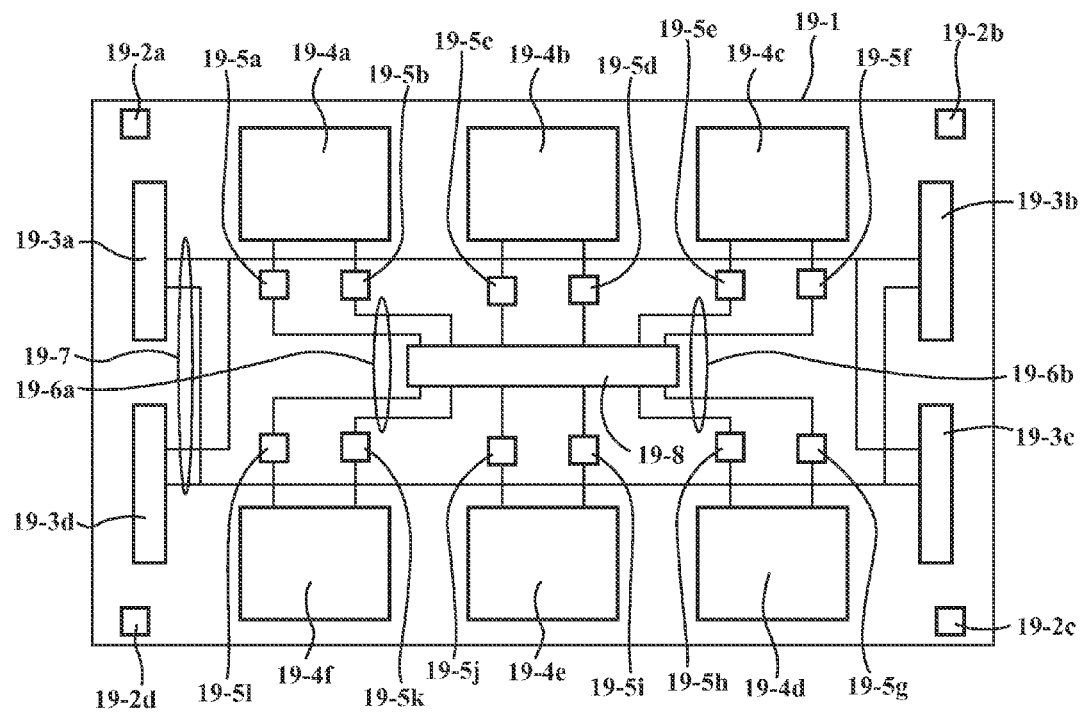
FIG. 19 is a top view of a CVI circuit layer with high frequency common vertical interconnection.

FIG. 19 shows a top view of a CVI circuit layer 19-1 comprising multiple high frequency serial electronic or optical transmission lines 19-6a 19-6b connected to a common vertical interconnect transmission or waveguide means 19-8. This novel aspect of the CVI invention implements point-to-point high speed information transmission over a common vertical interconnection means or waveguide. High frequency electronic or optical transmissions are sent from one PCE to another PCE wherein each transmission is at a different frequency or at a specific [filtered] transmission frequency allowing a plurality of PCE to PCE transmissions to occur simultaneously over a common connection 19-8. One or a plurality of high frequency dependent serial transmission interconnections connect each of a plurality of PCEs by connecting first to a vertical waveguide or interconnection 19-8 connecting some number of circuit layers and serving as a common connection with each PCE sending and receiving pair using a select discrete transmission frequency. The selection of transmission frequency per PCE pair may be dynamic or proscribed by a lookup table, potentially the making of said lookup table is derived and dependent on the CCE network generated configuration database. This method and apparatus of information transfer within the CVI IC is similar in effect to a cross-bar bus structure, but requires less bus circuitry to implement and has the potential to be architecturally simpler than the CVI cross-bars presented in FIG. 17 and FIG. 18, but the transmission per frequency is serial information transmission versus the BCE cross-bars presented in FIG. 17 and FIG. 18 which preferably have wide transmission widths allowing more information to be transferred in parallel per BCE clocking cycle. Further, multiple transmission frequencies could be used in a single PCE to PCE transmission, for example if 8 transceivers were used for information transmission, then the transmission time would be reduced by a factor of 8 times versus the transmission of a information by only one transceiver.

The CVI circuit layer 19-1 in FIG. 19 comprises CCEs 19-2a . . . 19-2d, BCEs 19-3a . . . 19-3d, PCEs 19-4a . . . 19-4f, high frequency filtered serial transceivers 19-5a . . . 19-5l, high frequency serial transmission lines 19-6a 19-6b, BCE interconnections 19-7, and vertical common high frequency interconnection 19-8. Preferably all of the BCEs and PCEs of this circuit layer can be individually disabled by a CCE network if so desired without affecting the continued operation of the circuit layer or the CVI IC it is a part.

Figure 20:
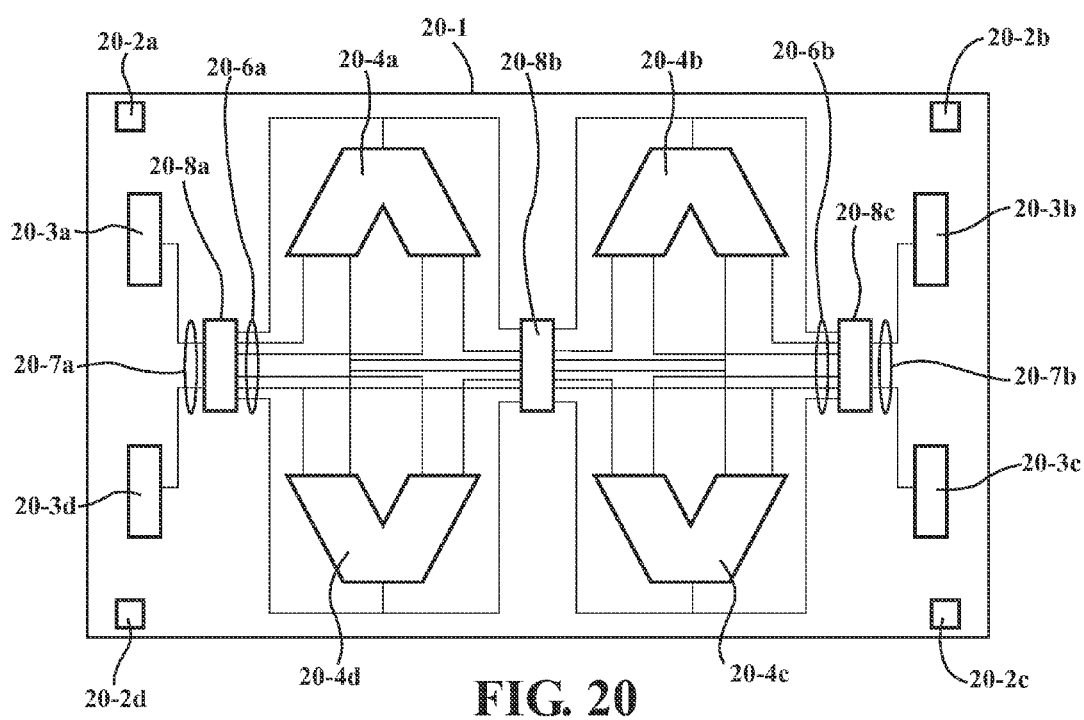
FIG. 20 is a top view of a CVI circuit layer with cross-bar BCE with arithmetic PCEs.
Figure 21:
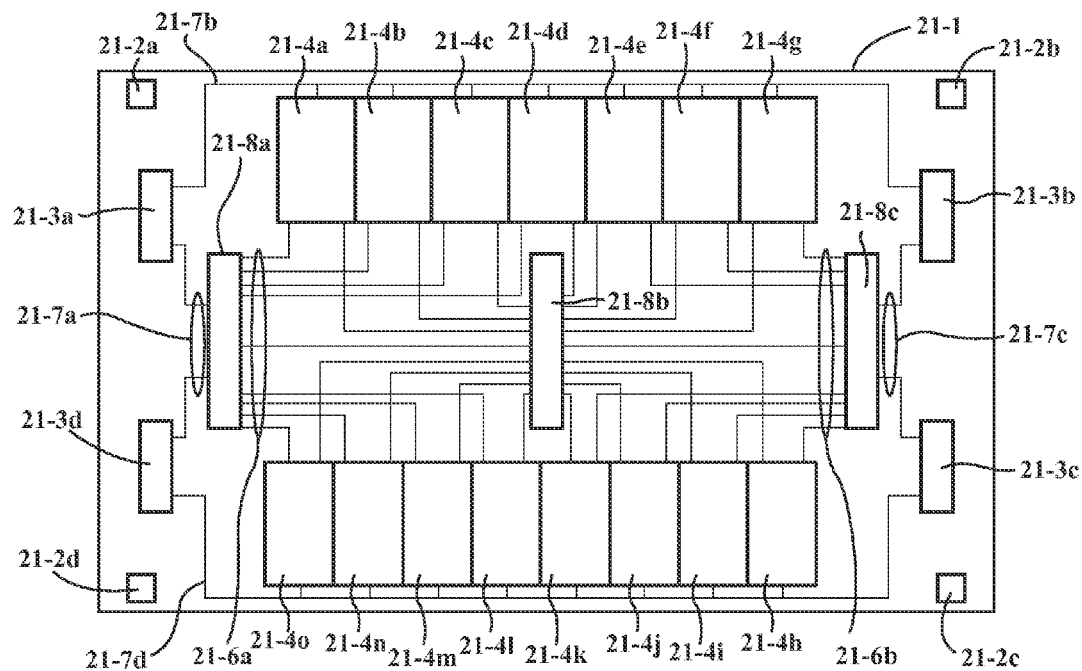
FIG. 21 is a top view of a CVI circuit layer with cross-bar BCE with register file, process threads or ISP PCEs.

FIG. 20 shows a top view of a CVI circuit layer 20-1 comprising a distributed cross-bar bus structure 20-8a 20-8b 20-8c. The PCEs 20-4a . . . 20-4d are arithmetic or numerical processing circuits providing such functions as multiply, add and divide. A plurality of layers 20-1 can be used to form a dense stacked [vertical] array of such circuits for applications that require large amounts of data to be processed in a proscribed sequence of arithmetic operations. FIG. 21 shows a top view of a CVI circuit layer 21-1 intended to be stacked with the circuit layer[s] 20-1, wherein the size of and the placement of the vertical BCE interconnections align from circuit layer to circuit layer. The circuit layer 21-1 may comprise PCEs that are ISPs, FPGAs, register files or process context memory relating to processor threads. This separation of the basic or traditional microprocessor elements [ISP, register files, arithmetic units] lends the smaller PCEs to have higher potential yield and at the same time allows what would normally be circuit functions with access restricted through the architecture of a single microprocessor to be shared on an unlimited as needed basis. This flexibility of PCE utilization due to the breakup of the traditional microprocessor architecture into multiple CEs is unique to the CVI invention, allows for higher CE utilization by allowing circuitry whose access would otherwise by restricted to the internal use of one microprocessor to be available to any ISP, FPGA, DFC [Data Flow Controller, refer to FIG. 25] or processor control circuitry, high circuit utilization yields, and the implementation of software programs [algorithms] that more closely reflect their operational and data flow structures, and therefore, result in more timely execution performance. The implementation of said proscribed sequences of algorithmic arithmetic operations can be further enhanced by using CCE network services to configure the cross-bar bus channels to direct the flow of data between PCEs consistent with the data processing required.

The CVI circuit layer 20-1 in FIG. 20 comprises CCEs 20-2a . . . 20-2d, BCEs 20-3a . . . 20-3d, PCEs 20-4a . . . 20-4d cross-bar BCE transmission lines 20-6a 20-6b, BCE to BCE interconnections 20-7a 20-7b, and cross-bar BCEs 20-8a . . . 20-8c. Preferably all of the BCEs and PCEs of this circuit layer can be individually disabled by a CCE network if so desired without affecting the continued operation of the circuit layer and CVI IC it is a part.

The CVI circuit layer 21-1 in FIG. 21 comprises CCEs 21-2a . . . 21-2d, BCEs 21-3a . . . 21-3d, PCEs 21-4a . . . 21-4o, cross-bar BCE transmission lines 21-6a 21-6b, BCE to BCE interconnections 20-7a 21-7b, and cross-bar BCEs 21-8a . . . 21-8c. Preferably all of the BCEs and PCEs of this circuit layer can be individually disabled by a CCE network if so desired without affecting the continued operation of the circuit layer and CVI IC it is a part.

Figure 22:
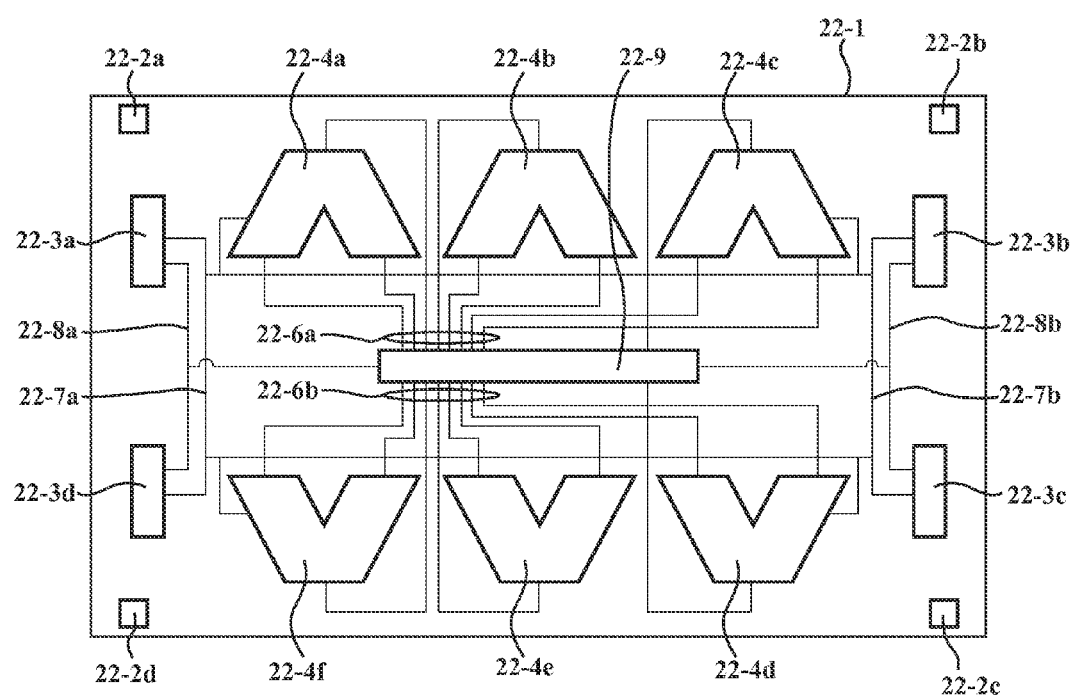
FIG. 22 is a top view of a CVI circuit layer with high frequency common vertical interconnection.
Figure 23:
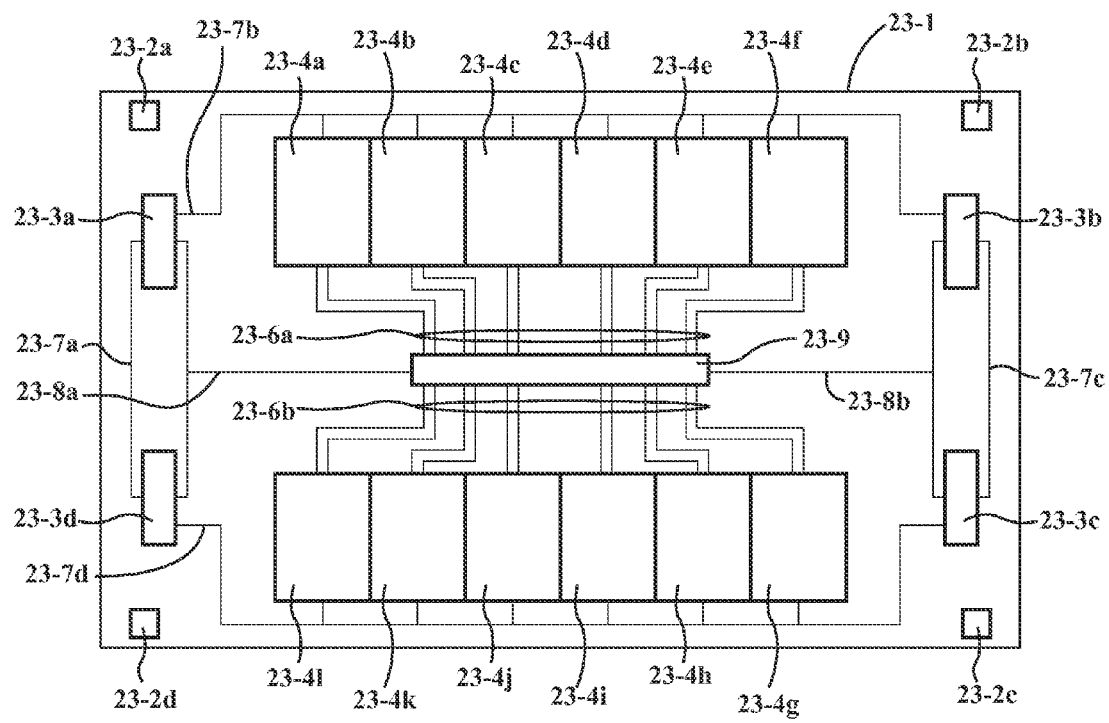
FIG. 23 is a top view of a CVI circuit layer with high frequency common vertical interconnection.

FIG. 22 shows a top view of a CVI circuit layer 22-1 comprising transmission frequency dependent interconnections 22-6a 22-6b and common vertical electronic or optical interconnection or waveguide 22-9. The PCEs 22-4a . . . 22-4f are arithmetic or numerical processing circuits providing such functions as multiply, add and divide. A plurality of layers 22-1 can be used to form a dense array of such circuits for applications that require large amounts of data to be processed in a proscribed sequence of arithmetic operations. FIG. 23 shows a top view of a CVI circuit layer[s] 23-1 intended to be stacked with the circuit layer[s] 22-1, wherein the size of and the placement of the common vertical interconnection 22-9 23-9 and the BCEs 22-3a . . . 22-3d 23-3a . . . 23-3d align for each circuit layer. The circuit layer 23-1 may comprise PCEs that are ISPs, FPGAs, DFCs [Data Flow Controller, refer to FIG. 25], register files or process context memory relating to processor threads. This separation of the basic or traditional microprocessor elements lends the smaller PCEs to have higher potential yields and at the same time allows what would normally be circuit functions with access restricted to the architecture of a single microprocessor to be shared on an unlimited as needed basis. This flexibility of PCE utilization due to the breakup of the traditional microprocessor architecture into multiple CEs is unique to the CVI invention, allows for higher CE utilization, and the implementation of software programs [algorithms] that more closely reflect their operational and data flow structures, and therefore, result in more timely execution performance. The implementation of said proscribed sequences of algorithmic arithmetic operations can be further enhanced by using CCE network services to configure the cross-bar bus channels to direct the flow of data between PCEs consistent with the data processing required.

The CVI circuit layer 22-1 in FIG. 22 comprises CCEs 22-2*a* . . . 22-2*d*, BCEs 22-3*a* . . . 22-3*d*, PCEs 22-4*a* . . . 22-4*f* with integrated high frequency filtered serial transceivers, high frequency serial transmission lines 22-6*a* 22-6*b*, BCE interconnections 22-7*a* 22-7*b*, BCE high frequency serial transmission lines 22-8*a* 22-8*b*, and vertical common high frequency interconnection 22-9. Preferably all of the BCEs and PCEs of this circuit layer can be individually disabled by a CCE network if so desired without affecting the continued operation of the circuit layer and CVI IC it is a part.

The CVI circuit layer 23-1 in FIG. 23 comprises CCEs 23-2*a* . . . 23-2*d*, BCEs 23-3*a* . . . 23-3*d*, PCEs 23-4*a* . . . 23-4*l* with integrated high frequency filtered serial transceivers, high frequency serial transmission lines 23-6*a* 23-6*b*, BCE interconnections 23-7*a* . . . 23-7*d*, BCE high frequency serial transmission lines 23-8*a* 23-8*b*, and vertical common high frequency interconnection 23-9. FIG. 23 shows an example of the use of a high frequency common vertical interconnect in combination with conventional BCE interconnect and the potential advantages for simplifying inter layer interconnections. Preferably all of the BCEs and PCEs of this circuit layer can be individually disabled by a CCE network if so desired without affecting the continued operation of the circuit layer and CVI IC it is a part.

Figure 24:
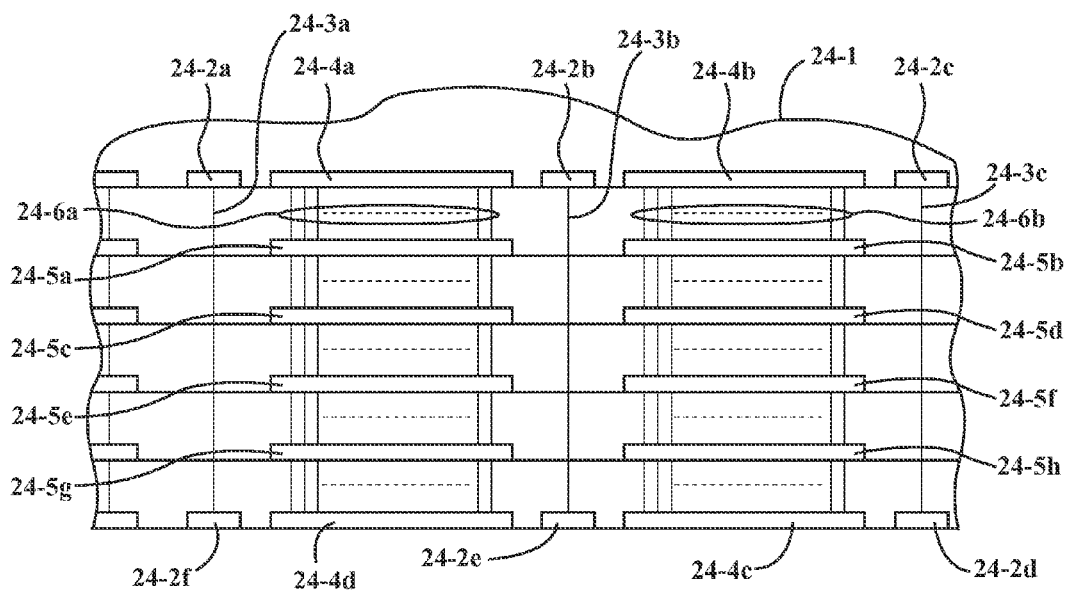
FIG. 24 is a cross-sectional view of a CVI IC of two vertical BCE bus structures through multiple CVI circuit layers, the vertical interconnections are intentionally elongated for viewing emphasis.

A portion of a CVI IC 24-1 is shown in cross-section in FIG. 24 with BCE structure 24-4*a* 24-5*a* 24-5*c* 24-5*e* 24-5*g* 24-4*d* with bus interconnections 24-6*a* and BCE structure 24-4*b* 24-5*b* 24-5*d* 24-5*f* 24-5*h* 24-4*c* with bus interconnections 24-6*b*. The bus interconnections are shown with exaggerated length for the purpose of showing their placement. FIG. 24 shows examples of vertical BCE inter layer circuit structures. CCE circuits 24-2*a* 24-2*f* with interconnection by 24-3*a*, CCE circuits 24-2*b* 24-2*e* with interconnection by 24-3*b*, and CCE circuits 24-2*c* 24-2*d* with interconnection by 24-3*c* are shown with no CCE circuits on the intervening circuit layers. In this circuit structure the intervening circuit layers without CCE circuits may be made from a high yield circuit process wherein comprising no CCEs or use a circuit design with its own defect recovery means such as a memory stack of DRAM or FLASH circuitry. The BSE circuits on the intervening circuit layers may still be controlled by the available CCEs by using the BSEs. The plurality of separate BSE vertical structures increases circuit yield probability.

Fault Tolerant and High Availability System Embodiments

CVI ICs can form Fault Tolerant and High Availability ICs. For the purpose of this discussion, Fault Tolerant circuits are those circuits that can have one or more unrecoverable circuit failures or defects in its circuitry that are the result of its manufacture or that may develop over the useful life of the circuit which can preferably be electronically isolated in a manner that said defects have no affect on the accuracy of the integrated circuits continued operation or its economic utility. For the purpose of this discussion, High Availability circuits are circuits with the attributes of Fault Tolerant circuits, but in addition comprise the ability to detect an unrecoverable circuit failure during its normal operation, correct for the circuit failure and continue operation in a transparent manner to the task or process it was performing.

FPGA and memory circuit structures often lend themselves to inherent, or designed in or natural fault tolerant facilities. This is the case because these circuit structures have an integral fine grain repeated circuit pattern, therefore, a circuit defect in this type of circuit when circumvented may represent a small percentage loss to the total circuit. The use of FPGA circuitry in the design of the logic incorporated in the CVI CEs [CCEs, BCEs & PCEs] wherein there is a plurality of FPGA gates in a CE that are not utilized and available to be used as replacement gates in the event of the occurrence of a defective programmed FPGA gate in the CE through a change to the FPGA programming configuration information. The use of FPGA circuitry to implement CVI CEs has the potential to increase the circuit yields of the CEs. The programming of the FPGA circuitry of CEs can be performed during the manufacture of the CVI IC or during the useful life of the CVI IC.

CVI Dataflow Processing Embodiment

One embodiment of the CVI invention is the Dataflow Controller [DFC]. DFCs are PCE circuits that direct the flow of data or operands by sending operand information to one or more PCE data processing circuits or function units also commonly known as ALUs [Arithmetic processing Unit], FPU's [Floating-Point Processing Unit], BCD [Binary Coded Decimal], GPUs [Graphical Processing Unit]. There can be numerous types of mathematical, graphical, engineering, chemical, etc. specialized function units and none of which are implied to be limited from use herein by their omission. The DFC processes a table or sequence of operand addresses with the purpose of moving data or information that is to be processed by one or a plurality of function units in a dynamic manner with the objective of maximizing the available function unit and memory resources. The DFC can be simple in design and not require instruction decode circuitry as is the case with an ISP, a preferred implementation of the DFC is a simpler and smaller circuit than an ISP circuit, requiring less physical circuit layer area to implement, and therefore, having a high probability of yielding as a circuit portion of a CVI IC layer.

A partial list of the advantages the DFC offers is:
 [1] A generalized data flow control circuit with the capability equivalent to dedicated or fixed purpose hardware circuits such as database search, graphics processor, numerical array processors, Fault Tolerant and High Availability computing systems;
 [2] Dynamic BCE data path allocation;
 [3] Dynamic allocation of BCE and PCE circuitry for static or transparent circuit error detection and retry;
 [4] Implicit & explicit parallel operation of BCE and PCE circuits;
 [5] Parallel processing of multiple programming sequences with transparent unwinding of context results by task or sub-task;
 [6] Check point exception processing; and.
 [7] Recursive processing.
 [8] BSE data path restricted or reserved usage by task and sub-task.

Figure 25:
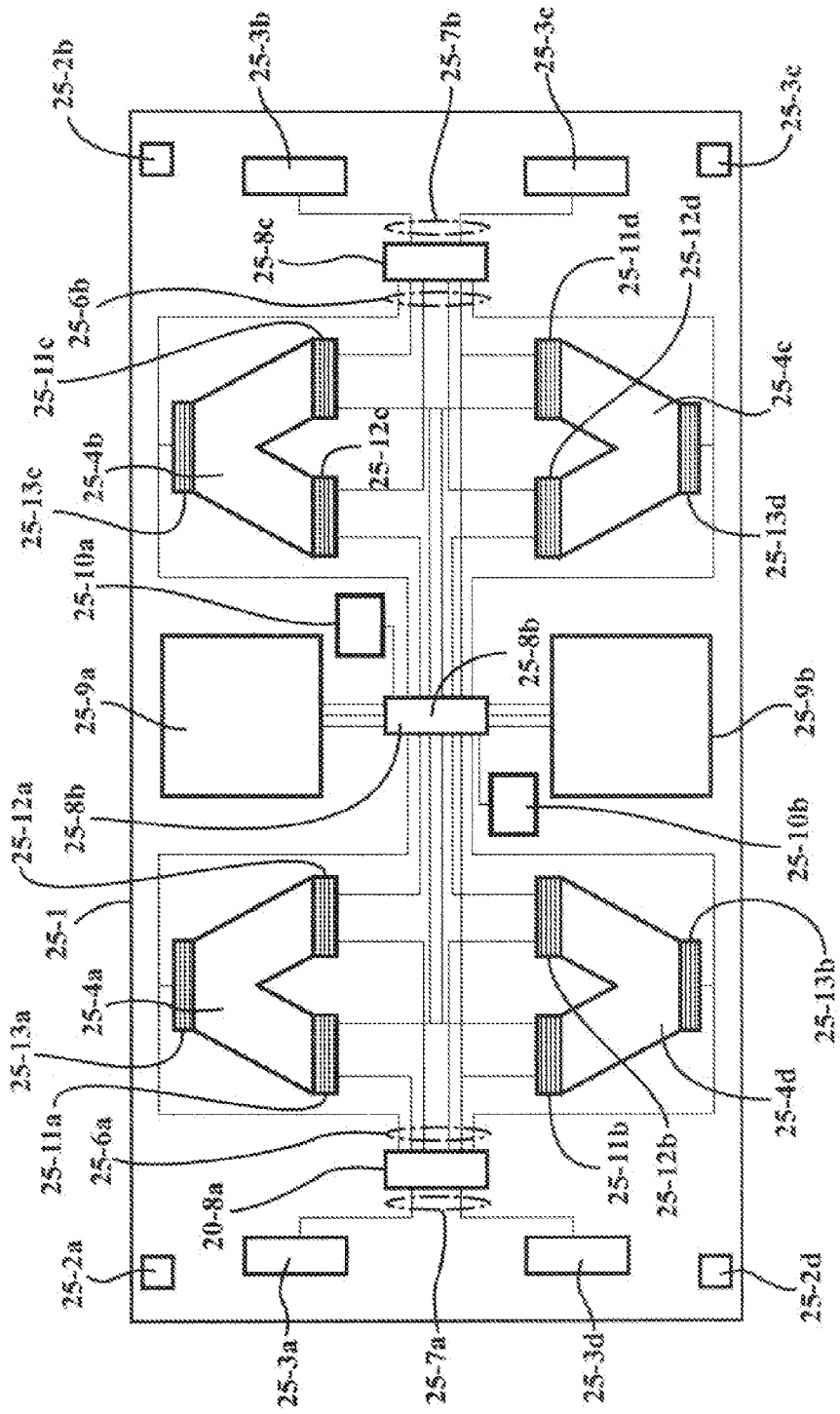
FIG. 25 is a top view of a CVI circuit layer including DFC circuitry.

The Dataflow Controller shown in FIG. 25 is a PCE circuit that reads operational information or descriptors from a Dataflow Controller Table [DFCT], an illustrative example of a DFCT is shown in FIG. 26, and writes or transfers operand values or addresses to the input and output ports of the various PCE functional units of a CVI IC. The DFC executes descriptors that change the process sequencing of descriptors directly or conditionally depending on the result condition of a function unit operation. The DFC may calculate operand addresses. DFC processing operation or execution is initiated by the transfer to one of the DFC's input ports of the initiation information shown in FIG. 27*a*. Operation of a DFC is preferably initiated from ISP, FPGA circuitry or another DFC. A DFC may be implemented to be able to process a plurality of DFCTs at one time by writing additional DFCT initiation information to a DFC input port. The DFC internally maintains the various DFCT initiation information inputs in a table that may resemble the table shown in FIG. 27*b*. A DFC circuit is preferably controlled by a CCE network and can be disabled if defective or by election.

The DFC may use real or a plurality paged virtual memory spaces per process or task. A preferred implementation of a DFC is in combination with a plurality of multi-ported cache memories, an example of a cache memory for use with a DFC is shown in FIG. 31 which is not only has associative process by address but also associative process by task or sub-task IOD. Paged virtual memory spaces may be used on a per task or sub-task DFCT initiation. The DFC may use a number of addressing modes such as direct, indirect or stacked address referencing, no addressing modes are limited herein by their omission.

Figures 28A, 28B, 29A:
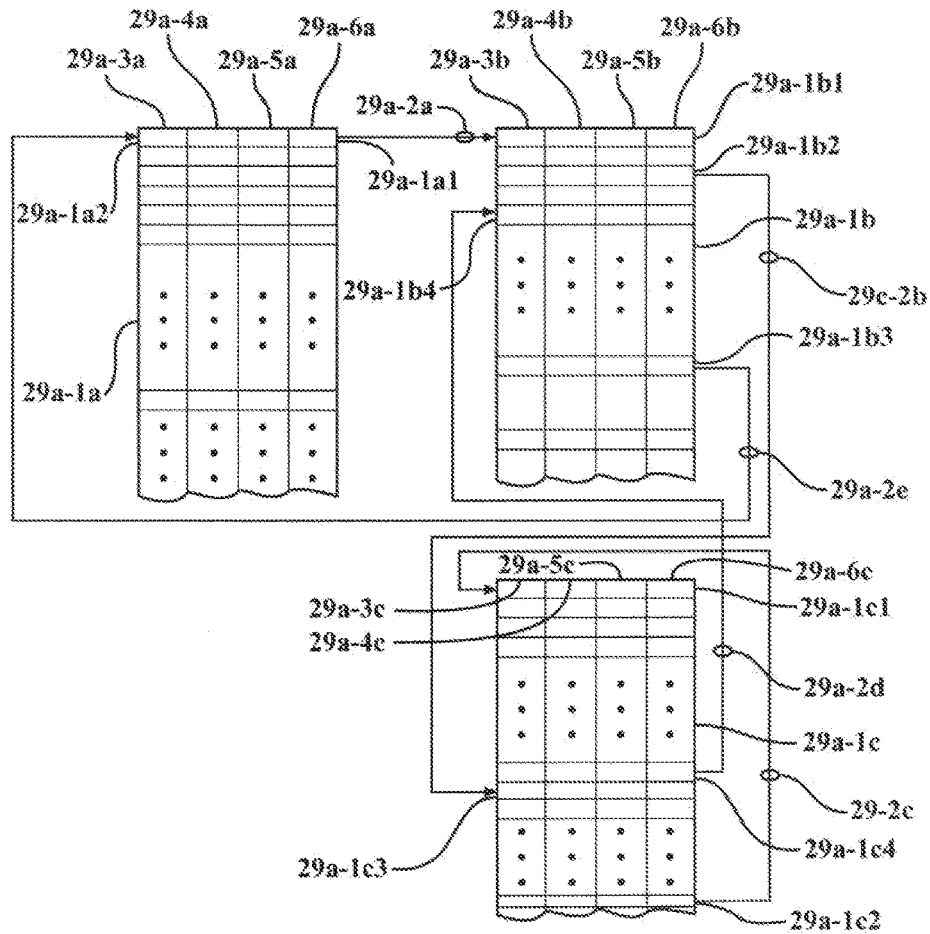
FIG. 28a is the layout of Data Flow Controller Table descriptor.
FIG. 28b is the layout of an extended Data Flow Controller Table descriptor.
FIG. 29a is a pictorial of Data Flow Controller Table branch descriptors processing flow.

There can be a plurality of DFC circuits in a CVI IC or a CVI circuit layer. A DFC circuit can be implemented to operate on a plurality of DFCT descriptors simultaneously [i.e. in parallel]. DFCT descriptors have two primary generic types: [1] descriptors for operand processing; and [2] descriptors for DFCT processing. DFCT Descriptors can take a number of different design forms to organize the information they contain. FIGS. 28*a* and 28*b* show two possible DFCT descriptors versions. The DFCT descriptor version shown in FIG. 28*a* has four principal fields: Command & Context, Operand$_1$, Operand$_2$ and Results. The DFCT descriptor version shown in FIG. 28*b* is an extended form of the DFCT descriptor shown in FIG. 28*a* and has seven principal fields: Command & Context, Operand$_1$, Operand$_2$, Result$_1$, Operand$_1$, Operand$_4$ and Result$_2$. The DFCT descriptor shown in FIG. 28*b* is intended to accommodate function units that require more than the conventional triplet of two inputs and one output. The DFCT descriptor that specifies operand processing provides inputs to a function unit and designates where the processed result is to be sent or stored. The DFCT descriptor that specifies DFCT processing provides directives or commands to be performed by the DFC. The DFCT descriptor that provides commands for the processing of a DFCT by the DFC are specific to the sequence flow of the processing of DFCT descriptors and modification of DFCT descriptors. The DFC may be implemented to issue a plurality of simultaneous function unit requests that are performed in parallel with DFC processing. A design objective of the DFC is to enable the DFC to issue a plurality of processing orders in parallel. In support of the function unit bandwidth, a DFCT descriptor may issue a request to reserve or dedicate one or more BSE interconnection segments or data paths to facilitate the transfer of function unit results to other function units.

The processing or execution of a DFCT descriptor by a DFC causes input operands and output result address to be written to the function unit specified by the DFCT descriptor. The operands are identified by a task and sub-task or process IDs and optionally the operands data type, such as integer, floating point, BCD, etc. The input operand may be the actual value to be operated upon by the function unit, the address of the said value, an indirect address or address to the actual address of said value, the stack address of the said value, stack address to an indirect address or address to the actual address of said value. The output operand value is an address or device address for the actual function unit result to be written. In the circumstance wherein the input operand types do not match, the DFC will convert as necessary those operand values to a common operand type acceptable to the function unit. The function units may have a single operand [input] and result [output] buffers or operand [input] and result [output] queues that comprise memory for a plurality of operands and results. An example of a perspective function unit input queue is shown in FIG. 30*a*, and an example of a perspective function unit output queue is shown in FIG. 30*b*.

A typical DFCT is shown in depicted in FIG. 26 with four information fields: Command & Context, Operand$_1$, Operand$_2$ and Result. The fields of the DFCT may accommodate more or less operand and result fields. The Command & Context field contains command information such as the type of operation to be performed on the operand[s], e.g. addition, subtraction, square root, division, etc, and Context information such as sub task ID; operand type such as integer, floating point, BCD [Binary Coded Decimal], etc. The function unit may require one or a plurality of operands and may result in none, one or plurality of result operands. The most common function unit requires a triplet of operands, two input operands [Operand$_1$ & Operand$_2$] and one output operand [Result$_1$] as shown in FIG. 26.

The DFC provides for exception conditions that arise from its own operation or the operation of a function unit to which it has transmitted operand information. Examples of DFC exceptions are branch errors, operand addressing errors or addressing errors of function unit. Examples of function unit exceptions are numerical overflow or underflow or divide by zero. Alternately, the DFC and all function units have a communication path to the CCE network. The CCE network may also perform BCE and PCE exception handling such as address error, arithmetic error, or instruction sequencing error. Further, the CCE network could also provide other system management requests such as BSE or BSE path allocation to a task and sub-task per unit of time or to a release event, or message broad casting to a specific BSE or PCE group or all such CEs.

The DFC reads and operates on the descriptors of a DFCT in sequential order. When the last entry of a DFCT is processed, the DFC operation terminates. The DFCT may contain branch descriptors that change the next in order descriptor that is to be processed by the DFC. This is called a branch descriptor command and explicitly directs DFC to the next DFCT descriptor entry to be processed or conditionally directs the DFC to the next in order DFCT descriptor entry to be processed.

A partial list of branch descriptor types are:
1. Branch within DFCT+/−n DFCT descriptors.
2. Branch within DFCT on condition +/−DFCT descriptors
3. Branch to alternate [continue] DFCT [use of continue option starts parallel DFCT processing, otherwise first DFCT processing waits]
4. Branch to alternate [continue] recursive DFCT [use of continue option starts parallel DFCT processing, otherwise first DFCT processing waits]

The conditional branch descriptor uses the condition state that characterized the result of a specific function unit and task and sub-task ID. Examples of such result condition states are numerical greater than, equal to or less than, overflow or underflow. The condition state information may be obtained by request made by the DFC or as part of information returned by the function unit to the DFC indicating completion of a specific processing request and identified by task and sub-task ID. Alternatively, the DFC may request that the function unit return the branch result or the next in order descriptor in the DFCT the DFC should process; this further improves DFC processing time. The DFC may optionally request that it be notified of the completion, an acknowledgement, of a specific processing request made to a specific function unit. The acknowledgement that a specific function unit processing request has completed also enables the DFC to perform semaphore processing, wherein the processing of a DFCT descriptor cannot begin until the completion of the processing of one or a plurality DFCT descriptors. A plurality of DFC circuits may also transmit processing event information to each other as a means to synchronize the respective sequence processing, condition branch processing or semaphore processing of a DFCT by a DFC.

A partial list of addressing types an operand of a DFCT descriptor may use are:
1. Direct virtual and real address reference.
2. Indirect virtual and real addressing reference.
3. Register file virtual and real address reference.
4. Displacement from base value virtual and real address and indirect address reference.

An example of the processing of an operand descriptor by a DFC is:
[1] Read next in order DFCT operand descriptor.
[2] Fetch operand values if required.
[3] Transmit operands to the input and output ports or the input and output queues of the function unit designated by the operand descriptor.
[4] Suspend next in order DFCT operand descriptor until processing until function unit completion acknowledgement; or immediately process next in order DFCT operand descriptor if specified; or if last DFCT operand descriptor processed, terminate DFCT processing.

An example of the processing of a branch operand descriptor by a DFC is:
[1] Read next in order DFCT from operand descriptor.
[2] Compare branch condition with function unit process result condition.
[3] If conditions match, read next in order operand descriptor as determined from the operand of the current operand descriptor; or continue with the read of next in order operand descriptor from the DFCT.

The function unit circuit may optionally incorporate input information queue circuits and output information queue circuits. These information queue circuits are comprised of logic and memory, the memory is organized as a number of input operand directive entries. The input queue circuit serves a number of operations that can be performed in parallel with the operation of the function unit. It consists of a logic control and memory, wherein memory may utilize both RAM and CAM Content Addressable Memory]. The actual physical structure of the input queue memory will be circuit design implementation dependent, but for the purposes of the description herein, the input queue memory is shown in FIG. 30*a* as a list or array of input operand directives. The input information queue circuit queues operand directives it receives from a DFC, ISP or FPGA circuit or other such data processing circuit. The input queue logic circuit verifies that all the operands required as input for a requested process step with a specific task and sub-task ID are available and ready to be input to the function unit. The Input queue may perform address calculations, operand[s] fetch or other input related functions in parallel with the operation of the function unit. The input queue may perform a vector processing like function such as for some number of operands, an indexed address calculation and operand fetch. The task and sub-task ID of the input queue circuit is stored in a CAM [Content Associative Memory] of the input, this allows the various input queue circuits of a function unit to verify that all required operands for a specific task or sub-task ID are present and ready for input to the function unit. The input information queued also provides the means to unwind or purge or remove the input operand directives associated with a specific task and sub-task ID. The input queue circuit processes an input directive to purge all entries of a specific task and sub-task ID. The input queue logic uses the CAM circuitry to find the task and sub-task ID entries and purge them from input queue[s]. The input information queue also provides Fault Tolerant or High Availability processing support. In the event that a processing fault is detected with respect to a certain task and sub-task ID, an input operand directive to the input queue circuit can request the purge or removal of all the operand directive entries for a specific task and sub-task ID in the input queue CAM circuitry. The directives to purge a task and sub-task ID are transmitted to the input queues preferably by broadcast means of the BCE or CCE circuitry.

The output queue circuit serves a number of operations that can be performed in parallel with the operation of the function unit. The output queue comprises both memory and control logic, the memory used by the output queue may comprise both RAM and CAM. The actual physical structure of the output queue memory will be implementation dependent, but for the purposes of the description herein, the output queue memory is shown in FIG. 30*b* as a list or array of output operand directives. The output information queue circuit queues operand store directives it receives from a DFC, ISP or FPGA circuit or other such data processing circuit. The output queue may perform a vector processing like function in conjunction with the input queue[s] of the function unit such as for some number of operands, an indexed address calculation and operand store. The output queue circuit operates in parallel with the operation of the function unit, selects the output operand directive that matches the task and sub-task ID currently in process by the function unit and sequences or schedules the selection of a transmission port consistent with the result address entry in the output operand directive and where the function unit result operand is to be transmitted. When the function unit completes the processing of the result operand, it is transmitted without delay. In the event that no transmission port is available for immediate transmission of the result operand, the result operand is stored in the existing output operand directive and queued until transmission capacity is subsequently available. The subsequent processing of the queued [not completed] output operand directive may be processed in parallel with subsequent output operand processing and additional queued output operand processing. The output information queue also provides the means to unwind or purge or remove the output operand directives associated with a specific task and sub-task ID. The output queue circuit processes an output operand directive to purge all entries of a specific task and sub-task ID. The output queue logic uses the CAM circuitry to find the task and sub-task ID entries and purge them from the output queue. The input information queue also provides Fault Tolerant or High Availability processing support. In the event that processing fault is detected with respect to a certain task and sub-task ID, an output operand directive to the output queue circuit can request the purge or removal of all the operand directive entries for a specific task and sub-task ID in the input queue CAM circuitry. The directives to purge a task and sub-task ID are transmitted to the output queues preferably is by broadcast means through the BCE or CCE circuitry.

Operands that are output from DFC and function unit circuits may optionally be stored in an operand cache which in addition to comprising an associative address of the operand, also comprises an associative task and sub-task ID. The actual structure of such a cache would be implementation dependent but for the purposes of facilitating discussion herein is presented in FIG. 31. The associative task and sub-task ID entry permits operand[s] with a specific task and sub-task ID to be purged as a result of a completed or conditional computational sequence or in support of Fault Tolerant or High Availability unwind operations requiring the cached operands of a task and sub-task ID to be purged.

A further aspect of the DFC circuitry implementation within a CVI IC is that it can dynamically schedule the optimized use of BCE and PCE function units with regards to data path and function unit loading. One method that can be used to implement this circuit facility is to have BCE and PCE function units periodically report their individual utilization rates to a sorting and or queuing circuit that provides on demand to DFC circuits the current least utilized BCE and or PCE circuitry. This data path [BCE] or function unit [PCE] utilization loading circuitry could also enable a means to dedicate certain CVI IC resources, such as a data path sequence including a plurality of BCEs, for a fixed period of time to a specific Task or Process ID and sub-task ID. This aspect of the DFC circuitry implementation is advantageous because [1] there are a large number of available BCE data paths; and, [2] the high vertical interconnection density and compactness of the CVI IC lowers the implementation cost of utilization rates sorting or queuing circuitry. This aspect of the CVI IC provides a means to prevent localized overload of BCE and PCE resource utilization.

FIG. 25 shows a top view of a CVI circuit layer 25-1 comprising CCEs 25-2a . . . 25-2d, BCEs 25-3a . . . 25-3d, PCEs 25-4a . . . 25-4d, 25-9a 25-9b, cross-bar BCE transmission lines 25-6a 25-6b, BCE to BCE interconnections 25-7a 25-7b, and cross-bar BCEs 25-8a . . . 25-8c. Preferably all of the BCEs and PCEs of this circuit layer can be individually disabled by a CCE network if so desired without affecting the continued operation of the circuit layer. DFC PCEs 25-9a 25-9b write operation information to the PCE input queuing circuits 25-11a . . . 25-11d 25-12a . . . 25-12d and output queuing circuits 25-13a . . . 25-13d of function units 25-4a . . . 25-4d through a distributed cross-bar bus structure 25-8a . . . 25-8c. The PCEs 25-10a 25-10b provide BCE and PCE circuit utilization loading information to the DFCs. The PCEs 25-4a . . . 25-4d are arithmetic or numerical processing circuits providing such functions as multiply, add and divide. The function unit input queues 25-11a . . . 25-11d 25-12a . . . 25-12d can serve a number of purposes, such as determining that a plurality of input values by their task and sub-task IDs are present in order to proceed with input of those values to the function unit, that they should be purged or held for later execution. The function unit output queue 25-13a 25-13d provides as one of its purposes a performance optimizing function by attempting to secure the BCE resources in parallel with the processing of the output operand so that it is not delayed to its next destination. The BCE structures used in support of the DFC circuits are not limiting, and the DFC circuits can be used in conjunction with other BCE structures without limitation.

A plurality of CVI circuit layers 25-1 can be used to form a dense stacked [vertical] array of such circuits for applications that require large amounts of data to be processed in a proscribed sequence of arithmetic operations. FIG. 21 shows a top view of a CVI circuit layer 21-1 intended to be stacked with the circuit layer[s] 25-1, wherein the size of and the placement of the vertical BCE interconnections align. The circuit layer 21-1 may comprise PCEs that are ISPs, FPGAs, register files or process context memory relating to processor threads. This flexibility of PCE utilization due to the breakup of the traditional microprocessor architecture into multiple CEs is unique to the CVI invention, allows for higher CE utilization by allowing circuitry what was restricted to the use of one microprocessor to be available to any ISP, FPGA, DFC or process control circuitry, high circuit utilization yield, and the implementation of software programs [algorithms] that more closely reflect their operational and data flow structures, and therefore, result in more timely execution performance. The implementation of said proscribed sequences of algorithmic arithmetic operations can be further enhanced by using CCE network services to configure the cross-bar bus channels to direct the flow of data between PCEs consistent with the data processing required.

FIG. 26 shows the information or data element organization of the Data Flow Controller Table [DFCT] with information descriptors comprising command & context, operand$_1$, operand$_2$ and results elements. These elements shown herein are not intended to be limiting by their order or presentation. The presentation of the DFCT in FIG. 26 does not necessarily suggest the physical arrangement in memory that it will actually take. For example, the command & context element contains the task and sub-task ID of the descriptor. The DFCT descriptors are read by a DFC circuit and the operands and result element values are sent to various input and output ports of function units in either a dynamic or a directed or proscribed manner. The descriptor of FIG. 26 may take one of at least two forms shown in FIG. 28a and FIG. 28b. FIG. 28a shows a single DFCT descriptor. FIG. 28b shows an extended DFCT descriptor. The extended DFCT descriptor is used for example when a function unit may have more than two inputs such as a Multiply-Adder or a database search function unit.

FIG. 27a shows the information or data element organization of the parameters used to initiate execution of a DFC circuit. The parameters shown are not intended to be limiting nor their order of presentation, an actual implementation of a DFC may have less or more explicit parameters. The DFC is preferably an addressable device in a CVI IC as are other circuits such as function units and BCEs, wherein the DFC initiation parameters for example could be sent to the DFC as a BCE message by using the DFC's device address. FIG. 27b shows a table of concurrent DFC processing request. The simultaneous execution of a plurality of DFCTs represented by these initiation parameters is one form of parallel processing that can be performed by a DFC.

FIG. 29a shows in an illustrative manner three DFCTs 29a-1a . . . 29a-1c that are being executed either simultaneously or serially depending on the Branch descriptor used to initiate the execution of the other DFCTs 29a-1b 29a-1c. DFCT branch descriptor 29a-1a1 with elements command & context 29a-3a, operand$_1$ 29a-4a, operand$_2$ 29a-5a and result$_1$ 29a-6a causes the DFC to initiate execution of a second DFCT 29a-1b as indicated by control a flow arrow 29a-2a, the DFCT 29a-1b with elements command & context 29a-3b, operand$_1$ 29a-4b, operand$_2$ 29a-5b and result$_1$ 29a-6b. A subsequent Branch descriptor 29a-1b2 causes the DFC to initiate execution of a third DFCT 29a-1c at descriptor 29a-1c3 as indicated by arrow 29a-2b comprising elements command & context 29a-3c, operand₁ 29a-4c, operand₂ 29a-5c and results 29a-6c, wherein the descriptors are executed until reaching branch descriptor 29a-1c2 wherein DFC descriptor processing is directed to descriptor 29a-1c1 of the same DFCT 29a-1c and indicated by arrow 29a-2c, wherein DFC descriptor processing continues to branch descriptor 29a-1c4, wherein DFCT descriptor processing is directed to descriptor 29a-1b3 as indicate by arrow 29a-2d wherein DFCT descriptor processing of DFCT 29a-1b continues until reaching branch descriptor 29a-2b2, wherein DFC descriptor processing is directed to descriptor 29a-1c1 of same DFCT 29a-1c and the DFCT descriptor processing continues until reaching branch descriptor 29a-1c4, wherein DFC descriptor processing is directed to DFCT 29a-1b as indicated by arrow 29-2d and processing continues from descriptor 29a-2b4 until reaching branch descriptor 29a-1b3, wherein DFC processing is directed to descriptor 29a-1a2 of DFCT 29a-1a and processing continues until reaching another branch or termination.

FIG. 29a demonstrates the DFC's novel method of utilizing hardware function units that cannot be explicitly addressed or directly addressed through the instructions of any ISP in use today. Furthermore, the DFC is enabled to perform parallel processing at the function unit level without additional look ahead, scheduling or path prediction hardware used in today's multi-processors, but by explicit allocation of the plurality of function unit resources that are not restricted in use to the internal bus structure of a microprocessor. The CVI function units can be individually directed or directed to function in any arbitrary associated manner by the DFC, this is novel to the CVI DFC invention. The DFC, for example, can allocate the BSE connections between function units to optimize the calculation band width of the function units by DFCT descriptor programming.

FIG. 29b shows in an illustrative manner DFCT descriptors for the processing of the arithmetic express $([A_1 \times A_2]*C+V_1/V_2)^{1/2}$ wherein $A_1$ & $A_2$ are matrices of dimension 10×10, C is a constant, and $V_1$ & $V_2$ are vectors of imputed length 10. The DFC computes the addresses for the various matrix entries of $A_1$ & $A_2$ pairing them and sending them to the appropriate function unit input queue to be multiplied and the $AR_1$ is sent by the function unit, without DFC intervention, to the appropriate function unit input queue and paired with C by the input queue logic, simultaneously or in parallel execution vectors $V_1$ & $V_2$ are being processed by an appropriate function unit to produce result $VR_1$, wherein $AR_2$ and $VR_1$ are processed by an appropriate function unit to produce $MR_3$ and, wherein $MR_3$ is sent to the input queue of the appropriate function unit[s] to take the square root of each entry of the $MR_3$ to produce $MR_4$. The queue of a function unit may receive an address or a value for an operand, it is preferable that the DFC does all operand value fetching and sends only operand values to a function unit, this would enable the function unit to operate as if it were a vector processor with no additional circuitry, if the input queue of the function unit receives an address of a value to be processed as an operand and the value fetch process is from a data cache, the function unit may still appear to operated as a vector processor circuit.

FIG. 29c shows four DFCTs 29c-1, 29c-2a . . . 29c-2c with DFCT descriptors 29c-5a, 29c-5b, 29c-5c, 29c-5d and DFC processing flow indicator arrows 29c-6a, 29c-6b, 29c-6c. Also shown is cache memory segment 29c-3 with memory entities 29c-4a . . . 29c-4d with sub-task identifier $A_1$, $A_2$ and $A_3$, reflecting operand or data [results] generated through DFCT entities $DFCT_{A2}$, $DFCT_{A2}$ and $DFCT_{A3}$. The task or sub-task cache entries $A_1$, $A_2$ and $A_3$, may be purged by their task and sub-task identifiers. In this manner if the results of only one of the three entities $DFCT_{A1}$, $DFCT_{A2}$ and $DFCT_{A3}$, is selected for subsequent further processing [selected result value referencing is done by using the selected task and sub-task ID, the addresses for all values are the same for the three entities $DFCT_{A1}$, $DFCT_{A2}$ and $DFCT_{A3}$ and are differentiated in a cache reference by the task and sub-task IDs], the two DFCTs that were not selected for subsequent use can have their stored values purged.

FIG. 29c shows how predictive branching can be performed without the specialized microprocessor circuitry now required. This example can be used to show processing of both sides of branch condition that is dependent on a result that would require a significant delay before either side of the branch could be taken, but herein, wherein the failed branch side is purged from the cache and its results have no effect on the on going calculation. Alternately, results requiring significant calculation before a decision is made to their acceptability to be merged into prior results, can be performed as in FIG. 29c wherein rejection of the results only means the purge of the cache and local variables of the prior results are unaffected.

Figure 29D:
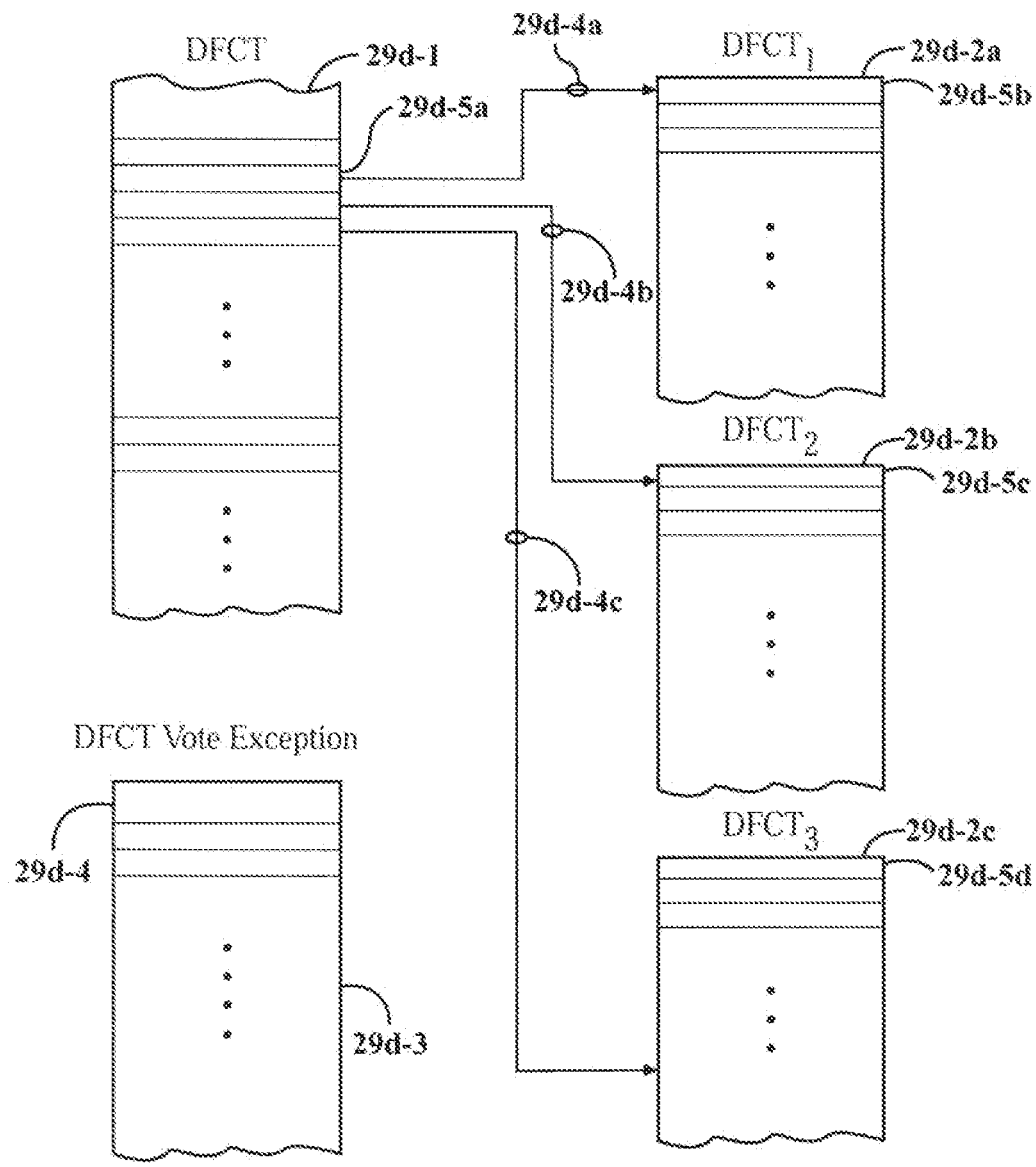
FIG. 29d is an example of Data Flow Controller Table High Availability processing.

FIG. 29d shows in an illustrative manner DFCT 29d-1 and three identical DFCTs 29d-2a . . . 29d-2c with processing flow arrow indicators 29d-4a . . . 29c-4c. This set of DFCTs is performing a High Availability function wherein the results from the three DFCTs are voted or compared, which means if two of the three results are equal, this result is accepted as valid and if one of the DFCT's does not compare as the same then an error condition is reported on the non-matching DFCT result. If none of the DFCT's match a processing exception fault is taken for DFCT 29d-3 which may elect to remove the offending function unit[s], purge all cache DFCT results and reissue the DFCT processing sequence, and thereafter, repeat the voting process of the three DFCTs all the while this being performed transparently to the task being processed.

FIG. 29d shows how a calculation sequence may be discarded and retried by the purge of intermediate calculation values that may affect integrity of the existing data memory. The same procedure is used in a result voting verification process of High Availability computational system, wherein a value or values are calculated separately with three separate sets of function units and the results compared, it two or all three match, one of the matching computational sequences is kept and the other two purged, if none agree, all three are purged and the calculation sequence is retired. This demonstration of the use of the DFC circuitry to perform a High Availability system voting verification hardware procedure is an example of the DFC circuit capability to perform what heretofore required dedicated or fixed hardware design.

Figure 29E:
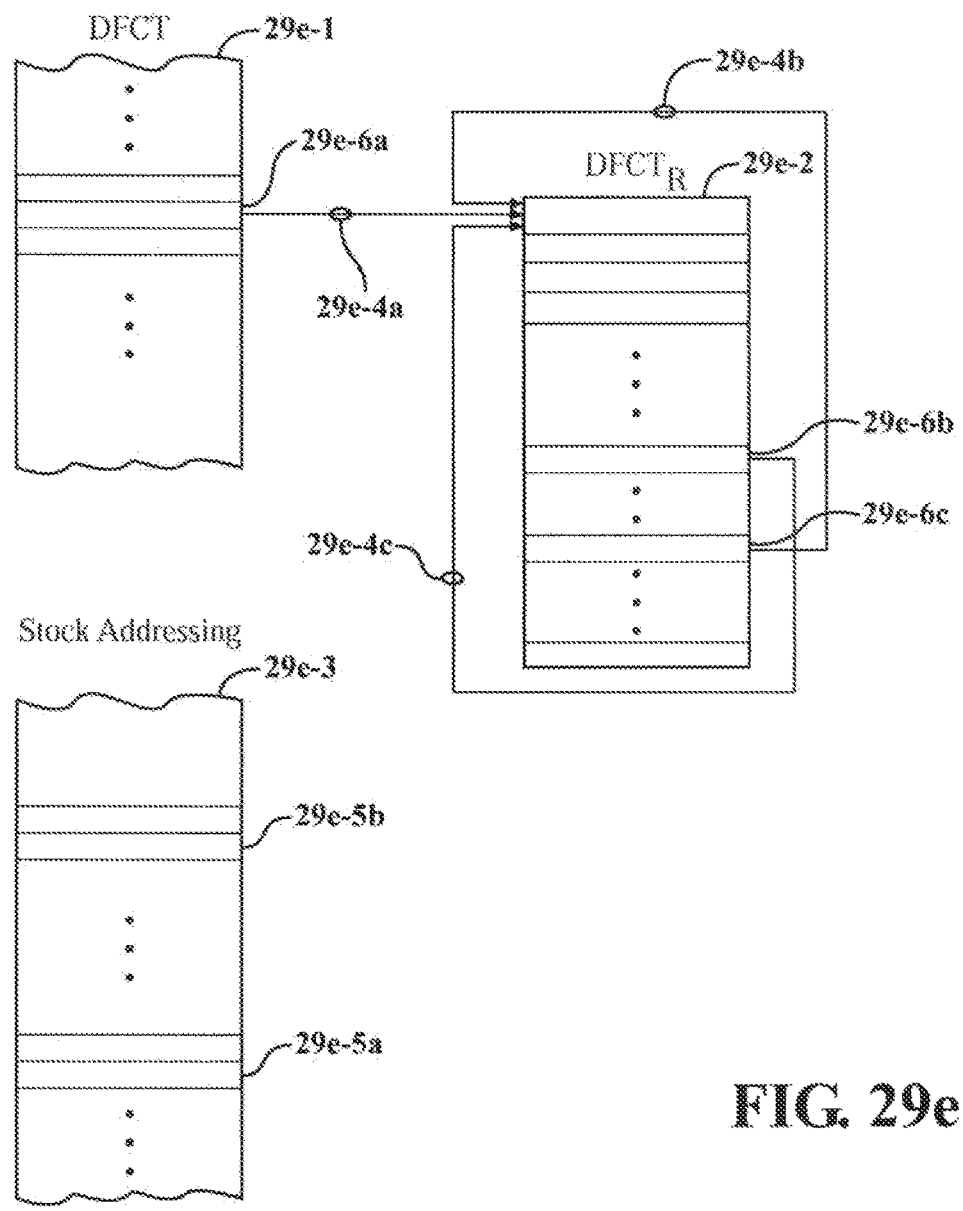
FIG. 29e is an example of Data Flow Controller Table recursive processing.

FIG. 29e shows DFCT 29e-1 and $DFCT_R$ 29e-2 in a recursive process sequence wherein the $DFCT_R$ 29e-2 is initialized by a Recursive Branch descriptor 29e-6a with processing flow indicted by arrow 29e-4a. There are two Branch descriptors 29e-6b 29e-6c with process flow indicated by arrow 29e-4b 29e-4c from within the recursive $DFCT_R$ 29e-2 that also cause recursive processing of the $DFCT_R$ 29e-2. The recursive processing of $DFCT_R$ 29e-2 may use a stack address reference for its operand storage 29e-3 or cache with associative memory references for not only the address of the operand but also its task and sub-task ID. When a cache memory is used the task and sub-task ID will be indexed to differentiate the next version of the recursive $DFCT_R$ being executed from the last, further, since every operand reference will result with an operand not in cache status, the DFC logic will know from the DFCT$_R$ 29e-2 context processing parameters, see FIG. 27a, that if the prior task and sub-task ID did exist, there will be cache references which will be the referenced operands for use with the new task and sub-task ID. Stack memory addressing is used as shown in the memory storage segment 29e-3, the operand referenced in the recursive DFCT$_R$ 29e-2 are stored sequentially from a base stack address for each recursive initiation of the DFCT$_R$ 29e-2. Memory address location 29e-5a shows the first recursive initialization of the DFCT$_R$ 29e-2 and is the stack address value for operand displacement address references from the DFCT$_R$ 29e-2, a second memory address location 29e-5b indicates the second recursive initialization of the DFCT$_R$ and is the new stack address value for that specific initialization of the DFCT$_R$ 29e-2.

FIG. 30a shows in an illustrative manner the memory layout of an input queue for the function units shown in FIG. 25. The input queue could also be structured to comprise all input queues of a function unit as shown in FIG. 30d. Five elements are shown per entry in the input queue, and herein is not a limitation on the elements: context state [including but limited to operation type, operand address type, operand value type, task and sub-task priority], the Task and sub-task, fault DFCT address, function unit fault transfer address or exception address, and operand [value or address]. The input queue task and sub-task element may be stored in an associative memory or CAM [Content Addressable Memory], the use of this type of memory will improve the performance of matching operand entries for input to the function unit. The input queue comprises logic for determining if all input operands are available for the function unit to proceed, to determine if operand processing should be delayed, to determine the compatibility of the operands, to cause the fetch of a operand, to perform other processing necessary for the function unit's operation.

FIG. 30b shows in an illustrative manner the memory layout of an output queue for the function units shown in FIG. 25. Six elements are shown, and is not an intended limitation on the elements herein: state context, task and sub-task ID, result operand, result address, DFC device address. The output queue comprises logic for performing a plurality of functions and not limited herein to the result address look ahead ready request for transmission, structuring result operand output for transmission and format conversion if necessary.

Figure 30C:
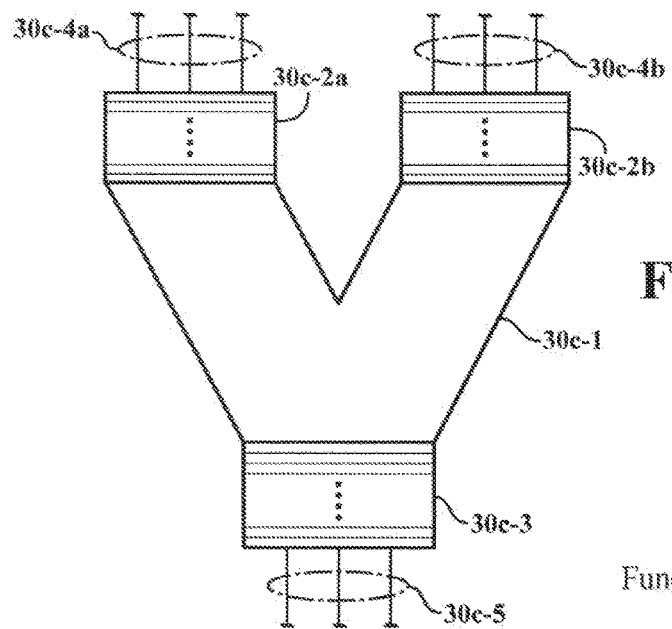
FIG. 30c is a function unit with integrated input and output queues.
Figure 30D:
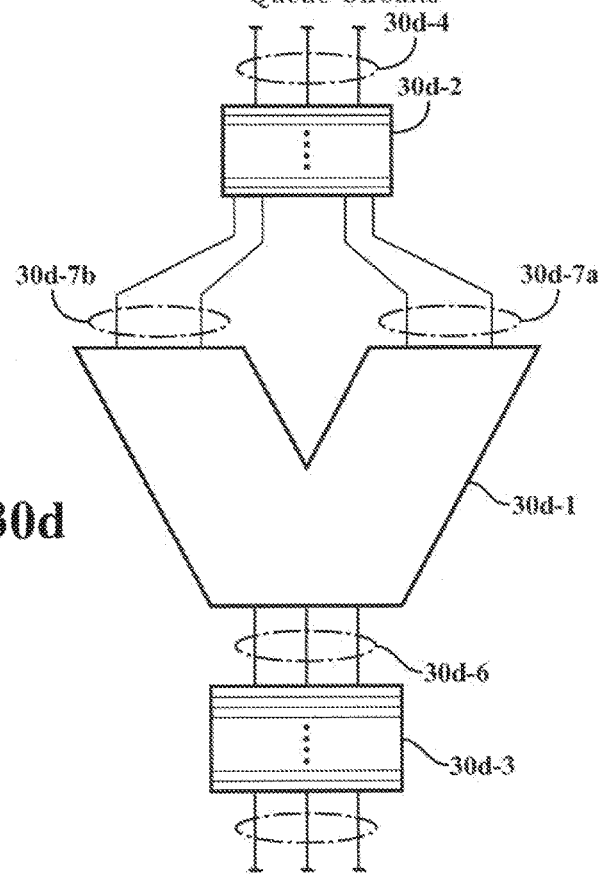
FIG. 30d is a function unit with separated input and output queues.

FIG. 30c a shows function unit 30c-1 with separate input queues 30c-2a 30c-2b and an output queue 30c-3. The purpose of the input queues is to maximize the performance of the function unit by preparing input operands for submission to the function unit according to the task and sub-task priority. The input and output queues comprise logic and memory, the logic executes in an autonomous manner to the function unit. The input queues 30c-2a 30c-2b have direct access to one or more BCE[s] [not shown] over bus interconnections 30c-4a 30c-4b for, but herein not limited to, input transmission of operands, input transmission of DFC commands such as a purge, and output exception conditions signaling to a DFC exception conditions. The output queue 30c-3 has direct access to one or more BCE [2] [not shown] over bus interconnections 30c-5 for, but not limited to, output transmission of operands, input transmission of DFC commands such as a purge of a complete task or sub-task of a task, and output exception conditions signaling to a DFC exception conditions.

FIG. 30d shows function unit 30d-1 with input queues 30d-2 and an output queue 30d-3. The purpose of the input queue is to maximize the performance of the function unit by preparing input operands for submission to the function unit according to the task and sub-task priority. The input and output queues comprise logic and memory, the logic executes in an autonomous manner to the function unit. The input queue uses interconnections 30d-7a 30d-7b to access the input ports of the function unit. The output queue uses interconnections 30d-6 to access the output port of the function unit. The input queue 30d-2 has direct access to one or more BCE [s] [not shown] over bus interconnections 30d-4 for, but not limited to, input transmission of operands, input transmission of DFC commands such as a purge, and output exception conditions signaling to a DFC exception conditions. The output queue 30d-3 has direct access to one or more BCE [2] [not shown] over bus interconnections 30d-5 for, but herein not limited to, output transmission of operands, input transmission of DFC commands such as a purge, and output exception conditions signaling to a DFC exception conditions.

FIG. 31 shows in an illustrative manner the memory layout of a cache memory with three primary elements: data address, task & sub-task ID and data. The data address is stored in an associative memory for rapid retrieval of the data, which is conventional in current cache designs. The task and sub-task IDs are stored in a separate associative memory in order to be able to distinguish the cache entries by task and sub-task IDs for at least the purposes of accessing data by address and by task and sub-task, and removing all cache entries of a certain task and sub-task or to purge the cache. The use of the task and sub-task IDs in the cache allows the cache to concurrently contain tasks that use separate virtual memory address spaces; this eliminates the conflict that would arise of task address space overlap, and eliminating the need to limit the cache to one task at a time or cache flushing per task context change. The cache size of a CVI IC can be larger than caches implemented with 2D or planar microprocessor designs and limited to less than a maximum of perhaps 16 Mbytes. The CVI IC will enable cache memory usage of sizes of 64 Mbytes to more than 1 GByte. This enables dramatically higher system performance per task, and novel to CVI ICs. The enablement of large cache memory size is attributable to the CVI IC yield methods; reference to large cache memory implementation herein preferably means the use of a plurality of multi-ported cache PCEs. The data element of the cache is preferably implemented to take advantage of the wider BSE data path widths between 256 signal lines to greater than 2048 signal lines. In this implementation, the data cache element is preferably written to main memory in one bus transaction, wherein current implementations are limited to 256 data bus lines.

It is anticipated herein that the FPGA circuitry can be used with the DFC circuitry to provide both special purpose and general purpose computing circuitry and computing systems. It is further anticipated that software programs written with the machine instructions of any given ISP [Instruction Set Processor] can be translated by software to run directly on said computing circuitry comprising both FPGA and DFC circuitry. This software program translation may occur prior to CVI IC program processing or by the CVI IC itself as part of initialization processing and before the processing of any of the software programs.

CVI FPGA Data Processing Embodiment

One of the embodiments of the CVI invention is an FPGA circuit that has the ability for high speed changing and or paging of its configuration memory in one or a small number of memory clock cycles. This is attributed to the use of the CVI 3D circuit structure with high density vertical BCE interconnections, high density stacking, high bandwidth internal busing capability, and if used, signaling by the originating DFC that the function unit[s] has completed its processing and the result[s] has been transmitted to the specified address.

Figure 32A:
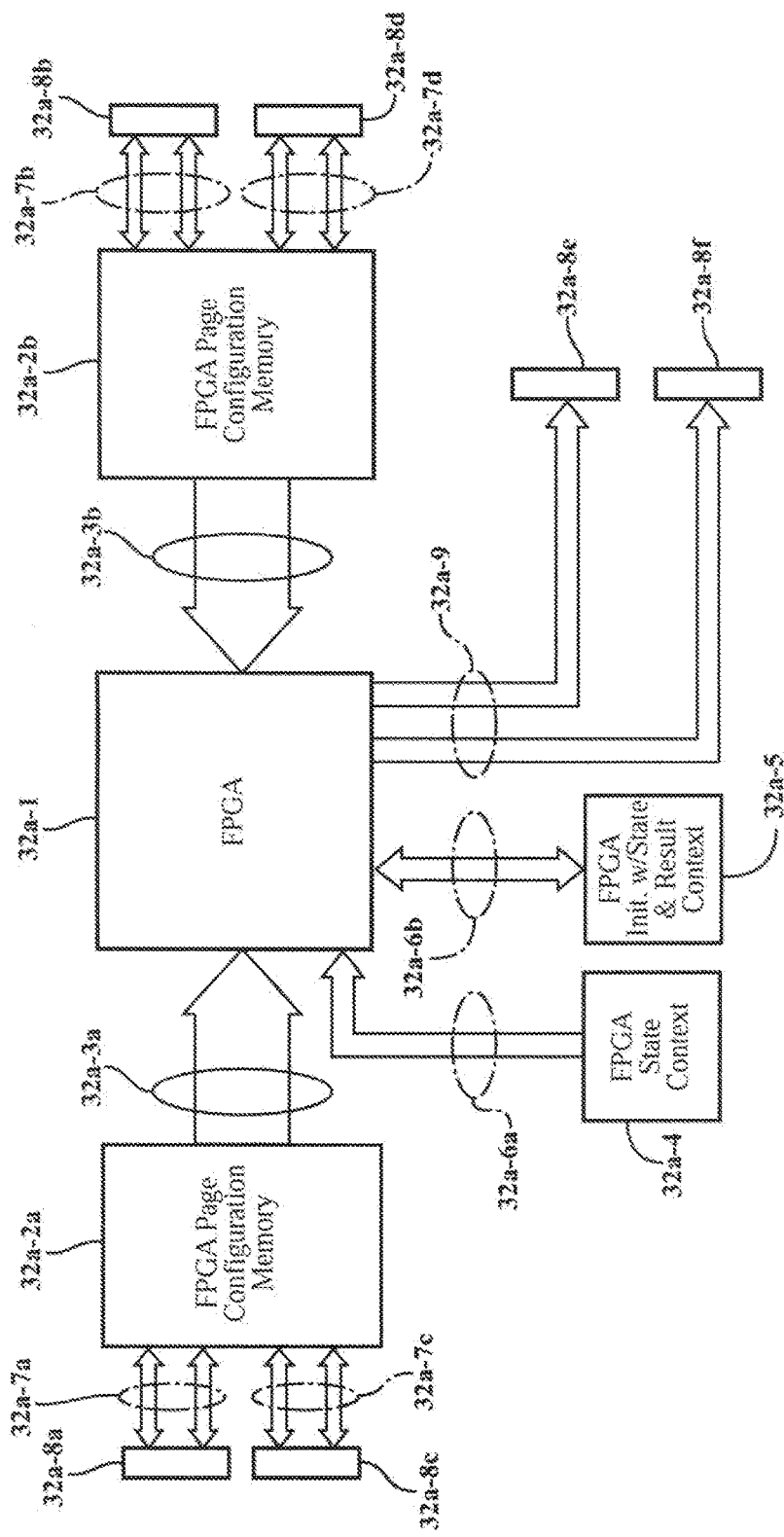
FIG. 32a is a pictorial view of a CVI paged single FPGA circuit array architecture.

The CVI FPGA circuit layout shown in FIG. 32a connects FPGA array 32a-1 to configuration memory arrays 32a-2a 32a-2b with interconnections 32a-3a 32a-3b on either of two sides of the FPGA array and are proportional to the width of the FPGA array. The FPGA and the separate memory arrays may each be implemented on separate CVI circuit layers. The FPGA array may be considered to consist of one page or it may be divided into a plurality of pages to further reduce operational delay from the dynamic changing of the FPGA configuration memory wherein one or a plurality of FPGA pages can be written, changed or loaded in parallel during the processing [execution] of one or a plurality of the other FPGA pages. Associated with each configuration memory array 32a-2a 32a-2b is logic not shown for loading one or a plurality of the pages of FPGA configuration data into specific pages of the FPGA array 32a-1. The memory arrays may contain a plurality of FPGA page configurations per FPGA page and these pages can be caused to be loaded into any specific FPGA page by external directive or a directive from the processing [executing] FPGA pages. All of the designated circuits of FIG. 32a in a preferred implementation would be BCE or PCE circuit portions.

Interconnections 32a-7a . . . 32a-7d provide wide high bandwidth connections between FPGA memories 32a-2a 32a-2b and BCEs 32a-8a . . . 32a-8d. The interconnections 32a-7a . . . 32a-7d may have an interconnection width of more than 2,048 interconnections, wherein some of the interconnections may be unutilized and available to be used to replace a failed interconnection. The interconnections 32a-3a 32a-3b between the FPGA circuit 32a-1 and memories 32a-2a 32a-2b may have an interconnection width of more than 20,000 interconnections, wherein some of the interconnections may be unutilized and available to be used to replace a failed interconnection.

Conventional input and output transmissions performed in support of the processing [executing] FPGA pages are implemented through interconnections 32a-9 to BCE circuits 32a-8e 32a-8f. The FPGA initial and final context states are transmitted by interconnections 32a-6b to specialized memory 32a-5, this memory is connected to a BCE circuit, the BCE circuit is not shown. The execution of a task and sub-task represented by the circuit processing of one or a plurality of the FPGA pages can be suspended prior to its completion. If a FPGA task and sub-task is suspended it may be necessary to write its intermediate operating context state to a specialized memory 32a-4 wherein it can be reloaded and the execution of the task and sub-task resumed.

The CVI FPGA circuit of FIG. 32a may be implemented in more than one CVI circuit layer, and there may be more than one CVI FPGA circuit in a CVI IC. The CVI support circuits such as CCEs are not shown in FIG. 32a. The preferred implementation of the CVI FPGA circuit will require the addition of memory circuitry such as non-volatile FLASH and volatile DRAM memory in the CVI IC in order to achieve a higher level of memory performance. It is anticipated that the economic yield and even any yield of a circuit with as many circuit layers and the interconnection density required herein would not be possible but with the CVI circuit yield enhancement methods.

The operation of the CVI FPGA circuit of FIG. 32a enables the mapping of a proportionately paged FPGA program of arbitrary size to the FPGA pages 32a-11 of an CVI FPGA IC in a static or dynamic mapping, and further, enable the loading and any reloading of FPGA pages at a real time or near real time performance. This is enabled by the immediate availability of adequately sized FPGA memories 32a-2a 32a-2b, their high density interconnection 32a-3a 32a-3b to the pages of the FPGA and the multiple BCE bus interconnections 32a-7a . . . 32a-7d to additional memory resources internal to the CVI IC.

Figure 32B:
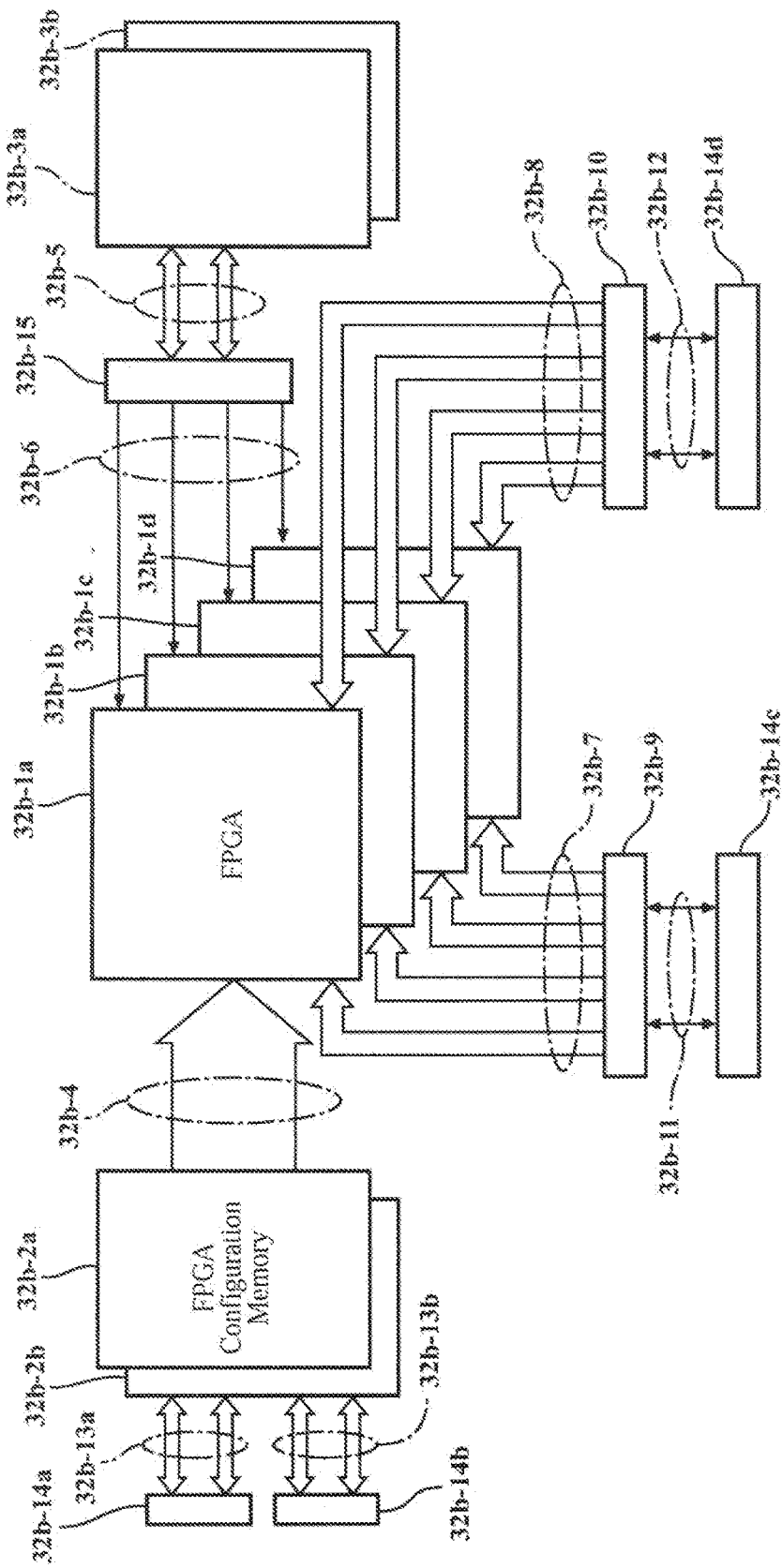
FIG. 32b is a pictorial view of a CVI paged multiple FPGA circuit array architecture.

The CVI FPGA circuit layout shown in FIG. 32b is a stack of FPGA logic circuit layers 32b-1a . . . 32b-1d connected to configuration memory arrays 32b-2a 32b-2b by interconnections 32ab-4 to one side of each [all] of the FPGA array layers and proportional to the width of the FPGA array. The FPGA arrays may be considered to consist of one page each or each may be divided into a plurality of pages to further reduce operational delay from the dynamic changing of the FPGA configuration memory wherein one or a plurality of FPGA pages can be written, changed or loaded in parallel during the execution of one or a plurality of the other FPGA pages. Associated with each configuration memory array 32b-2a 32b-2b is logic not shown for loading one or a plurality of pages of FPGA configuration data into specific pages of the FPGA arrays 32b-1a . . . 32b-1d. The memory arrays may contain a plurality of FPGA page configuration data per FPGA page and these pages can be caused to be loaded into any specific FPGA page by external directive or a directive from an executing FPGA page. All of the designated circuits of FIG. 32b in a preferred implementation would be BCE or PCE circuit portions. Intermediate and final result context from the FPGA pages are read or written to FPGA context memories 32b-3a 32b-3b via FPGA circuit layer interconnections 32b-6, multi-port bus logic interface 32b-15 and interconnections 32b-5. Input and output information transfers originated by the processing [execution] of the FPGA logic pages are sent over interconnections 32b-8 to multi-port bus interface logic 32b-10, interconnections 32b-12 and BCE 32b-14d.

Interconnections 32b-13a 32a-13b provide wide high bandwidth connection between FPGA memories 32b-2a 32b-2b and BCEs 32b-14a 32b-14b. The interconnections 32b-13a 32b-13b may have an interconnection width of more than 2,048 interconnections, wherein some of the interconnections may be unutilized and available to be used to replace a failed interconnection. The interconnections 32b-4 between the FPGA circuits 32b-1a . . . 32b-1d and memories 32b-2a 32b-2b may have an interconnection width of more than 20,000 interconnections, wherein some of the interconnections may be unutilized and available to be used to replace a failed interconnection.

Figure 32C:
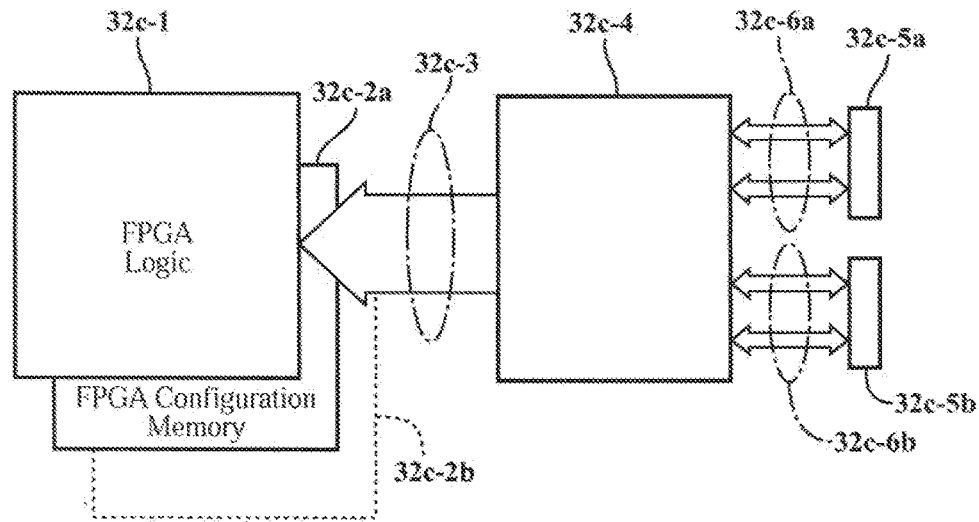
FIG. 32c is a pictorial view of a CVI separated FPGA logic & configuration memory stack.

FIG. 32c shows a portion of the CVI circuitry of FPGA logic 32c-1 vertically stacked over FPGA configuration memory circuit 32c-2a and optional 32c-2b configuration memory circuit. It is an aspect of this FPGA & memory stack that it is not limited to one additional memory layer 32c-2b, but that a plurality of said memory layers 32-2b could be incorporated into the design of the FPGA & memory stack. This FPGA CVI circuitry is different from existing planar FPGA circuitry in that the FPGA logic and configuration memory of that configures the logic are separated into at least one FPGA logic circuit and at least one FPGA configuration memory circuit, wherein the FPGA logic circuits and FPGA configuration memory circuits overlay each other and are vertically interconnected with well over 10,000 of said vertical connections requiring a sub-micron fabrication stack pitch. [It is another aspect of the CVI FPGA IC of FIG. 32c that the configuration memory of each FPGA logic cell of the FPGA array or each FPGA page remain integrated with the logic cell but the memory of each logic cell is vertically and directly interconnected to additional configuration memory with a plurality of potential alternate configuration information for that FPGA logic cell memory.] The very wide interconnection path 32c-3 enables the high speed transfer of configuration data from memory circuit 32c-4 to the configuration memory circuits 32c-2a 32c-2b; the memory circuit 32c-4 has a plurality of ports of two types. The first type of port is an interface to a BCE circuit and the second type is the very wide interface to the FPGA configuration memory 32c-2a. The width of the interconnection 32c-3 to the configuration memory 32c-2a may range from 512 to more than 10,000 connections. It is the objective of this wide interconnection 32c-3 to be able to write the configuration information or data to the configuration memory 32c-2a in one or less than 8 memory cycles. BCE circuits provide interconnection to the memory circuit 32c-4 through multiple ports interconnections 32c-6a 32c-6b. The FPGA configuration memory lies directly under the FPGA logic allowing the configuration of the FPGA logic [or FPGA pages] to be directly connected to the FPGA logic and provide immediate access to a plurality of configuration data wherein the delay to switch between various configuration data stored in the configuration memory 32c-2a requiring preferably one or less than 4 memory clock cycles. A preferred embodiment of the configuration memory is to enable paging of configuration memory of the FPGA circuit 32c-1 between a plurality of page configuration data sets stored in the configuration memory 32c-2a. This would enable the execution of arbitrarily large FPGA configuration programs in a real time manner equivalent to what is done currently with conventional microprocessors, but at the performance rate of FPGA circuitry which is well know to exceed microprocessor programming by 10× to 100× or greater. The first FPGA configuration memory circuit 32c-2a if used in combination with optional configuration memory 32c-2b or a plurality of optional configuration memory circuits would be designed to act as a controller for the selection of the desired vertically arranged configuration memory circuit to be used by the FPGA circuit 32c-1, if that controller circuitry were defective, the same controller circuitry in one of the other configuration memory circuits such as 32c-2b would be enabled for use preferably by the CCE network. The configuration memory controller circuitry may also use task and sub-task ID information as a means to identify the configuration data of a FPGA array or individual configuration data for each FPGA page.

Figure 32D:
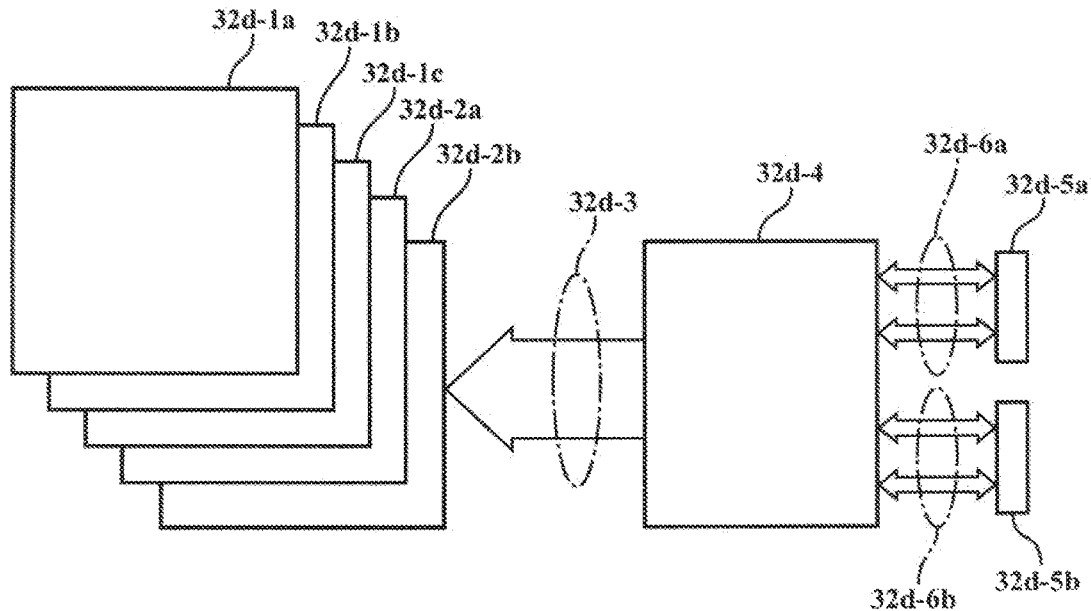
FIG. 32d is a pictorial view of a CVI separated FPGA logic & configuration memory stack.

FIG. 32d shows a portion of CVI IC circuitry of FPGA logic 32d-1a . . . 32d-1c vertically stacked over FPGA configuration memory circuits 32d-2a . . . 32d-2b. This circuit is similar in its purpose to the circuitry of FIG. 32c, which is to enable the execution of large FPGA configuration programs of any size with FPGA circuitry that is smaller than the actual size of the FPGA program by executing portions of the FPGA programming [herein also referred to as configuration data] limited to the size of the FPGA logic 32d-1a . . . 32d-1c or smaller portions of the FPGA logic called FPGA pages. One of the FPGA configuration memory circuits 32d-2a 32d-2b would be designed to act as a controller for the selection of the desired vertically arranged configuration memory circuit to be used by the FPGA circuit 32d-1 . . . 32d-1c, and for example, if the controller circuitry 32d-2a were defective, the controller circuitry in 32d-2b would subsequently be enabled for use. The configuration memory controller circuitry may also use task and sub-task ID information as a means to identify the configuration data of a FPGA logic or individual configuration data for each FPGA page. This CVI FPGA circuitry is different from existing planar FPGA circuitry in that the FPGA logic and configuration memory that configures the logic are separated into at least one FPGA logic circuit and at least one FPGA configuration memory circuit, wherein the FPGA logic circuits and FPGA configuration memory circuits overlay each other and are vertically interconnected with well over 10,000 of said vertical connections requiring a sub-micron fabrication stack pitch. [It is another aspect of the CVI FPGA IC of FIG. 32d that the configuration memory of each FPGA logic cell of the FPGA array or each FPGA page remain integrated with the logic cell but the memory of each logic cell is vertically and directly interconnected to additional configuration memory with a plurality of potential alternate configuration information for that FPGA logic cell memory.] The very wide interconnection path 32d-3 enables the high speed transfer of configuration data from memory circuits 32d-4 to the configuration memory circuits 32d-2a 32d-2b; the memory circuit 32d-4 has a plurality of ports of two types. The first type of port is an interface to BCE circuitry and the second type is the very wide interface to the FPGA configuration memory 32d-2a. The width of the interconnection 32d-3 to the configuration memory 32d-2a may range from 512 to more than 10,000 connections. It is the objective of this wide interconnection 32d-3 to be able to write the configuration information or data to the configuration memory 32d-2a in one or less than 4 memory cycles. BCE circuits provide interconnection to the memory circuit 32d-4 through multiple ports interconnections 32d-6a 32d-6b.

A benefit of the CVI FPGA circuitry of FIGS. 32a . . . 32d is the enablement of processing [execution] of FPGA programs that are larger than the physical FPGA circuitry of the CVI IC. This is achieved by the high speed loading of configuration data of the FPGA arrays per circuit layer or FPGA pages should the FPGA arrays be divided into separately loadable pages. The CVI FPGA circuitry shown in FIG. 32b would require a stack of many circuit layers with fine grain sub-micron stack pitch vertical interconnections and not implementable with current IC stacking technology except for the CVI yield enhancement methods discussed herein. The CVI FPGA circuitry preferably has the memory interconnections necessary to write the complete configuration data for a FPGA logic circuit or FPGA page in less than 10 memory clock cycles and preferably less than 4 memory clock cycles. A further benefit of the CVI FPGA circuitry is the use of FPGA pages that are less than one half of the FPGA logic circuit, provides a means for increasing the yield of a FPGA logic circuit with the use of the much smaller FPGA paged circuits. If a failure occurs in an FPGA page, the isolation of the FPGA page is far less expensive than for the complete FPGA logic circuit.

A further aspect of the CVI FPGA circuitry use of pages is to be able to disable for use a FPGA page should it be determined to be defective. This would preferably be done by the CCE network circuitry or it could also be done under software control.

A further aspect of the CVI FPGA circuitry herein is its use in combination with the DFC circuitry discussed herein and, but not limited to, the circuitry shown in FIGS. 17 through 23 and discussed herein within a CVI IC. A further aspect of the CVI FPGA circuitry herein is the optional incorporation of task and sub-task identification association with the configuration information and its context data, this supports for example the enablement of multi-processing, parallel processing, Fault Tolerant processing and High Availability processing. A further aspect of the CVI FPGA circuitry is the FPGA page may each execution its portion of a larger FPGA program independently and concurrently with each of the other plurality of FPGA pages of a FPGA logic circuit. This provides additional support for example for the enablement of multi-processing, parallel processing, Fault Tolerant processing and High Availability processing.

This disclosure is illustrative and not limiting; further modifications will be apparent to one skilled in the art in light of this disclosure and the appended claims.

I claim:

1. A method of information processing using a stacked integrated circuit comprising a network comprising a plurality of control circuit portions, including redundant control circuit portions, a plurality of information bus circuit portions, and a plurality of processing circuit portions, wherein for purposes of redundancy there are a plurality of separate or partially separate interconnection paths interconnecting at least two control circuit portions of the plurality of control circuit portions, the method comprising: establishing a control network using at least one of the plurality of separate or partially separate interconnection paths the control network configuring or enabling or disabling the operation of one or more information processing circuit portions and one or more bus circuit portions; and performing information processing between at least two of the processing circuit portions.

2. A method of integrated circuit testing of a stacked integrated circuit comprising a plurality of control circuit portions, including redundant control circuit portions, wherein there are a plurality of separate or partially separate, redundant interconnection paths interconnecting at least two control circuit portions of the plurality of control circuit portions, and a plurality of circuit portions comprising at least one of a bus circuit portion and a processing circuit portion, the method comprising: i. establishing a control network using at least one of the plurality of separate or partially separate, redundant interconnection paths; ii. disabling the plurality of circuit portions; iii selecting for testing at one time at least one of the plurality of circuit portions, iv. using the control network to enable for testing the selected at least one of the plurality of circuit portions, v. testing the selected at least one of the plurality of circuit portions; vi. using the control network to disable the selected at least one of the plurality of circuit portions if it failed testing, and vii. repeating steps ii. through vi. until a majority or all of the plurality of circuit portions have been tested.

3. The method of one of claims 1 and 2, wherein at least one control circuit portion sends configuration information about one or more bus or processing circuit portions to an adjacent control circuit portion, wherein the configuration information causes a change of state of the one or more bus or processing circuit portions.

4. The method of one of claims 1 and 2, wherein at least one control circuit portion sends configuration information about one or more bus or processing circuit portions to another control circuit portion, wherein the configuration information causes a change of state of the one or more bus or processing circuit portions.

5. The method of one of claims 1 and 2, wherein at least one control circuit portion sends configuration information about one or more bus or processing circuit portions to an adjacent control circuit portion, wherein the configuration information is that the one or more bus or processing circuit portions are defective.

6. The method of one of claims 1 and 2, wherein at least one control circuit portion sends configuration information about one or more bus or processing circuit portions to another control circuit portion, wherein the configuration information is that the one or more bus or processing circuit portions are defective.

7. The method of one of claims 1 and 2, wherein at least one control circuit portion enables or disables at least one other control circuit portion.

8. The method of one of claims 1 and 2, wherein at least one control circuit portion controls the testing of and enables or disables at least one other control circuit portion.

9. The method of one of claims 1 and 2, wherein at least one control circuit portion causes a change of state of at least one bus or processing circuit portion.

10. The method of one of claims 1 and 2, wherein at least one control circuit portion controls the testing of at least one bus or processing circuit portion.

11. The method of one of claims 1 and 2, wherein at least one control circuit portion receives an operational fault signal from at least one bus or processing circuit portion.

12. The method of one of claims 1 and 2, wherein at least one control circuit portion configures the operation of at least one bus or processing circuit portion.

13. The method of one of claims 1 and 2, wherein at least one control circuit portion configures the operation of one or more bus and processing circuit portions when signaled by one of a bus or processing circuit portion.

14. The method of one of claims 1 and 2, wherein at least one control circuit portion configures the interconnections of at least one bus and processing circuit portions.

15. The method of one of claims 1 and 2, wherein at least one control circuit portion configures the interconnections of one or more bus and processing circuit portions.

16. The method of one of claims 1 and 2, wherein the control network performs power management of the stacked integrated circuit.

17. The method of one of claims 1 and 2, wherein the control network performs power management of the stacked integrated circuit by commanding at least one control circuit portion to do at least one of suspending the operation and lowering the processing rate of one or more bus or processing circuit portions.

18. The method of one of claims 1 and 2, wherein at least one control circuit portion suspends the operation of one or more bus and processing circuit portions.

19. The method of one of claims 1 and 2, wherein at least one control circuit portion suspends the operation of one or more bus and processing circuit portions when signaled by one of a bus or processing circuit portion.

* * * * *